United States Patent
Yamazaki

(10) Patent No.: US 8,211,780 B2
(45) Date of Patent: Jul. 3, 2012

(54) METHOD FOR MANUFACTURING SOI SUBSTRATE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 242 days.

(21) Appl. No.: 12/325,488

(22) Filed: Dec. 1, 2008

(65) Prior Publication Data

US 2009/0142905 A1    Jun. 4, 2009

(30) Foreign Application Priority Data

Dec. 3, 2007    (JP) ................................. 2007-312898

(51) Int. Cl.
*H01L 21/30* (2006.01)

(52) U.S. Cl. ........ 438/458; 438/459; 438/479; 438/928; 438/977; 257/E21.122; 257/E21.567; 257/E21.568

(58) Field of Classification Search .................. 438/458, 438/459, 479, 977, 928; 257/E21.122, E21.561, 257/E21.567, E21.568
See application file for complete search history.

(56) References Cited

U.S. PATENT DOCUMENTS

| | | | |
|---|---|---|---|
| 5,374,564 A * | 12/1994 | Bruel | 438/455 |
| 5,670,411 A | 9/1997 | Yonehara et al. | |
| 5,966,620 A * | 10/1999 | Sakaguchi et al. | 438/455 |
| 6,020,252 A | 2/2000 | Aspar et al. | |
| 6,127,702 A * | 10/2000 | Yamazaki et al. | 257/347 |
| 6,225,192 B1 | 5/2001 | Aspar et al. | |
| 6,271,101 B1 * | 8/2001 | Fukunaga | 438/455 |
| 6,335,231 B1 * | 1/2002 | Yamazaki et al. | 438/151 |
| 6,372,609 B1 | 4/2002 | Aga et al. | |
| 6,380,046 B1 | 4/2002 | Yamazaki | |
| 6,388,652 B1 * | 5/2002 | Yamazaki et al. | 345/98 |
| 6,534,380 B1 * | 3/2003 | Yamauchi et al. | 438/455 |
| 6,602,761 B2 * | 8/2003 | Fukunaga | 438/459 |
| 6,608,761 B2 * | 8/2003 | Wachel | 361/785 |
| 6,686,623 B2 * | 2/2004 | Yamazaki | 257/315 |
| 6,778,164 B2 * | 8/2004 | Yamazaki et al. | 345/98 |
| 6,803,264 B2 * | 10/2004 | Yamazaki et al. | 438/151 |
| 6,809,009 B2 | 10/2004 | Aspar et al. | |
| 6,849,877 B2 * | 2/2005 | Yamazaki et al. | 257/86 |
| 6,875,633 B2 * | 4/2005 | Fukunaga | 438/107 |

(Continued)

FOREIGN PATENT DOCUMENTS

EP    0 807 970    11/1997

(Continued)

*Primary Examiner* — Mary Wilczewski
(74) *Attorney, Agent, or Firm* — Eric J. Robinson; Robinson Intellectual Property Law Office, P.C.

(57) ABSTRACT

Adhesion defects between a single crystal semiconductor layer and a support substrate are reduced to manufacture an SOI substrate achiving high bonding strength between the single crystal semiconductor layer and the support substrate. Plasma is produced by exciting a source gas, ion species contained in the plasma are added from one surface of a single crystal semiconductor substrate, and thereby forming a damage region in the single crystal semiconductor substrate; forming an insulating layer over one surface of the single crystal semiconductor substrate; a support substrate is bonded so as to face the single crystal semiconductor substrate with the insulating layer therebetween; the single crystal semiconductor substrate is heated to separate the single crystal semiconductor substrate into a single crystal semiconductor layer bonded to the support substrate and a single crystal semiconductor substrate, in the damage region; and the single crystal semiconductor layer bonded to the support substrate is pressed.

24 Claims, 30 Drawing Sheets

U.S. PATENT DOCUMENTS

| | | | |
|---|---|---|---|
| 6,965,195 B2 | 11/2005 | Yamazaki et al. | |
| 7,029,950 B2 | 4/2006 | Yonehara et al. | |
| 7,067,396 B2 | 6/2006 | Aspar et al. | |
| 7,148,124 B1* | 12/2006 | Usenko | 438/458 |
| 7,176,525 B2* | 2/2007 | Fukunaga | 257/344 |
| 7,179,719 B2 | 2/2007 | Droes et al. | |
| 7,183,179 B2 | 2/2007 | Droes et al. | |
| 7,199,024 B2 | 4/2007 | Yamazaki | |
| 7,241,666 B2* | 7/2007 | Goto et al. | 438/455 |
| 7,256,776 B2* | 8/2007 | Yamazaki et al. | 345/206 |
| 7,262,088 B2 | 8/2007 | Kodaira et al. | |
| 7,332,412 B2 | 2/2008 | Park et al. | |
| 7,674,647 B2* | 3/2010 | Arai | 438/57 |
| 7,727,846 B2* | 6/2010 | Ohnuma et al. | 438/311 |
| 7,763,502 B2* | 7/2010 | Kakehata et al. | 438/149 |
| 7,799,658 B2* | 9/2010 | Yamazaki | 438/458 |
| 7,820,524 B2* | 10/2010 | Miyairi et al. | 438/455 |
| 2001/0007789 A1 | 7/2001 | Aspar et al. | |
| 2002/0100941 A1 | 8/2002 | Yonehara et al. | |
| 2004/0061176 A1 | 4/2004 | Takafuji et al. | |
| 2004/0104424 A1* | 6/2004 | Yamazaki | 257/321 |
| 2004/0166651 A1 | 8/2004 | Aspar et al. | |
| 2005/0009252 A1* | 1/2005 | Yamazaki et al. | 438/151 |
| 2005/0072527 A1* | 4/2005 | Gunji et al. | 156/345.12 |
| 2005/0153524 A1* | 7/2005 | Maa et al. | 438/458 |
| 2005/0202595 A1 | 9/2005 | Yonehara et al. | |
| 2005/0202619 A1 | 9/2005 | Kodaira et al. | |
| 2006/0115961 A1 | 6/2006 | Aspar et al. | |
| 2006/0118935 A1 | 6/2006 | Kamiyama et al. | |
| 2007/0066035 A1 | 3/2007 | Droes et al. | |
| 2007/0122998 A1 | 5/2007 | Droes et al. | |
| 2007/0284611 A1 | 12/2007 | Park et al. | |
| 2007/0287242 A1 | 12/2007 | Kodaira et al. | |
| 2008/0099875 A1 | 5/2008 | Park et al. | |
| 2008/0102602 A1 | 5/2008 | Park et al. | |
| 2008/0242051 A1 | 10/2008 | Yamazaki et al. | |
| 2008/0261379 A1 | 10/2008 | Jinbo et al. | |
| 2008/0268618 A1* | 10/2008 | Yamazaki | 438/458 |

FOREIGN PATENT DOCUMENTS

| | | |
|---|---|---|
| EP | 1 229 582 | 8/2002 |
| EP | 1 575 085 | 9/2005 |
| JP | 2000-012864 | 1/2000 |
| JP | 2000-077287 | 3/2000 |
| JP | 2002-231909 | 8/2002 |
| JP | 2004-134675 | 4/2004 |
| JP | 2006-049800 | 2/2006 |
| WO | WO 01/11667 | 2/2001 |

* cited by examiner

107

125a  125b  125b

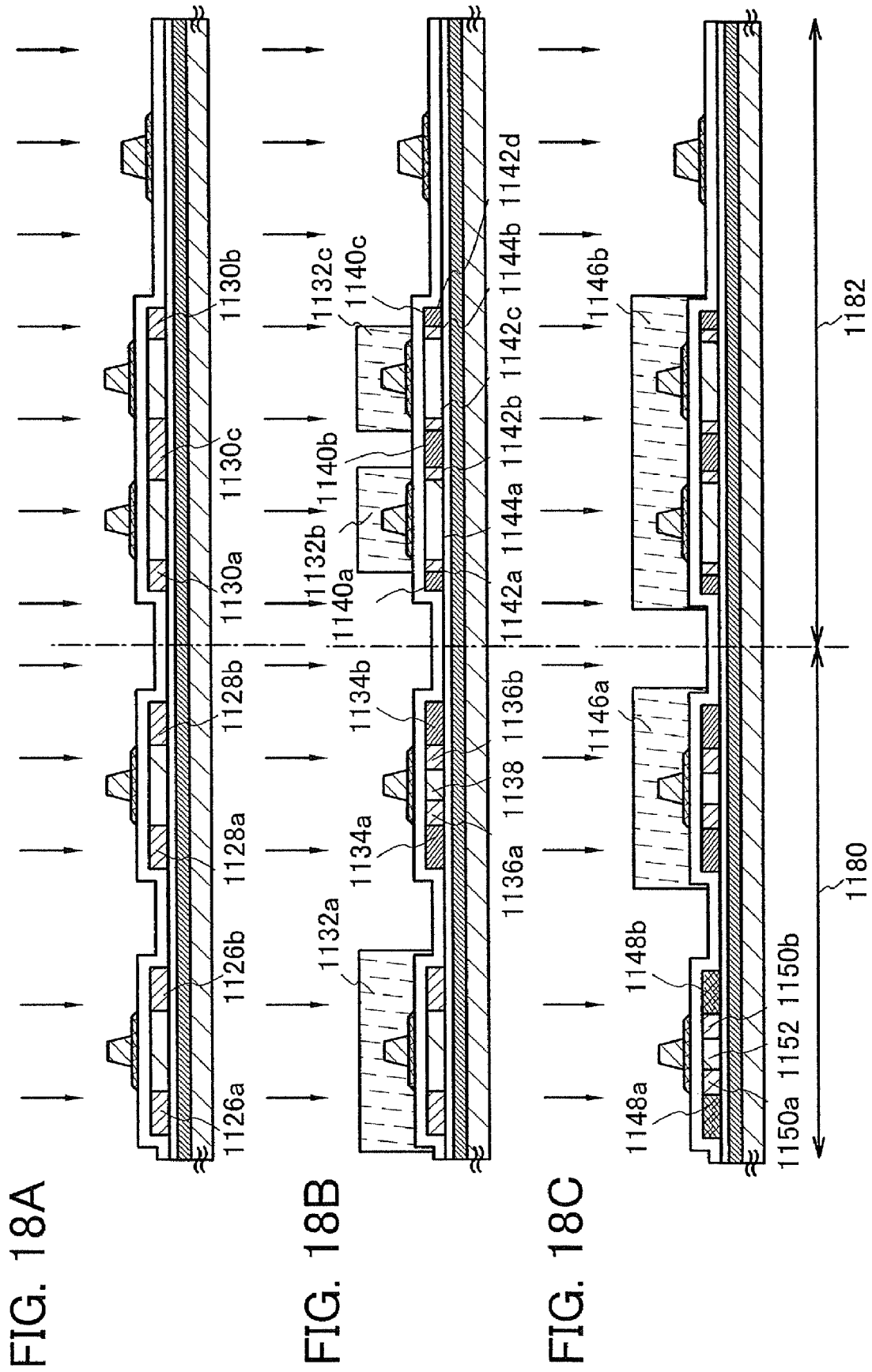

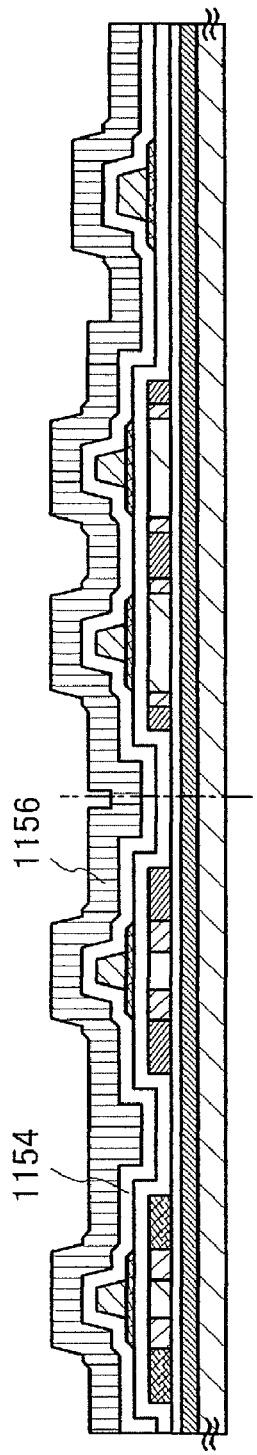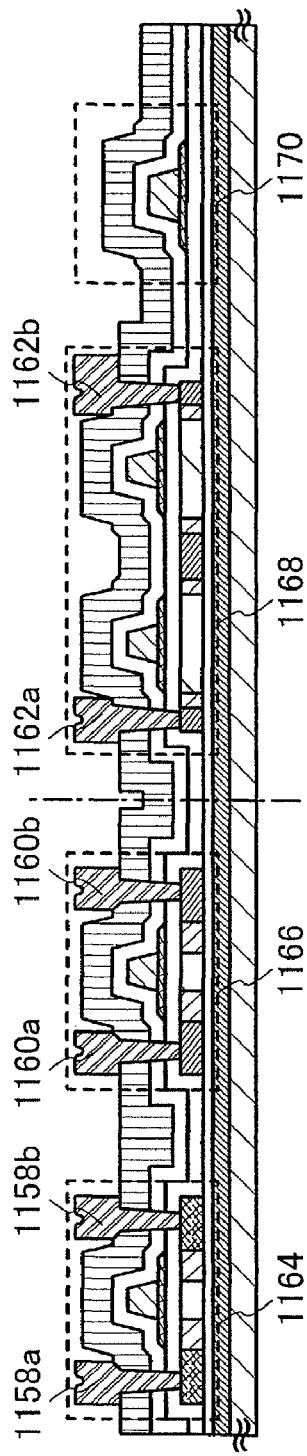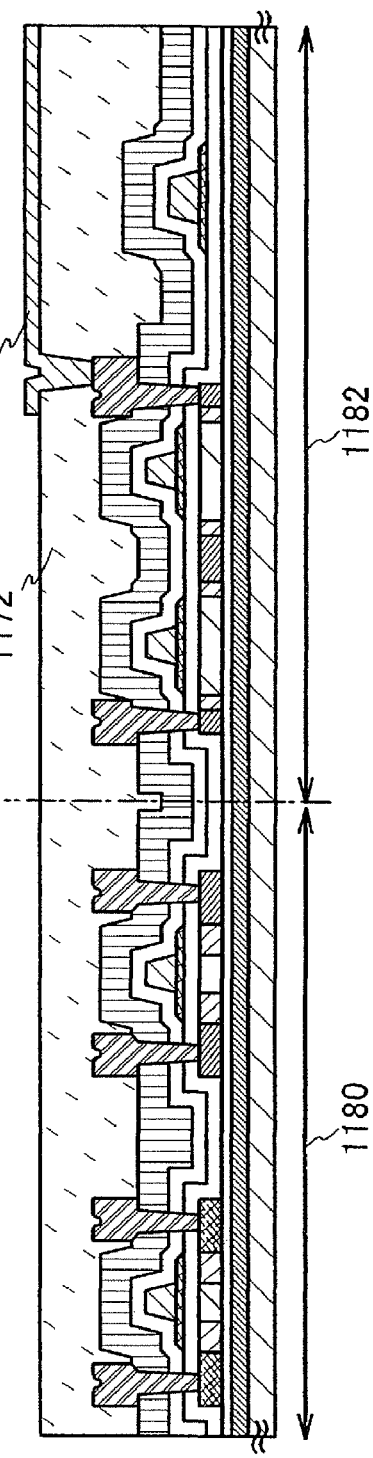

FIG. 25A
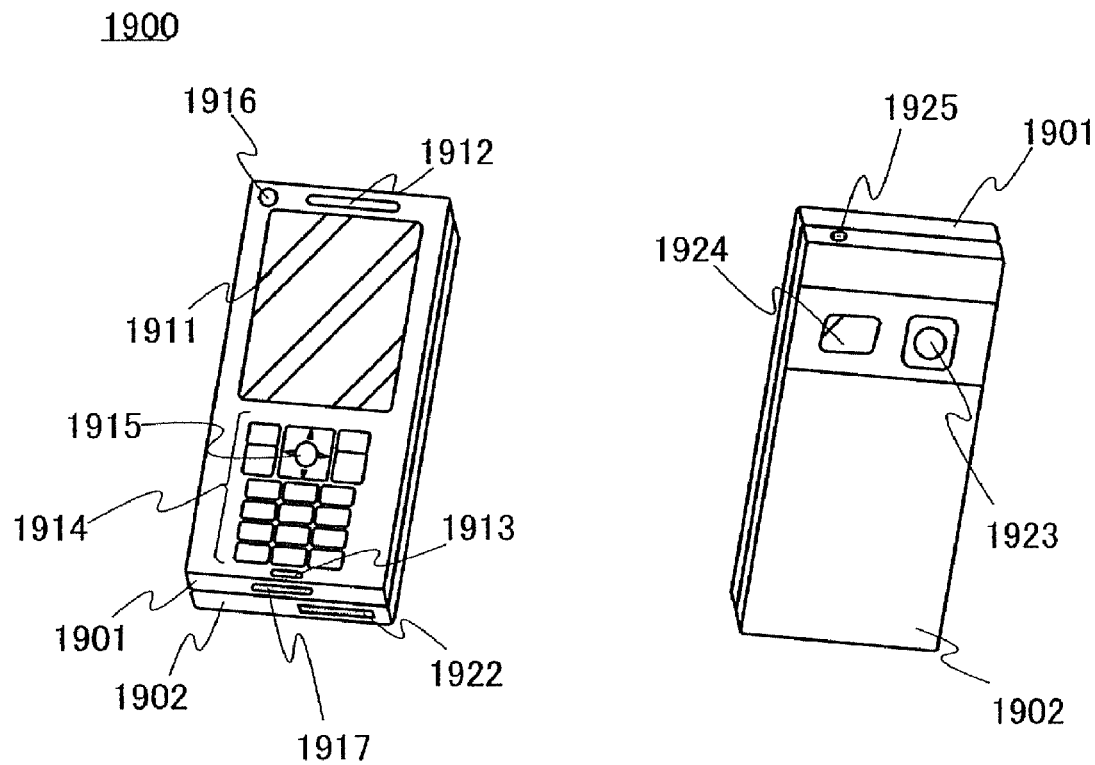
FIG. 25B
FIG. 25C
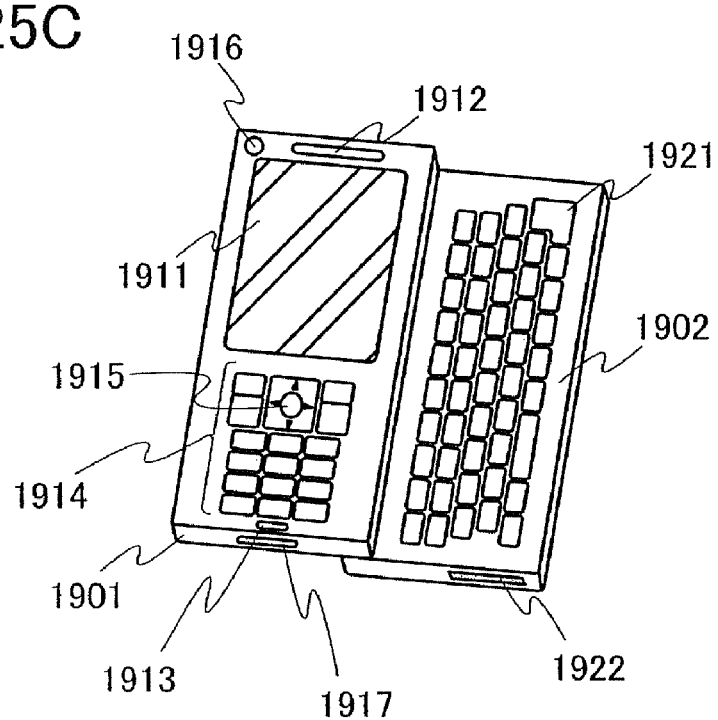

FIG. 32

| Acceleration voltage | H ratio (X : Y) | H ion ratio (X : Y/3) |
|---|---|---|
| 80 kV | 1 : 44.1 | 1 : 14.7 |
| 60 kV | 1 : 42.5 | 1 : 14.2 |
| 40 kV | 1 : 43.5 | 1 : 14.5 |

METHOD FOR MANUFACTURING SOI SUBSTRATE

BACKGROUND OF THE INVENTION

1. Field of the Invention

The present invention relates to a method for manufacturing an SOI substrate having a semiconductor layer on its insulating surface.

2. Description of the Related Art

In recent years, a technique for forming a thin film transistor (TFT) using a semiconductor thin film (a thickness of approximately several nanometers to several hundred nanometers) formed over a substrate having an insulating surface of glass or the like has attracted attention. Thin film transistors are applied to a wide range of electronic devices such as integrated circuits and electro-optic devices, and rapid development of thin film transistors that are to be used as switching elements in image display devices, in particular, has been pushed.

Instead of silicon wafers that are manufactured by thinly slicing an ingot of a single crystal semiconductor, semiconductor substrates called silicon on insulator (SOI) substrates have been developed, which have a thin single crystal semiconductor layer over an insulating layer, and are more widely used as substrates in manufacturing microprocessors or the like. An integrated circuit using an SOI substrate draws attention as an integrated circuit in which parasitic capacitance between drains of transistors and a substrate can be reduced, performance of the semiconductor integrated circuit can be improved, and low power consumption is achieved.

As a method for manufacturing SOI substrates, a hydrogen ion implantation separation method is known (for example, see Reference 1: Japanese Published Patent Application No. 2004-134675). For example, ions of hydrogen or the like are implanted into a silicon wafer of which surface is provided with a silicon oxide film to form a damage region at a predetermined depth from the surface, and a thin film single crystal silicon layer (SOI layer) separated in the damage region is bonded to another wafer. Further, in the technique the bonding strength of the SOI layer is increased by heat treatment to form an SOI substrate. Note that the hydrogen ion implantation separation method may also be referred to as a Smart Cut (registered trademark) method.

On the other hand, forming of an SOI layer on an insulating substrate of glass or the like is also attempted. As an example of an SOI substrate in which an SOI layer is formed on a glass substrate, an SOI substrate in which a thin single crystal silicon layer (SOI layer) is formed on a glass substrate having a coating film by a hydrogen ion implantation separation method is known (for example, see Reference 1: Japanese Published Patent Application No. 2004-134675). In this case also, hydrogen ions are introduced into a silicon wafer to form a damage region at a predetermined depth from the surface, and the silicon wafer is separated in the damage region after bonding the glass substrate and the silicon wafer together; thus, a thin single crystal silicon layer is formed over a glass substrate.

SUMMARY OF THE INVENTION

However, in a step of bonding a silicon wafer and a glass substrate, when minute foreign matter (dust, an abrasive remaining on the surface of the glass substrate, or the like) is attached to the adhesion interface between the silicon wafer and the glass substrate, an abundance of voids occur, which becomes a factor of increase in adhesion defects. Further, if bubbles are taken into part of the adhesion interface due to warpage or deflection of the glass substrate, the possibility of occurrence of adhesion defects is increased. Still further, the silicon wafer is chamfered and adhesion defects easily occur on the peripheral portion of the silicon wafer, which is a problem.

When such adhesion defects occur frequently, the bonding strength is reduced, and there is a concern that peeling of the thin film single crystal silicon layer would occur at the adhesion interface.

Further, in addition to the above problem, for example, if such adhesion defects occur also in the case of manufacturing a semiconductor device, manufacturing of high quality semiconductor devices is inhibited.

In view of the above points, it is an object of the present invention to reduce adhesion defects between a single crystal semiconductor layer and a support substrate, and to manufacture an SOI substrate achiving high bonding strength between the single crystal semiconductor layer and the support substrate. It is another object of the present invention to manufacture a highly reliable semiconductor device using such an SOI substrate.

One aspect of the present invention includes producing plasma by exciting a source gas, adding ion species contained in the plasma from one surface of a single crystal semiconductor substrate, and thereby forming a damage region in the single crystal semiconductor substrate; forming an insulating layer over one surface of the single crystal semiconductor substrate; bonding a support substrate so as to face the single crystal semiconductor substrate with the insulating layer therebetween; heating the single crystal semiconductor substrate to separate the single crystal semiconductor substrate into the single crystal semiconductor layer bonded to the support substrate and a single crystal semiconductor substrate, in the damage region; and pressing the single crystal semiconductor layer bonded to the support substrate.

Another aspect of the present invention includes producing plasma by exciting a source gas, adding ion species contained in the plasma from one surface of a single crystal semiconductor substrate, and thereby forming a damage region in the single crystal semiconductor substrate; forming an insulating layer over one surface of the single crystal semiconductor substrate; bonding a support substrate so as to face the single crystal semiconductor substrate with the insulating layer therebetween; heating the single crystal semiconductor substrate to separate the single crystal semiconductor substrate into the single crystal semiconductor layer bonded to the support substrate and a single crystal semiconductor substrate, in the damage region; selectively etching the single crystal semiconductor layer thereby forming a plurality of island-shaped single crystal semiconductor layers; and pressing the plurality of island-shaped single crystal semiconductor layers.

Still Another aspect of the present invention includes producing plasma by exciting a source gas, adding ion species contained in the plasma from one surface of a single crystal semiconductor substrate, and thereby forming a damage region in the single crystal semiconductor substrate; forming an insulating layer over one surface of the single crystal semiconductor substrate; selectively etching the single crystal semiconductor substrate provided with the insulating layer thereby forming an opening which is deeper than the damage region in the insulating layer and the single crystal semiconductor substrate; bonding a support substrate so as to face the single crystal semiconductor substrate with the insulating layer therebetween; heating the single crystal semiconductor substrate to separate the single crystal semiconductor substrate into a plurality of single crystal semiconductor layers bonded to the support substrate and a single crystal semiconductor substrate, in the damage region; and pressing the plurality of single crystal semiconductor layers bonded to the support substrate.

Note that it is preferable that the thickness of the insulating layer be 500 nm to 1000 nm.

Here, in this specification, "single crystal" is a crystal in which crystal planes or crystallographic axes are aligned and atoms or molecules which compose the single crystal are spatially ordered in a regular manner. Although a single crystal may be formed from regularly arranged atoms, a single crystal may partially include a lattice defect in which the arrangement is disordered or a single crystal may include intended or unintended lattice strains.

When the present invention is applied, adhesion defects between a single crystal semiconductor layer and a support substrate are reduced, and an SOI substrate having high bonding strength can be manufactured. Further, a highly reliable semiconductor device using such an SOI substrate can be manufactured.

BRIEF DESCRIPTION OF THE DRAWINGS

In the accompanying drawings:

FIGS. 18A to 18C illustrate a method for manufacturing the semiconductor device to which the present invention is applied;

FIGS. 19A to 19C illustrate a method for manufacturing the semiconductor device to which the present invention is applied;

FIGS. 25A to 25C illustrate an electronic device to which the present invention is applied;

FIG. 32 is a table providing a summary of the ratio of fitting parameters (hydrogen atoms ratio and hydrogen ion species ratio).

DETAILED DESCRIPTION OF THE INVENTION

Figure 1A:
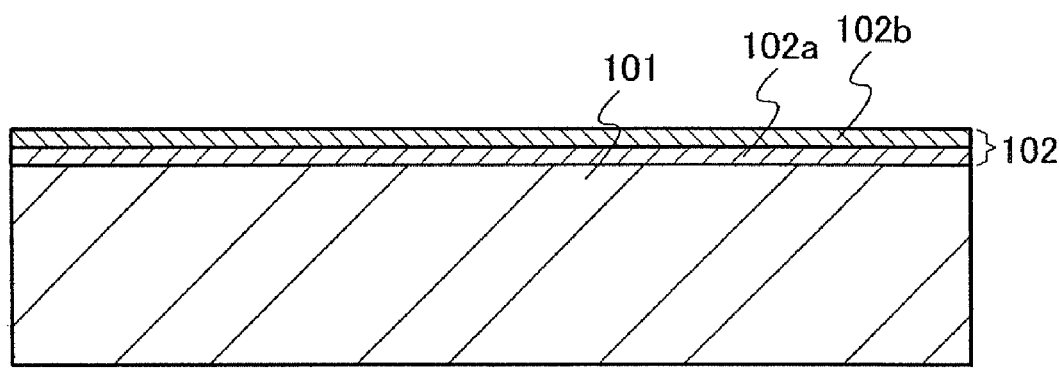
FIGS. 1A and 1B illustrate a method for manufacturing an SOI substrate in accordance with the present invention.

The embodiment modes of the present invention will be described in detail with reference to the accompanying drawings. However, the present invention is not limited to the following description. As is readily appreciated by those skilled in the art, the modes and the details of the invention can be changed in various ways without departing from the spirit and the scope of the present invention. Therefore, the present invention should not be construed as being limited to the following descriptions of the embodiment modes. Note that, in the structures of the present invention described below, like portions or portions having similar functions are denoted by common reference numerals in different drawings, and description of them will not be repeated.

Embodiment Mode 1

In this embodiment mode, a method for manufacturing an SOI substrate, in which a single crystal semiconductor substrate is divided into a single crystal semiconductor layer bonded to a support substrate and a single crystal semiconductor substrate, and a surface of the single crystal semiconductor layer bonded to the support substrate is pressed, will be described with reference to the drawings. Further, in this embodiment mode, a method for manufacturing an SOI substrate, which is aimed at providing a single crystal semiconductor layer over a substrate having low heat-resistant temperature, such as a glass substrate will also be described.

First, a single crystal semiconductor substrate 101 is prepared. The single crystal semiconductor substrate 101 is processed to have a desired size and shape. The single crystal semiconductor substrate 101 is, for example, a single crystal silicon substrate, a germanium substrate, a semiconductor substrate made of a compound such as gallium arsenide or indium phosphide, or the like. Circular substrates which are 5 inches (125 mm) in diameter, 6 inches (150 mm) in diameter, 8 inches (200 mm) in diameter, and 12 inches (300 mm) in diameter are the typical single crystal silicon substrates. In addition, a circular substrate which is 18 inches (450 mm) in diameter can also be used. Note that the shape of the single crystal silicon substrate is not limited to a circular shape, and a single crystal silicon substrate processed into a rectangular shape can also be used.

An insulating layer 102 containing nitrogen is formed over one of surfaces of the single crystal semiconductor substrate 101 (see FIG. 1A). It is preferable to provide the insulating layer 102 containing nitrogen for the purpose of preventing impurity contamination from the support substrate side when part of the single crystal semiconductor substrate 101 is bonded to the support substrate to provide the single crystal semiconductor layer in a later step. That is, the insulating layer 102 containing nitrogen serves as a barrier layer for preventing an impurity such as mobile ions or moisture contained in the support substrate from diffusing into the single crystal semiconductor layer. Therefore, in the case where contamination by an impurity element is not a problem, the insulating layer 102 containing nitrogen can be omitted.

The insulating layer 102 containing nitrogen can be formed as a single layer or a layer stack with two or more layers using a silicon nitride layer, a silicon nitride oxide layer, or a silicon oxynitride layer by chemical vapor deposition (CVD), sputtering, or the like. The insulating layer 102 containing nitrogen is preferably formed to a thickness of 50 nm to 200 nm inclusive. In this embodiment mode, as the insulating layer 102, a silicon oxynitride layer 102a (thickness: 50 nm) and a silicon nitride oxide layer 102b (thickness: 50 nm) are stacked from the single crystal semiconductor substrate 101 side. Note that the chemical vapor deposition (CVD) in this specification includes, in its category, plasma CVD, thermal CVD, and photo-CVD.

Note that a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 atom % to 70 atom %, 0.5 atom % to 15 atom %, 25 atom % to 35 atom %, and 0.1 atom % to 10 atom %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 atom % to 30 atom %, 20 atom % to 55 atom %, 25 atom % to 35 atom %, and 10 atom % to 30 atom %, respectively. Note that percentages of nitrogen, oxygen, silicon, and hydrogen fall within the ranges given above, where the total number of atoms contained in the silicon oxynitride film or the silicon nitride oxide film is defined as 100 atom %.

Figure 1B:
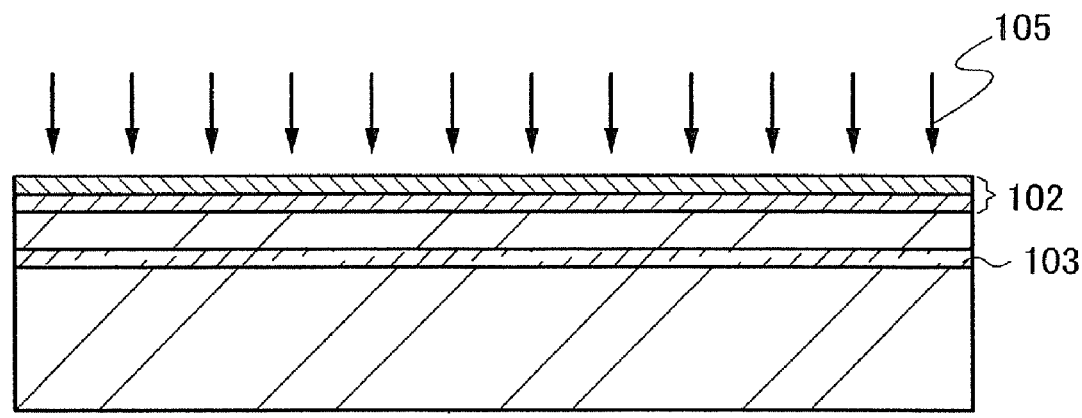

Next, through the insulating layer 102, the single crystal semiconductor substrate 101 is irradiated with an ion beam 105 including ions accelerated by an electric field, so that the ions are introduced into the single crystal semiconductor substrate 101; accordingly, a damage region 103 is formed in a region at a predetermined depth from one of surfaces of the single crystal semiconductor substrate 101 (see FIG. 1B). The ion beam 105 is generated in such a manner that a source gas is excited to produce plasma of the source gas, and ions contained in the plasma are extracted from the plasma by an electric field effect.

The depth at which the damage region 103 is formed can be controlled by the acceleration voltage of the ion beam 105 and the incident angle thereof. The damage region 103 is formed as deep as the average depth at which the ions enters. The depth to which ions are introduced determines the thickness of the single crystal semiconductor layer separated from the single crystal semiconductor substrate 101. The depth at which the damage region 103 is formed is controlled so that the thickness of the single crystal semiconductor layer becomes 20 nm to 500 nm inclusive, preferably 20 nm to 200 nm inclusive.

An ion implantation apparatus or an ion doping apparatus can be used in order to add ions to the single crystal semiconductor substrate 101. In an ion implantation apparatus, a source gas is excited to produce plasma, ion species are extracted from the plasma, the ion species are mass-separated, and an object to be processed is irradiated with the ion species having a predetermined mass. In an ion doping apparatus, a source gas is excited to produce plasma, ion species are extracted from the plasma, and an object to be processed is irradiated with the ion species without being mass-separated. Note that in an ion doping apparatus provided with a mass separator, ion implantation with mass separation can be performed in a similar manner to an ion implantation apparatus. In this specification, the use of one of an ion implantation apparatus and an ion doping apparatus is specified only in the case where one of them needs to be used, whereas in the case where there is not specific description, either of them may be used to perform ion irradiation.

An ion irradiation step in the case of using an ion doping apparatus can be performed under the following conditions, for example.
Acceleration voltage: greater than or equal to 10 kV and less than or equal to 100 kV (preferably greater than or equal to 20 kV and less than or equal to 80 kV)
Dose: greater than or equal to $1 \times 10^{16}$ atoms/cm$^2$ and less than or equal to $4 \times 10^{16}$ atoms/cm$^2$
Beam current density: 2 µA/cm$^2$ (preferably greater than or equal to 5 µA/cm$^2$, further preferably greater than or equal to 10 µA/cm$^2$)

In the case of using an ion doping apparatus, a hydrogen gas can be used as a source gas of the ion irradiation step. With use of a hydrogen gas (an H$_2$ gas), H$^+$, H$_2^+$, and H$_3^+$ can be generated as ion species. In the case of using a hydrogen gas as a source gas, it is preferable to perform irradiation with a large amount of H$_3^+$. When irradiation with a large amount of H$_3^+$ is performed, irradiation efficiency with ions is increased in comparison with the case of irradiation with H$^+$ and H$_2^+$. In other words, time required for ion irradiation can be shortened. Further, separation at the damage region 103 can be performed more easily. Moreover, with use of H$_3^+$, the average depth at which ions enter can be shallower; thus, the damage region 103 can be formed at a shallower region.

In the case of using an ion implantation apparatus, it is preferable to perform mass separation to emit H$_3^+$ ions. Needless to say, irradiation with H$_2^+$ ions may be performed. Note that, since ion species are selected to perform irradiation in the case of using an ion implantation apparatus, irradiation efficiency with ions is decreased more than in the case of using an ion doping apparatus, in some cases.

In the case of using an ion doping apparatus, it is preferable that H$_3^+$ ions be contained at greater than or equal to 70% of the total amount of H$^+$, H$_2^+$, and H$_3^+$ in the ion beam 105. The proportion of $H_3^+$ ions is preferably greater than or equal to 80%. With the proportion of $H_3^+$ increased as described above, hydrogen of greater than or equal to $1 \times 10^{20}$ atoms/cm$^3$ can be contained in the damage region 103, and thus separation of the semiconductor layer can be easily performed.

For a source gas in the ion irradiation step, instead of a hydrogen gas, one or more kinds of gas selected from a rare gas such as helium or argon, a halogen gas typified by a fluorine gas or a chlorine gas, or a halogen compound gas such as a fluorine compound gas (e.g., $BF_3$) can be used. In the case of using helium for a source gas, the ion beam 105 with high proportion of $He^+$ ions can be formed without mass separation. With use of such an ion beam 105, the damage region 103 can be efficiently formed.

An ion irradiation method, which is one aspect of the present invention, is considered below.

In the present invention, a single crystal semiconductor substrate is irradiated with ions that are derived from hydrogen (H) (hereafter referred to as "hydrogen ion species"). More specifically, a hydrogen gas or a gas containing hydrogen in its composition is used as a source material; a hydrogen plasma is generated; and the single crystal semiconductor substrate is irradiated with the hydrogen ion species in the hydrogen plasma.

(Ions in Hydrogen Plasma)

In such a hydrogen plasma as described above, hydrogen ion species such as $H^+$, $H_2^+$, and $H_3^+$ exist. Here are reaction equations for reaction processes (formation processes, destruction processes) of the hydrogen ion species.

  (1)

  (2)

  (3)

  (4)

  (5)

  (6)

  (7)

  (8)

  (9)

Figure 27:
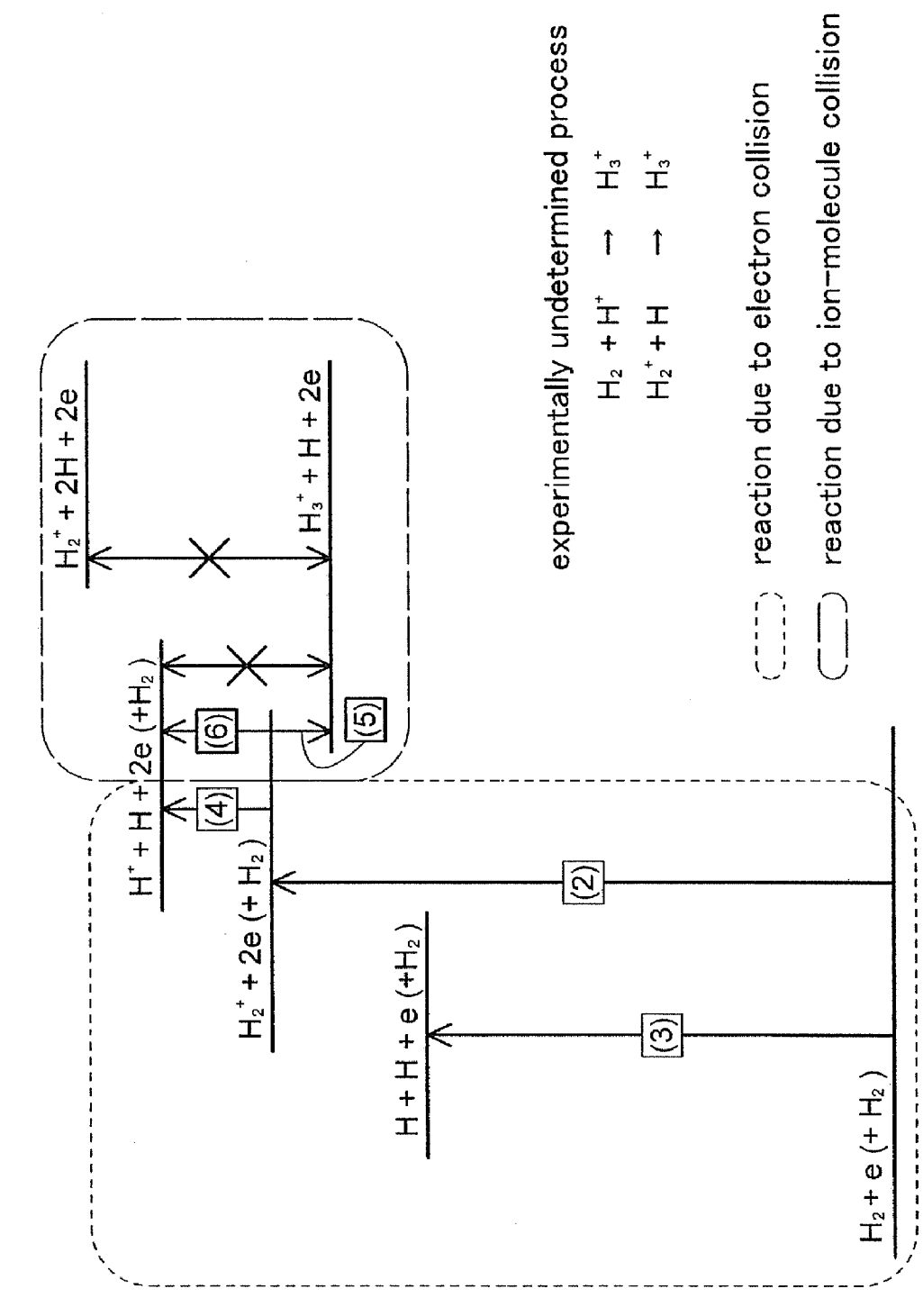
FIG. 27 is an energy diagram of hydrogen ion species.

FIG. 27 is an energy diagram which schematically illustrates some of the above reactions. Note that the energy diagram shown in FIG. 27 is merely a schematic diagram and does not exactly depict the relationship of the energy of the reactions. The following reaction equations are not experimentally-observed, as indicated by the "x" marks in FIG. 27.

  (10)

  (11)

($H_3^+$ Formation Process)

As described above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at least, it is necessary that the reaction of the reaction equation (5) occur more often than the reaction of the reaction equation (6) (note that because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than approximately 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than approximately 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy that a charged particle gains before colliding with another particle is equal to the difference between a potential energy at a potential before the charged particle moves and a potential energy at a potential before the collision. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

(Differences Depending on Ion Source)

Figure 2:
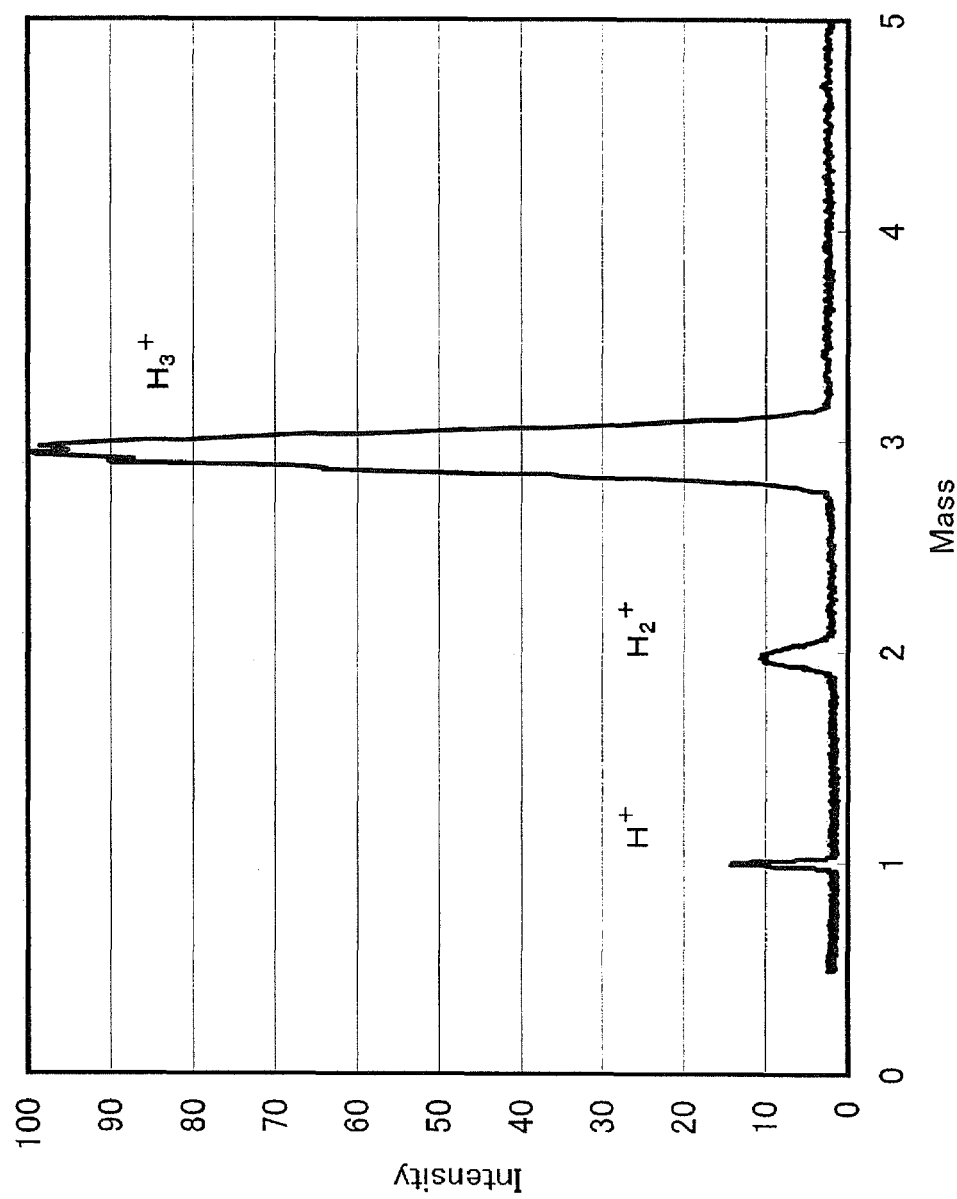
FIG. 2 is a graph illustrating the result of ion mass spectrometry.

Here, an example, in which the proportions of ion species (particularly, the proportion of $H_3^+$) are different, is described. FIG. 2 is a graph illustrating the result of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 2, the number of ions with different masses is expressed as a relative proportion where the number of ions with a mass of 3 is defined as 100. It can be seen from FIG. 2 that the ratio between ion species that are generated from the ion source, i.e., the ratio between $H^+$, $H_2^+$, and $H_3^+$, is approximately 1:1:8. Note that ions at such a ratio can also be generated by an ion doping apparatus which has a plasma source portion (ion source) that generates plasma, an extraction electrode that extracts an ion beam from the plasma, and the like.

Figure 3:
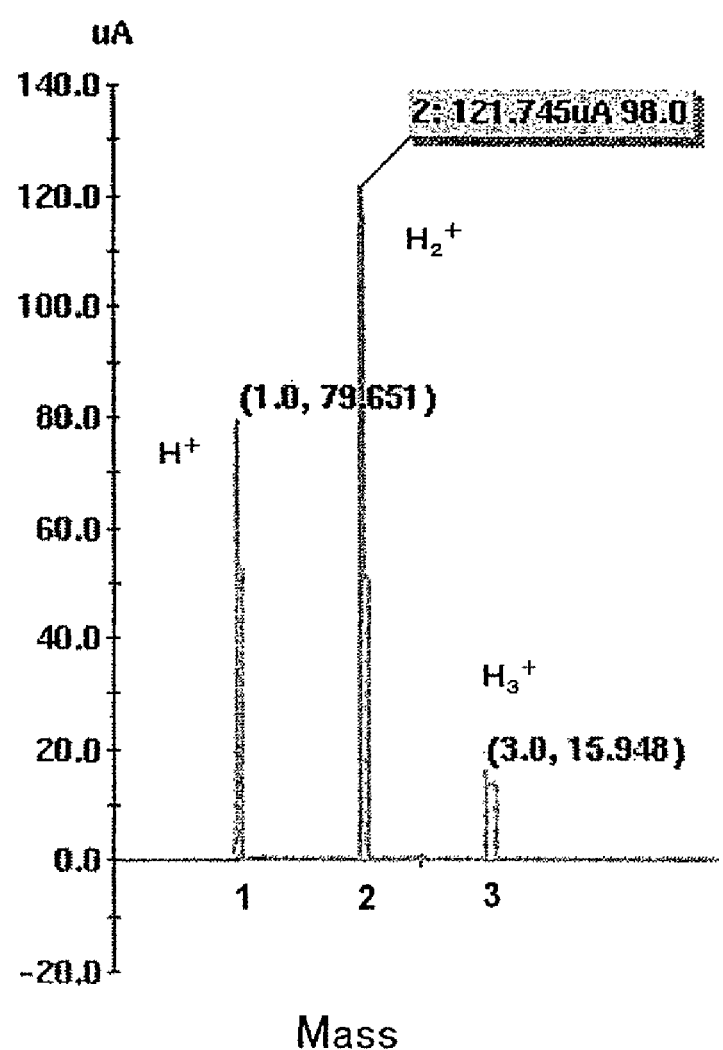
FIG. 3 is a graph illustrating the result of ion mass spectrometry.

FIG. 3 is a graph showing the result of mass spectrometry of ions that are generated from $PH_3$ when an ion source different from that for the case of FIG. 2 is used and the pressure of the ion source is approximately $3 \times 10^{-3}$ Pa. The results of this mass spectrometry focus on the hydrogen ion species. In addition, the mass spectrometry was performed by measurement of ions that were extracted from the ion source. In FIG. 3, as in FIG. 2, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be found from FIG. 3 that the ratio between ion species in plasma, i.e., the ratio between $H^+$, $H_2^+$, and $H_3^+$, is approximately 37:56:7. Note that although FIG. 3 illustrates the data obtained when the source gas is $PH_3$, the ratio between the hydrogen ion species is about the same when a 100% hydrogen gas is used as a source gas, as well.

In the case of the ion source from which the data shown in FIG. 3 is obtained, $H_3^+$, of $H^+$, $H_2^+$, and $H_3^+$, is generated at a proportion of only approximately 7%. On the other hand, in the case of the ion source from which the data shown in FIG. 2 is obtained, the proportion of $H_3^+$ can be greater than or equal to 50% (under the above-described conditions, approximately 80%). This is thought to result from the pressure and electric field inside a chamber, which is clearly shown in the above consideration.

($H_3^+$ Irradiation Mechanism)

When plasma that contains a plurality of ion species as shown in FIG. 2 is generated and a single crystal semiconductor substrate is irradiated with the generated ion species without any mass separation being performed, the surface of the single crystal semiconductor substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of a Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of a Si substrate changes into a non-single-crystal structure due to the collision of the hydrogen ion species with Si atoms.

Figure 28:
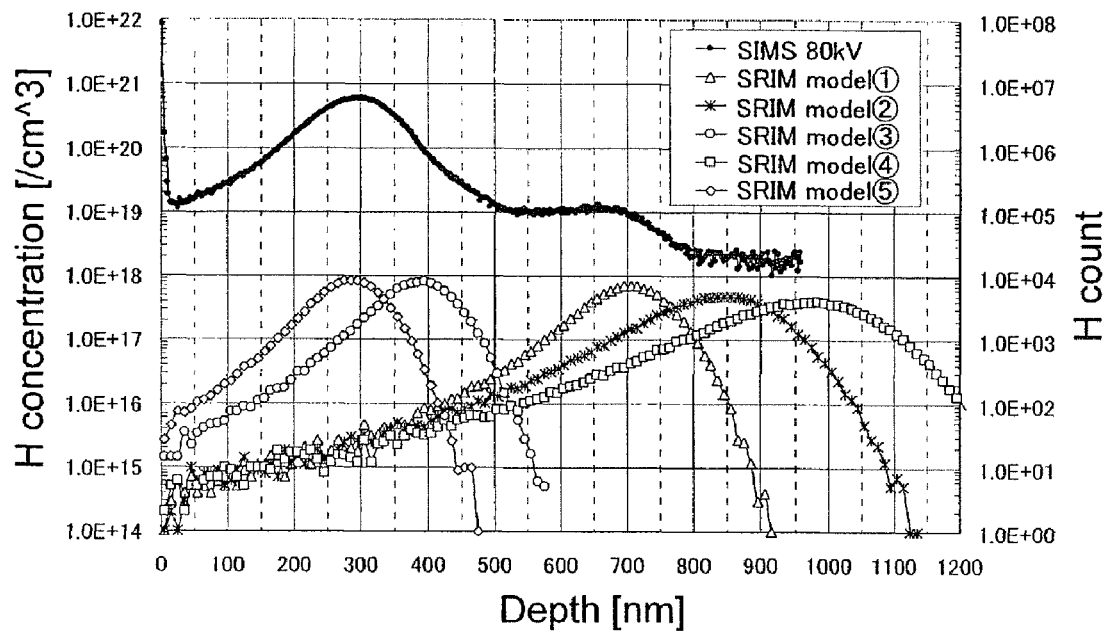
FIG. 28 illustrates the profile of hydrogen atoms in the depth direction in the case where the accelerating voltage is 80 kV (measured values and calculated values)

FIG. 28 illustrates the calculation results of the number of hydrogen atoms in a Si substrate, obtained when irradiation with the hydrogen ion species (irradiation with 100,000 atoms for H) is performed using Models 1 to 5. FIG. 28 also illustrates the hydrogen concentration (secondary ion mass spectrometry (SIMS) data) in a Si substrate irradiated with the hydrogen ion species of FIG. 2. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of a Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only approximately several electron volts, it is thought that the contribution of each of Models 2 and 4 is small because $H_2^+$ and $H_3^+$ mostly split into $H^+$ or H by colliding with Si atoms.

Figure 29:
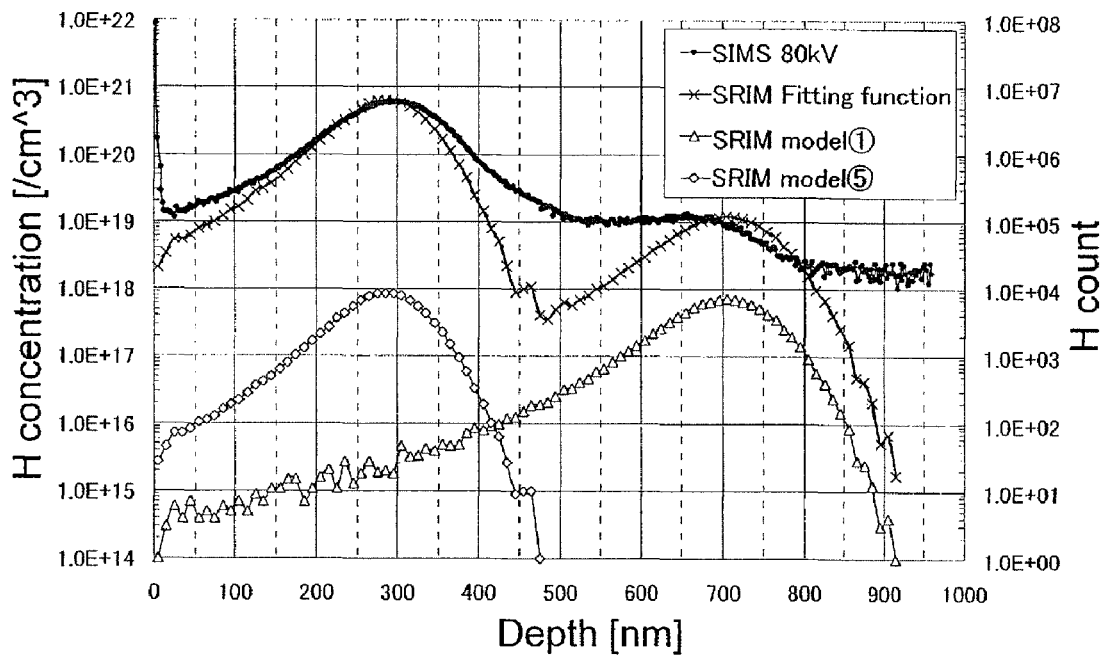
FIG. 29 illustrates the profile of hydrogen atoms in the depth direction in the case where the accelerating voltage is 80 kV (measured values, calculated values, and fitting functions)
Figure 30:
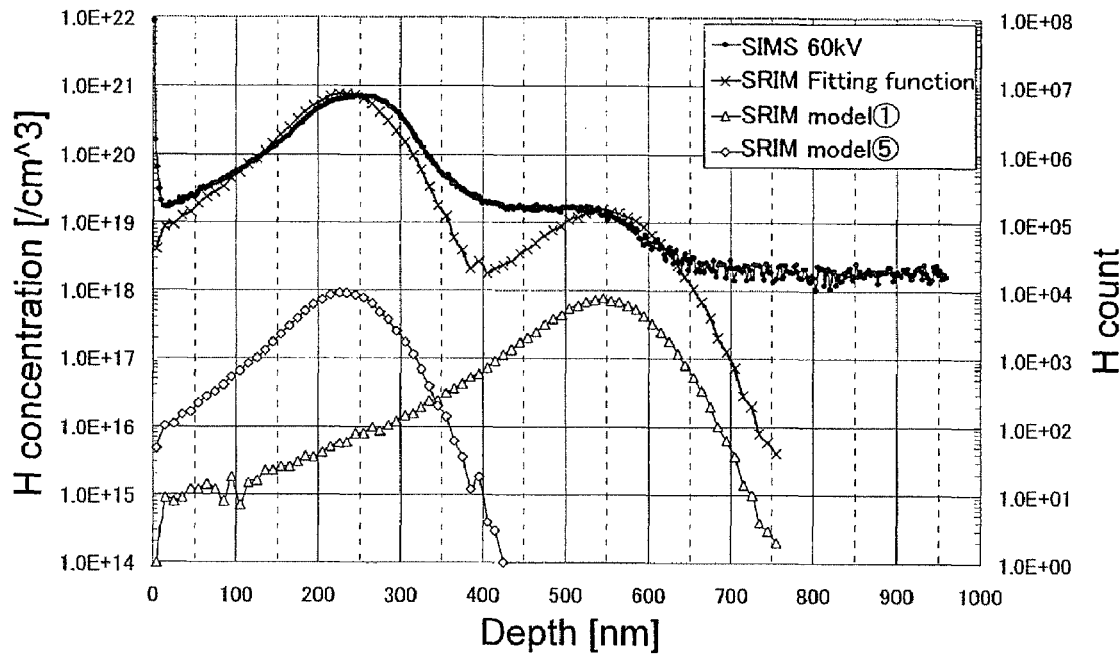
FIG. 30 illustrates the profile of hydrogen atoms in the depth direction in the case where the accelerating voltage is 60 kV (measured values, calculated values, and fitting functions)
Figure 31:
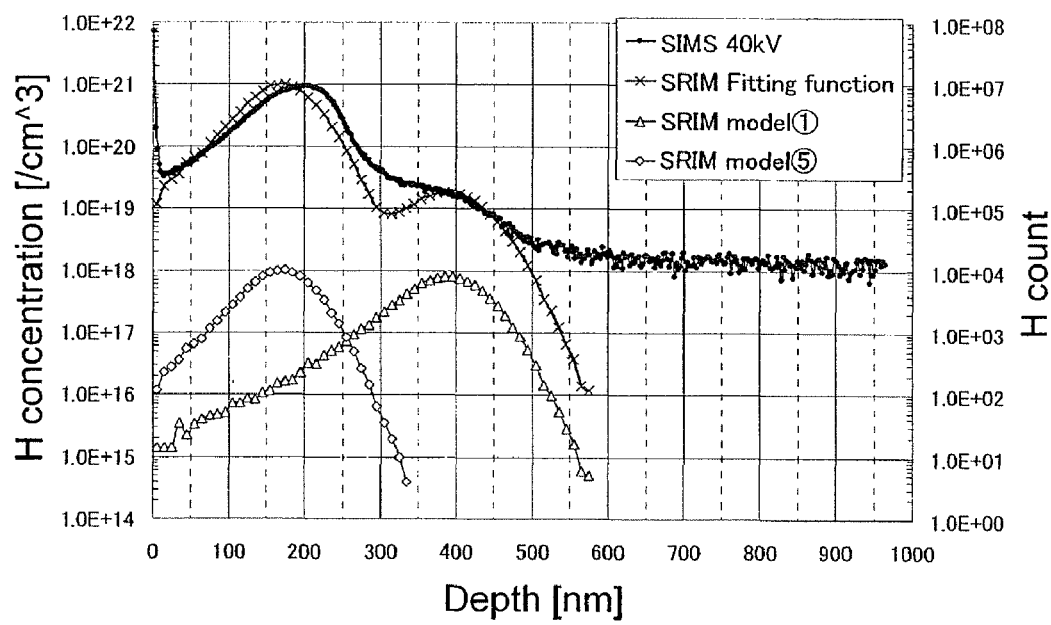
FIG. 31 illustrates the profile of hydrogen atoms in the depth direction in the case where the accelerating voltage is 40 kV (measured values, calculated values, and fitting functions)

Accordingly, Models 2 to 4 will not be considered hereinafter. FIGS. 29 to 31 each illustrate the calculation results obtained when irradiation with the hydrogen ion species (irradiation with 100,000 atoms for H) is performed using Models 1 and 5. FIGS. 29 to 31 also each illustrate the hydrogen concentration (SIMS data) in a Si substrate irradiated with the hydrogen ion species of FIG. 2, and the simulation results fitted to the SIMS data (hereinafter referred to as a fitting function). Here, FIG. 29 illustrates the case where the acceleration voltage is 80 kV; FIG. 30, the case where the acceleration voltage is 60 kV; and FIG. 31, the case where the acceleration voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of a Si substrate.

The fitting function is obtained using the calculation formula given below, in consideration of Models 1 and 5. Note that in the calculation formula, X and Y represent fitting parameters and V represents volume.

(Fitting Function)=$X/V$×(Data of Model 1)+$Y/V$×(Data of Model 5)

In consideration of the ratio between ion species used for actual irradiation ($H^+:H_2^+:H_3^+$ is approximately 1:1:8), the contribution of $H_2^+$ (i.e., Model 3) should also be considered; however, Model 3 is excluded from the consideration given here for the following reasons:

Since the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si, and the influence due to crystallinity is not considered.

FIG. 32 lists the above-described fitting parameters. At any of the acceleration voltages, the ratio of the amount of H introduced according to Model 1 to that introduced according to Model 5 is approximately 1:42 to 1:45 (the amount of H in Model 5, when the amount of H in Model 1 is defined as 1, is approximately 42 to 45), and the ratio of the number of ions used for irradiation, $H^+$ (Model 1) to that of $H_3^+$ (Model 5) is approximately 1:14 to 1:15 (the amount of $H_3^+$ in Model 5, when the amount of $H^+$ in Model 1 is defined as 1, is approximately 14 to 15 inclusive). Considering that Model 3 is not considered and the calculation assumes amorphous Si, it can be said that values close to that of the ratio between ion species used for actual irradiation ($H^+$:$H_2^+$:$H_3^+$ is approximately 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 2. For example, because $H_3^+$ splits into $H^+$, H, or the like to be introduced into a substrate, ion introduction efficiency can be improved compared with the case of irradiation mainly with $H^+$ or $H_2^+$. This leads to an improvement in SOI substrate production efficiency. In addition, because the kinetic energy of $H^+$ or H after $H_3^+$ splits tends to be low, $H_3^+$ is suitable for manufacture of thin semiconductor layers.

Note that in this specification, a method is described in which an ion doping apparatus that is capable of irradiation with the hydrogen ion species as shown in FIG. 2 is used in order to efficiently perform irradiation with $H_3^+$. Ion doping apparatuses are inexpensive and excellent for use in large-area treatment. Therefore, by irradiation with $H_3^+$ with use of such an ion doping apparatus, significant effects such as an improvement in semiconductor characteristics, an increase in area, a reduction in costs, and an improvement in production efficiency can be obtained. On the other hand, if the first priority is given to irradiation with $H_3^+$, there is no need to interpret the present invention as being limited to the use of an ion doping apparatus.

Figure 4A:
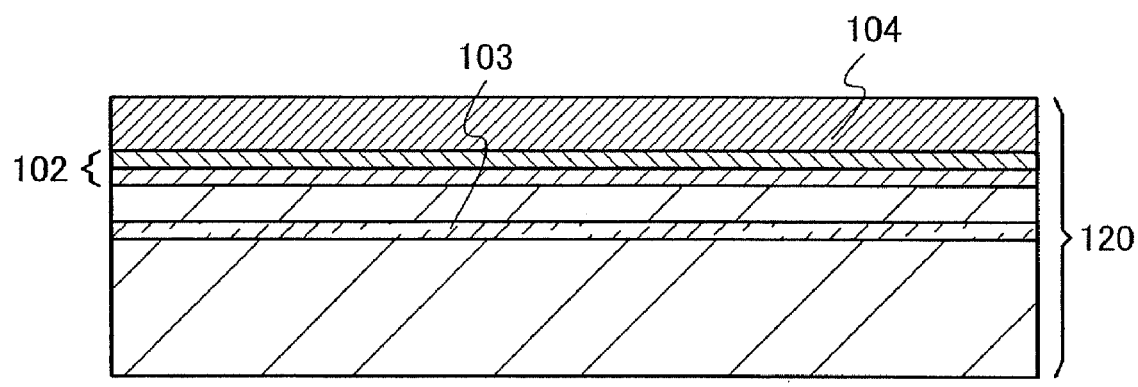
FIGS. 4A and 4B illustrate a method for manufacturing the SOI substrate in accordance with the present invention.

Next, an insulating layer 104 (also referred to as a "bond layer") is formed over the insulating layer 102 over the single crystal semiconductor substrate 101 (see FIG. 4A). The insulating layer 104 is formed over a surface where the single crystal semiconductor substrate 101 forms a bond with the support substrate. The insulating layer 104 may have a single layer structure or a layered structure, and an insulating layer in which a surface which is to form a bond with the support substrate (hereinafter also referred to as a "bonding surface") has a smooth surface and becomes a hydrophilic surface is preferably used. The single crystal semiconductor substrate 101 including the insulating layer 104 and the insulating layer 102 is used as a semiconductor substrate 120.

For the insulating layer which has a smooth surface and can form a hydrophilic surface, silicon oxide containing hydrogen, silicon nitride containing hydrogen, silicon nitride containing oxygen and hydrogen, silicon oxynitride, silicon nitride oxide, or the like can be used.

As silicon oxide containing hydrogen, for example, a silicon oxide formed by a chemical vapor deposition method (CVD) using an organosilane gas as a silicon source gas is preferable. With use of the insulating layer 104 which is formed using an organosilane gas, for example, a silicon oxide film, a bond between the support substrate and the single crystal semiconductor layer can be made strong. Examples of an organosilane gas that can be used include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

A silicon oxide layer, which functions as a bond layer, can also be formed by a chemical vapor deposition method using monosilane, disilane, or trisilane as a source gas. The silicon oxide layer, which functions as a bond layer, may be a thermal oxide film, and it is preferable to contain chlorine.

Silicon nitride containing hydrogen can be formed by a plasma CVD method using a silane gas and an ammonia gas. Hydrogen may be added to the gases. Silicon nitride containing oxygen and hydrogen can be formed by a plasma CVD method using a silane gas, an ammonia gas and a nitrous oxide gas. In any case, any of silicon oxide, silicon oxynitride, or silicon nitride oxide, which contains hydrogen and is formed by a chemical vapor deposition method such as a plasma CVD method, a low pressure CVD method, or an atmospheric pressure CVD method using a silane gas, or the like as a source gas can be used. Deposition by a chemical vapor deposition method is performed at a temperature low enough to keep from degassing of the damage region 103 formed in the single crystal semiconductor substrate 101. For example, the deposition temperature is preferably less than or equal to 350° C. Note that, for heat treatment in separation of the single crystal semiconductor layer from the single crystal semiconductor substrate 101, a heat treatment temperature that is higher than the film formation temperature in a chemical vapor deposition method is applied. In any case, an insulating layer can be used as the insulating layer 104 as long as it has a smooth surface and a surface to which a hydroxyl group is attached.

The insulating layer 104 can be provided with a thickness of greater than or equal to 10 nm and less than or equal to 1000 nm. Further, the insulating layer 104 is preferably provided with a thickness of greater than or equal to 500 nm and less than or equal to 1000 nm for performing good bonding.

Figure 4B:
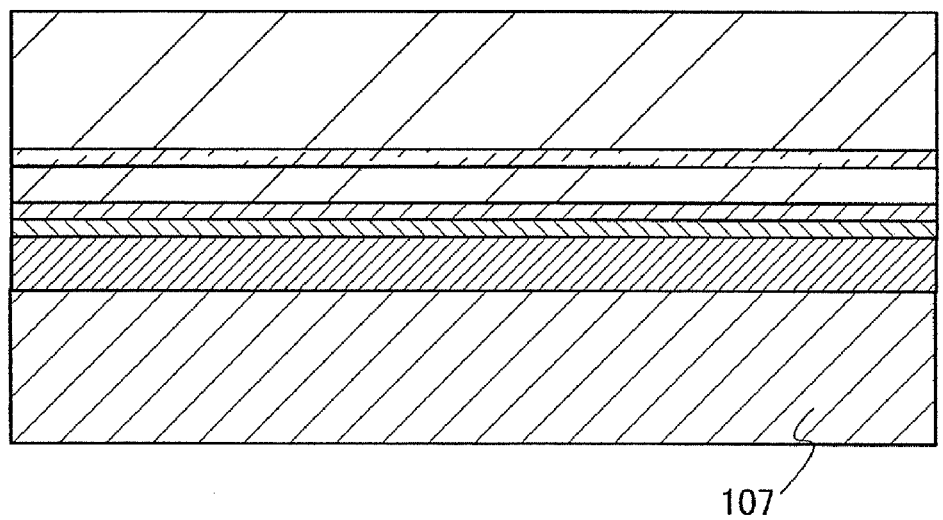

Next, the single crystal semiconductor substrate 101 and a support substrate 107 are opposed and bonded to each other with the insulating layer 104 interposed therebetween (see FIG. 4B). A surface of the insulating layer 104 formed over the single crystal semiconductor substrate 101 and a surface of the support substrate 107 are placed in close contact with each other; thus, the single crystal semiconductor substrate 101 and the support substrate 107 are bonded to each other.

As the support substrate 107, a substrate having an insulating surface is used. For example, variety of glass substrates used in the electronics industry, such as an aluminosilicate glass substrate, or an aluminoborosilicate glass substrate is used. The size of the glass substrate may be determined in consideration of the size of the single crystal semiconductor substrate to be bonded. A plurality of single crystal semiconductor substrates can be bonded to one glass substrate. In that case, a large glass substrate used for producing a liquid crystal panel or the like can be applied. For example, a large mother glass substrate called the sixth generation (1500 mm×1850 mm), the seventh generation (1870 mm×2200 mm), or the eighth generation (2200 mm×2400 mm) is used. Manufacture of an SOI substrate with a large mother glass substrate used as the support substrate 107 makes it possible to realize a large SOI substrate. As a result, the number of display panels which is manufactured from a single substrate (panels yielded per substrate) can be increased, and accordingly, productivity can be improved.

A variety of glass substrates used in the electronics industry such as an aluminosilicate glass substrate or an aluminoborosilicate glass substrate, which have polished surfaces, are preferably used because of high planarity thereof. The polished surface of the glass substrate and the single crystal semiconductor substrate or the insulating layer formed over the single crystal semiconductor substrate are bonded to each other, thus, defective bonding can be reduced. The glass substrate may be polished with cerium oxide or the like, for example. By polishing treatment, the single crystal semiconductor substrate can be bonded to almost entire surface including an end region on a main surface of the glass substrate.

Further, since bonding is performed at a low temperature, a glass substrate containing $SiO_2$ and $Al_2O_3$ as main components is preferably used as the support substrate 107. Specifically, a glass substrate having not only silicon oxide but also aluminum oxide as main components is used, so that a bond can be formed at 700° C. or lower. For example, when the total constituents contained in the support substrate 107 is assumed to be 100 weight %, the support substrate 107 containing $SiO_2$ at 55 weight % to 74 weight %, $Al_2O_3$ at 7 weight % to 18 weight %, and MgO, CaO, SrO, $B_2O$, and BaO at the range of 0 weight % to 15 weight % is used. Aluminum atoms contained in the support substrate 107 and silicon atoms of silicon oxide or silicon nitride, which are contained in the insulating layer 104 form, for example, Al—O—Si bonds with oxygen atoms to form the bond. In this case, the bond can be formed at a lower temperature in the case of using Al—O—Si bonds than in the case of forming a bond with only silicon oxide (Si—O—Si bond).

In the case of forming a bond by interaction of silicon oxide and aluminum oxide, a planarization film is formed over a surface of the support substrate 107, and an aluminum oxide film may be formed in addition by sputtering. As the planarization film, a silicon oxide film having good step coverage, which is formed by interaction between ethyl silicate (TEOS: chemical formula: $Si(OC_2H_5)_4$), silane, or the like and oxygen, nitrous oxide, or the like, or silicon oxide film applied and baked using a siloxane based material as a starting material is used. The planarization film is formed over a surface of the support substrate 107; thus, fine irregularities of the surface can be prevented from adversely affect, and even when minute foreign matter is attached, it is embedded; therefore, defects (pinholes) in the single crystal semiconductor layer after the bonding process can be prevented from being generated. Aluminum oxide, which is formed over a surface of the planarization film, is not only suitable for the formation of a bond, and it prevents diffusion of impurities such as an alkali metal or the like thereby also serving as a blocking layer.

In order to favorably perform bonding between the support substrate 107 and the insulating layer 104, a bonding surface may be activated. For example, one or both of the surfaces which are to form a bond are irradiated with an atom beam or an ion beam. When an atom beam or an ion beam is used, a neutral atom beam of an inert gas of argon or the like or an ion beam of an inert gas can be used. It is also possible to activate the bonding surface by plasma irradiation or radical treatment. Such surface treatment facilitates formation of a bond between different kinds of materials even at a temperature of less than or equal to 400° C.

After the support substrate 107 and the single crystal semiconductor substrate 101 are bonded to each other with the insulating layer 104 interposed therebetween, it is preferable that one or both of heat treatment and pressure treatment be performed. Heat treatment or pressure treatment makes it possible to increase bonding strength between the support substrate 107 and the single crystal semiconductor substrate 101. The heat treatment is performed at a temperature less than or equal to the allowable temperature limit of the support substrate 107. In the pressure treatment, the support substrate 107 and the single crystal semiconductor substrate 101 are kept in a pressure container while a given pressure is applied to it. Alternatively, the support substrate 107 and the single crystal semiconductor substrate 101 are interposed between pressing plates made of ceramics or the like and a force of 10 kN to 20 kN is applied thereto by mechanical act. In that case, the support substrate 107 and the single crystal semiconductor substrate 101 are heated while being pressed, so that the bonding strength can be enhanced.

Figure 5A:
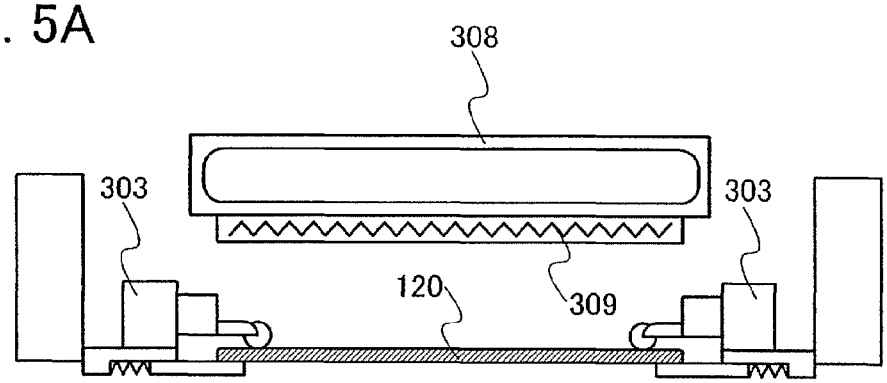
FIGS. 5A to 5C are schematic diagrams for illustrating an example of a structure of an apparatus for amounting a single crystal semiconductor substrate on a support substrate.
Figure 5B:
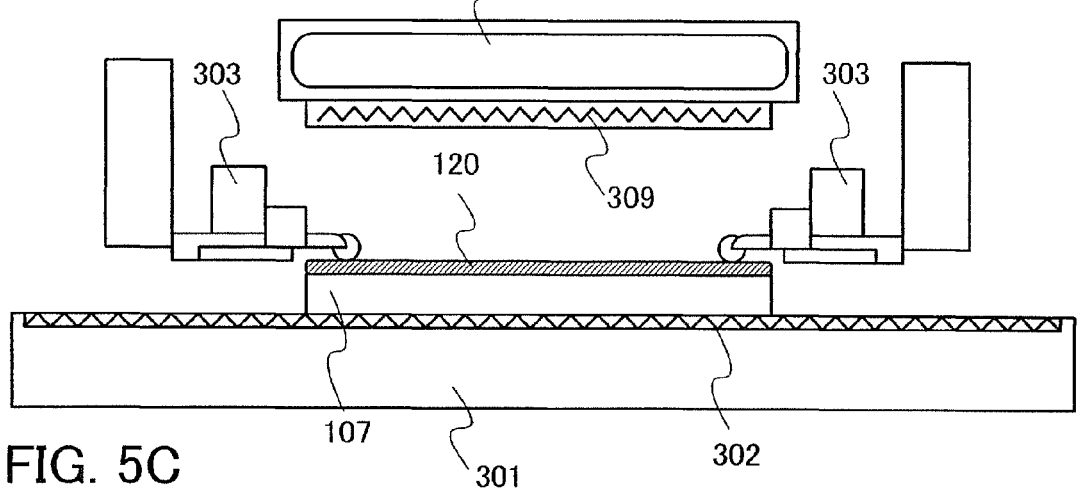
Figure 5C:
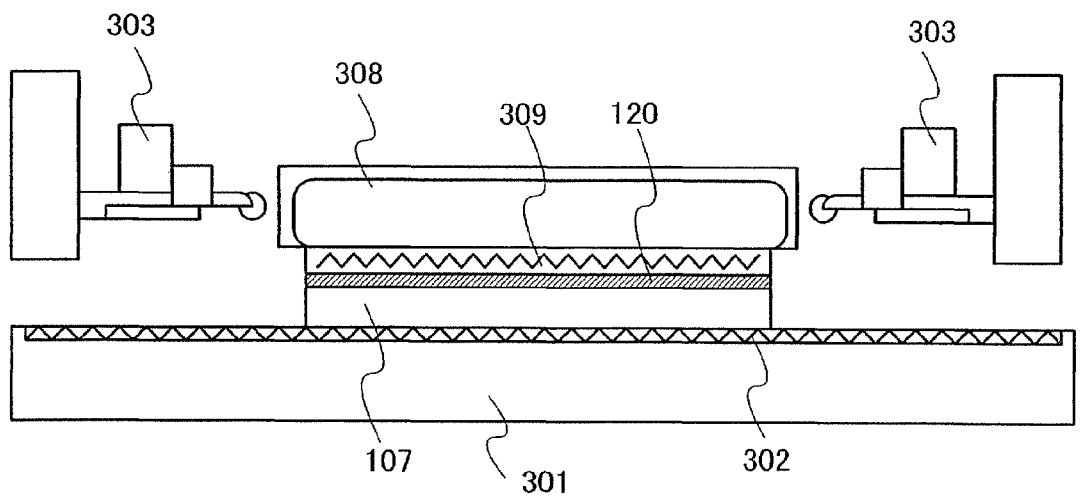

FIGS. 5A to 5C illustrate an example of an apparatus that with which the semiconductor substrate 120 is bonded to the support substrate 107, and bond or provisionally bond these substrates to each other by heat application and pressure. In FIG. 5A, the support substrate 107 is on a substrate stage 301. Further, the semiconductor substrate 120 is provided so that the insulating layer 104 faces the support substrate 107 side. The semiconductor substrate 120 is carried by a transfer means 303 above the support substrate 107 and its position is adjusted so as to be attached to a given position. Then, as shown in FIG. 5B, the transfer means 303 comes close to the substrate stage 301 and put the semiconductor substrate 120 on the support substrate 107. The semiconductor substrate 120 is attached by pressure with a pushpin (not shown) of the transfer means 303 and a position to be bonded is fixed. After that, as shown in FIG. 5C, a pressure means 308 provided with a heater 309 moves and push and pressure the semiconductor substrate 120 on the substrate stage 301. Keeping this state, the semiconductor substrate 120 and the support substrate 107 are heated by the heater 309 of the pressure means 308 and a heater 302 of the substrate stage 301 so that bonding strength of these substrates are enhanced.

Figure 6A:
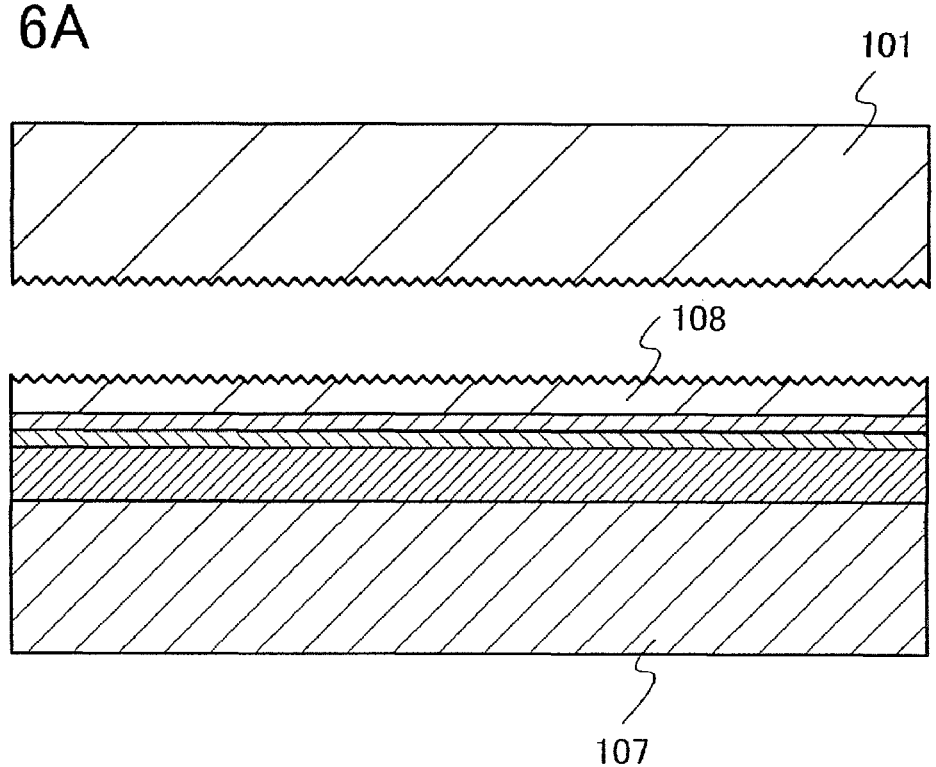
FIGS. 6A and 6B illustrate a method for manufacturing the SOI substrate in accordance with the present invention.

Heat treatment is performed on the single crystal semiconductor substrate 101 to separate the single crystal semiconductor substrate 101 at the damage region 103 (see FIG. 6A). The heat treatment is preferably performed at a temperature greater than or equal to the temperature at which the insulating layer 104 is formed and less than or equal to the allowable temperature limit of the support substrate 107. By heat treatment at 400° C. to 700° C., for example, a change occurs in the volume of microvoids formed in the damage region 103, so that the single crystal semiconductor substrate 101 is separated at the damage region 103. Since the insulating layer 104 is bonded to the support substrate 107, a single crystal semiconductor layer 108 separated from the single crystal semiconductor substrate 101 is bonded to the support substrate 107. The single crystal semiconductor layer 108 having the same crystal structure and crystal orientation as the single crystal semiconductor substrate 101 remains over the support substrate 107.

Heat treatment in a temperature range of 400° C. to 700° C. may be continuously performed with the same apparatus as the above heat treatment for improving the bonding strength or with another apparatus. For example, after heat treatment in a furnace at 200° C. for two hours, the temperature is increased to near 600° C. and held for two hours, the temperature is decreased to a temperature ranging from 400° C. to a room temperature, and then the single crystal semiconductor substrate and the support substrate are taken out of the furnace. Alternatively, heat treatment may be performed with a temperature increasing from room temperature. Further alternatively, heat treatment may be performed in a furnace at 200° C. for two hours, and then, heat treatment may be performed in a temperature range of 600° C. to 700° C. with a rapid thermal annealing (RTA) apparatus for 1 minute to 30 minutes (e.g., at 600° C. for seven minutes, or at 650° C. for seven minutes).

By heat treatment in a temperature range of 400° C. to 700° C., bond between the insulating layer and the support substrate shifts from hydrogen bond to covalent bond, and hydrogen atoms added to the damage region are separated and pressure rises; thus, the semiconductor layer can be separated from the single crystal semiconductor substrate at the damage region. After the heat treatment, the support substrate and the semiconductor substrate 120 are in a state where one of the support substrate and the single crystal semiconductor substrate is provided over the other, and the support substrate and the single crystal semiconductor substrate can be separated from each other without application of large force. For example, a substrate provided over the other is lifted by a vacuum chuck, so that the substrate can be easily separated. At this time, if a substrate on a lower side is fixed with a vacuum chuck or a mechanical chuck, both the support substrate and the single crystal semiconductor substrate can be separated from each other without horizontal deviation.

In a step of bonding the single crystal semiconductor substrate 101 in FIG. 4B and the support substrate 107 together, minute foreign matter (dust, an abrasive remaining on the surface of a glass substrate, or the like) is attached to the adhesion interface between the insulating layer 104 formed over the single crystal semiconductor substrate 101 and the support substrate 107, which becomes a factor of increase in adhesion defects. Further, if bubbles are taken into part of the adhesion interface due to warpage or deflection of the support substrate, the possibility of occurrence of adhesion defect is increased. Still further, the single crystal semiconductor substrate 101 is chamfered and adhesion defect easily occurs on the peripheral portion of the single crystal semiconductor substrate, which is a problem.

Figure 6B:
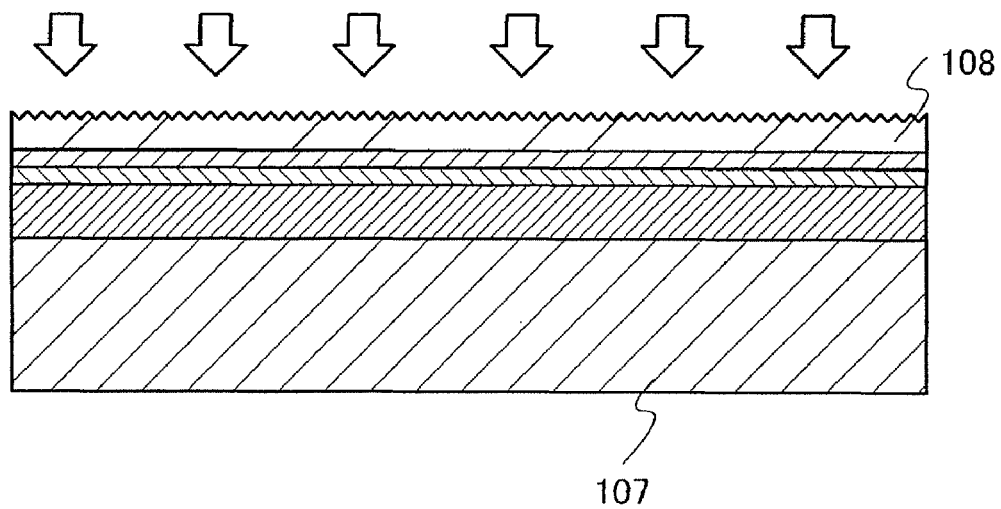

Then, in order to make the adhesion between the single crystal semiconductor layer 108 and the support substrate 107 stronger, pressure is applied to the single crystal semiconductor layer 108 bonded to the support substrate 107 (see FIG. 6B).

Pressure can be applied to the single crystal semiconductor layer 108 bonded to the support substrate 107 by a method such as vacuum press, hydraulic press, or pneumatic press. In this embodiment mode, a method of applying pressure to the single crystal semiconductor layer 108 bonded to the support substrate 107 by a vacuum press method will be described with reference to FIGS. 7A and 7B.

Figure 7A:
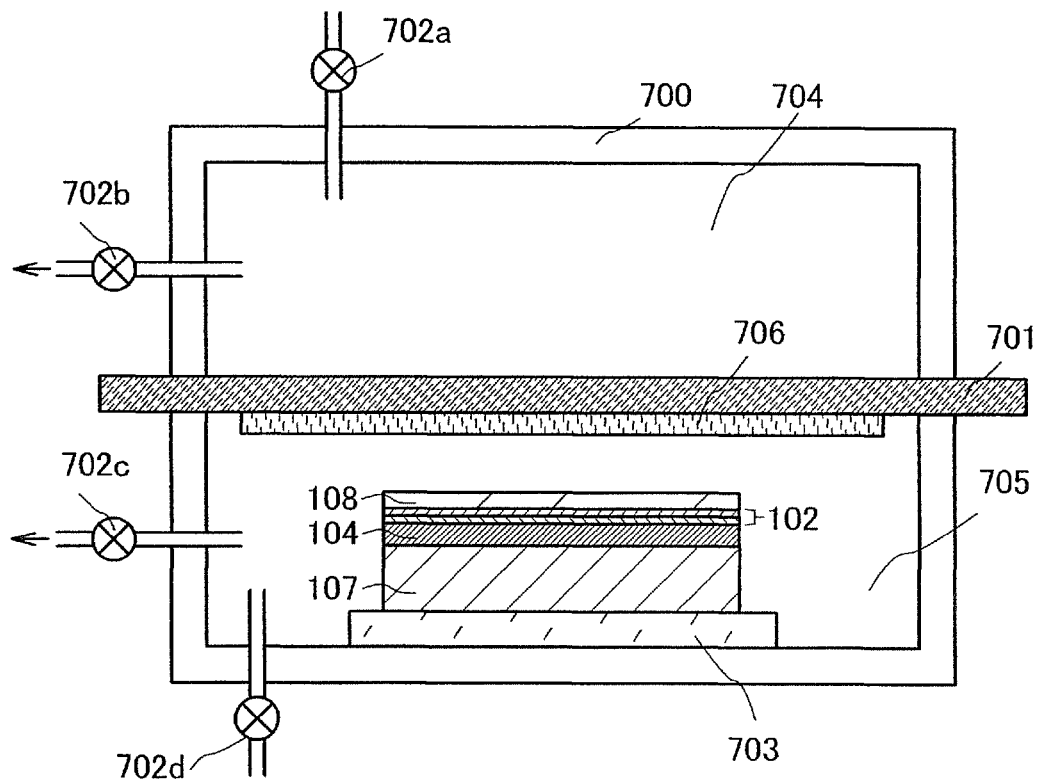
FIGS. 7A and 7B illustrate a structure example of an apparatus for pressing a single crystal semiconductor layer bonded to a support substrate.
Figure 7B:
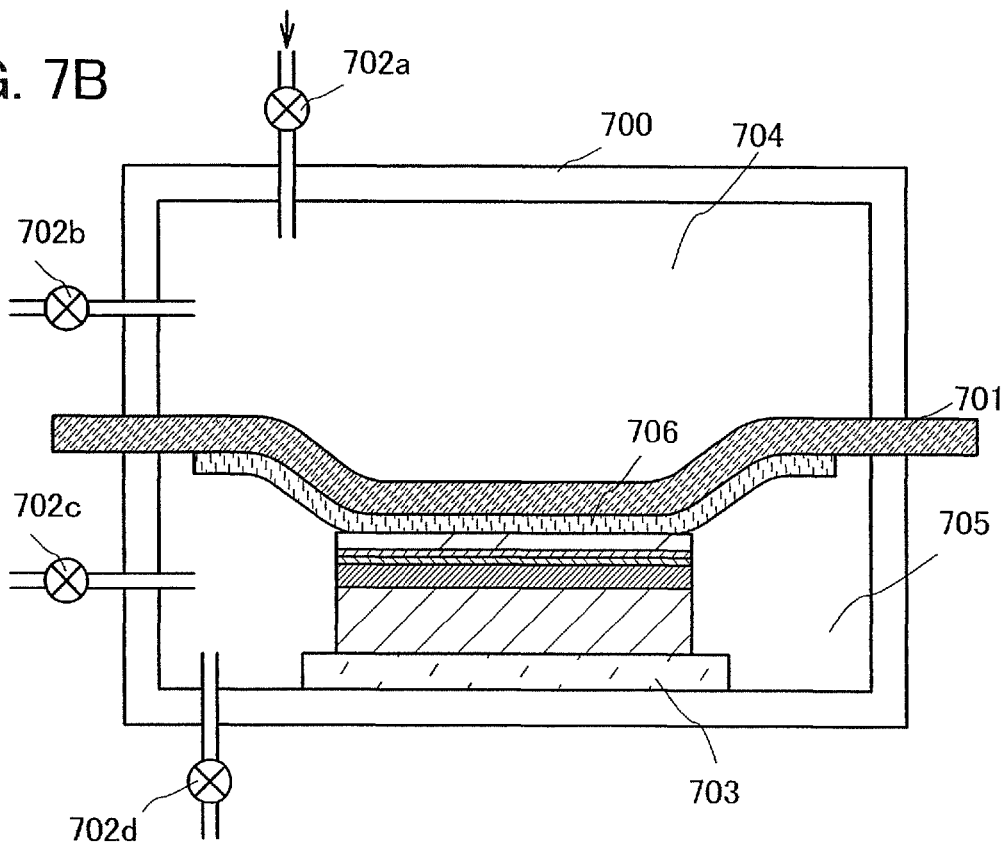

FIGS. 7A and 7B show a chamber 700 which is separated to a pressure chamber 704 and a sample chamber 705 by a diaphragm 701, and the sample chamber 705 includes a heater 703 that can heat a sample. In the chamber 700, an exhaust valve 702c and an air supply valve 702d for controlling the pressure in the sample chamber 705, and an exhaust valve 702b and an air supply valve 702a for controlling the pressure in the pressure chamber 704 are provided. Further, a cushion 706 is provided on the sample chamber 705 side of the diaphragm 701. The cushion 706 is formed of an elastic material, for example, a network polymer material such as natural rubber or synthetic rubber, or a chain synthetic polymer material such as resin or plastics. The support substrate 107 including the insulating layer 104, the insulating layer 102, and the single crystal semiconductor layer 108 is provided over the heater 703 of the sample chamber 705.

As shown in FIG. 7A, the air supply valves 702a and 702d are closed, and air is exhausted from the exhaust valves 702b and 702c, so that pressures in the pressure chamber 704 and the sample chamber 705 are reduced to the same level. Next, as shown in FIG. 7B, the exhaust valves 702b and 702c are closed, and the air supply valve 702a is opened with the air supply valve 702d closed, so that the pressure chamber 704 is exposed to an atmosphere and the pressure of the pressure chamber 704 is changed from a reduced pressure to an atmospheric pressure. Since the sample chamber 705 has a reduced pressure, the diaphragm 701 is dented toward the sample chamber 705 as shown in FIG. 7B; accordingly, the diaphragm 701 can press the support substrate 107 provided with the insulating layer 104, the insulating layer 102, and the single crystal semiconductor layer 108, which is a sample. When heating is conducted with the heater 703 in pressing, heat treatment can be conducted in a pressure state. The heat treatment temperature at the time of applying pressure is room temperature or more to 300° C. or less, preferably 100° C. or more to 200° C. or less. After that, the air supply valve 702d is opened, and the pressure of the sample chamber 705 is changed from the reduced pressure to an atmospheric pressure. Then, the support substrate 107 provided with the insulating layer 104, the insulating layer 102, and the single crystal semiconductor layer 108, which is a sample, can be taken out.

Figure 8A:
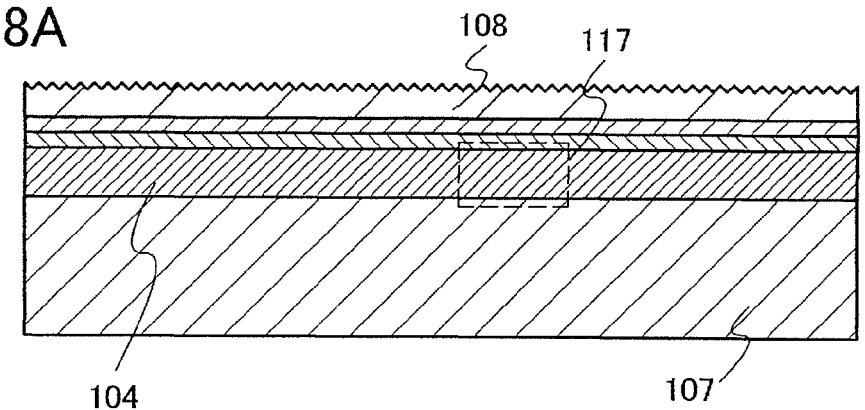
FIGS. 8A to 8C illustrate a method for manufacturing an SOI substrate in accordance with the present invention.
Figure 8B:
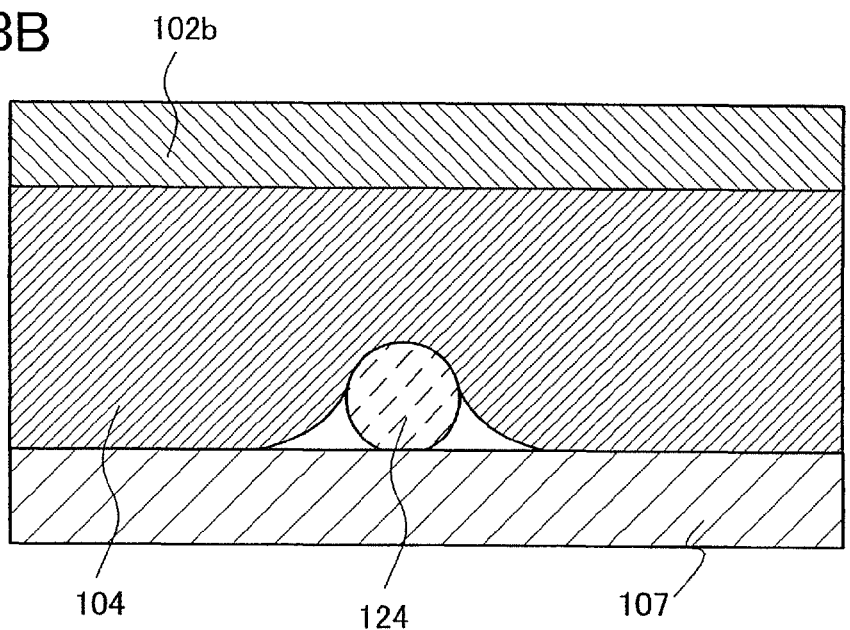
Figure 8C:
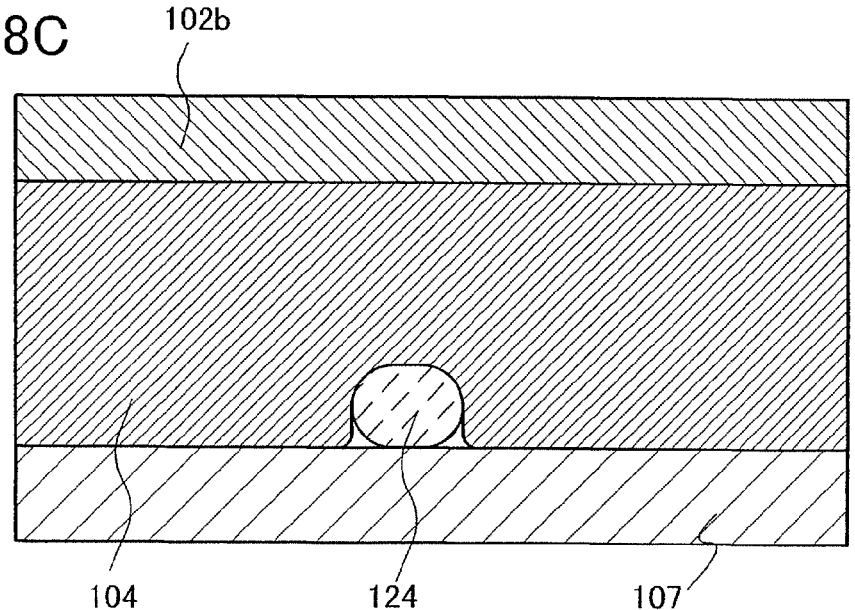

FIG. 8A illustrates a state before applying pressure to the single crystal semiconductor layer 108 bonded to the support substrate 107. FIG. 8B is a magnified drawing of an adhesion interface 117 between the insulating layer 104 formed over the single crystal semiconductor substrate 101 and the support substrate. Minute foreign matter 124 is attached to the adhesion interface between the insulating layer 104 and the support substrate 107 formed over the single crystal semiconductor substrate 101 to cause adhesion defects. Further, if bubbles are taken into part of the adhesion interface due to warpage or deflection of the support substrate, adhesion defects are increased (not shown). When such adhesion defects are increased, bonding strength is reduced and the possibility of peeling of the single crystal semiconductor layer 108 is increased. Even in such a case, when pressure is applied to the single crystal semiconductor layer 108 bonded to the support substrate 107, minute foreign matter 124 is embedded into the insulating layer 104 as shown in FIG. 8C; thus, the adhesion area is increased and the bonding strength can be increased. Further, in the case where the thickness of the insulating layer 104 is 500 nm or more to 1000 nm or less, the minute foreign matter 124 can be embedded without problems even if the grain diameter of the minute foreign matter 124 is 200 nm or more to 300 nm or less; the adhesion area can be increased; and the bonding strength can be increased.

Figure 9A:
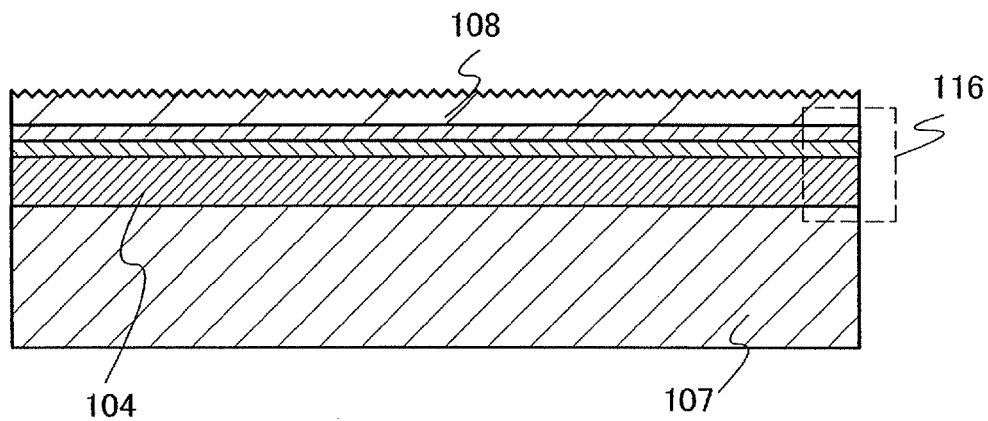
FIGS. 9A to 9C illustrate a method for manufacturing an SOI substrate in accordance with the present invention.
Figure 9B:
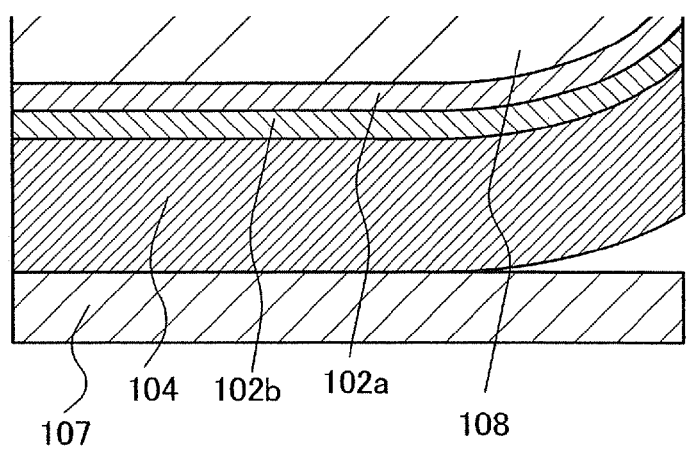
Figure 9C:
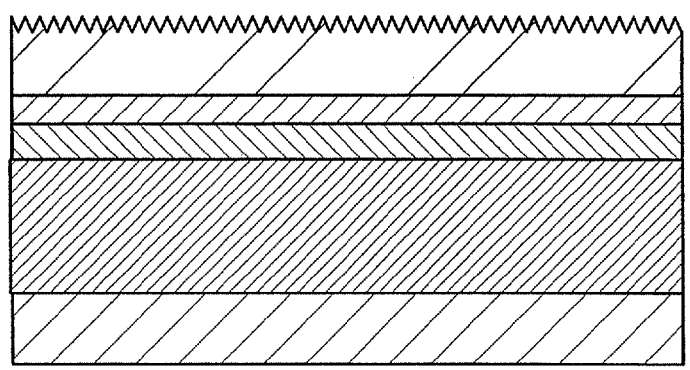

Further, as shown in FIG. 9B, an end portion 116 of the single crystal semiconductor substrate 101 is rounded by a chamfering process, so that there is a region where sufficient bond is not made with the support substrate 107. Even in such a case, when pressure is applied to the single crystal semiconductor layer 108 bonded to the support substrate 107, as shown in FIG. 9C, sufficient bonding can be performed at an end portion of the single crystal semiconductor layer 108, and the adhesion area can be increased. Note that FIG. 9A illustrates a state before applying pressure to the single crystal semiconductor layer 108 bonded to the support substrate 107.

As described above, pressure is applied to the single crystal semiconductor layer 108 bonded to the support substrate 107; thus, adhesion defects between the single crystal semiconductor layer 108 and the support substrate 107 are reduced and bonding strength can be increased.

Next, crystal defects remaining on the surface of the single crystal semiconductor layer 108 bonded to the support substrate 107 are removed by dry etching or wet etching. Defects due to the ion addition step for forming the damage region 103 or the separation step exist on the surface of the single crystal semiconductor layer 108 shown in FIG. 8A and FIG. 9A, and the defects damage the planarity of the surface of the single crystal semiconductor layer 108. It is difficult to form a gate insulating layer which is thin and has high withstand voltage on such a surface of the single crystal semiconductor layer 108 whose planarity is damaged. In the case where defects exist at the single crystal semiconductor layer 108, the performance and reliability of the transistor are adversely affected; for example, the localized level density at the interface with the gate insulating layer is increased; thus, treatment for removing the defects of the single crystal semiconductor layer 108 is performed. Note that the uneven shape of the surface of the single crystal semiconductor layer 108 in FIG. 8A and FIG. 9A just shows characteristically that the surface is rough and has poor planarity, and the actual shape is not limited thereto.

Figure 10A:
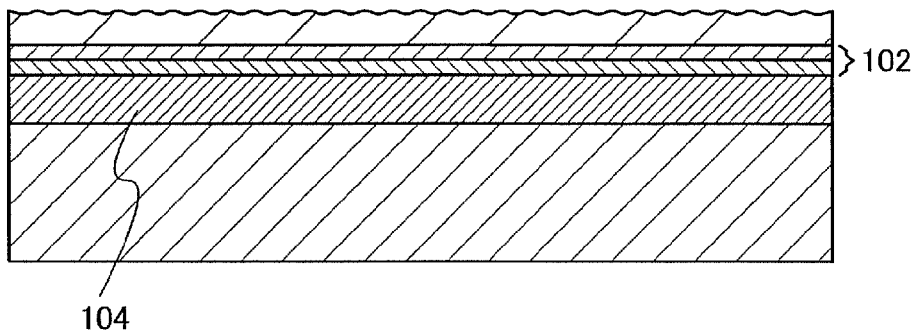
FIGS. 10A to 10D illustrate a method for manufacturing an SOI substrate in accordance with the present invention.

In order to remove defects existing on the surface of the single crystal semiconductor layer 108, dry etching or wet etching is performed on the surface of the single crystal semiconductor layer 108 (see FIG. 10A). In this embodiment mode, for example, a dry etching method such as reactive ion etching (RIE), ICP (inductively coupled plasma) etching, ECR (electron cyclotron resonance) etching, parallel plate (capacitively coupled plasma) etching, magnetron plasma etching, dual-frequency plasma etching, or helicon wave plasma etching is used.

A natural oxide film is formed on the surface of the single crystal semiconductor layer 108. When dry etching is performed on the single crystal semiconductor layer 108 on which the natural oxide film is formed, the thickness of the single crystal semiconductor layer 108 after the dry etching varies. The surface of the single crystal semiconductor layer 108 is processed with dilute hydrofluoric acid, and the natural oxide film is removed and a contaminant such as dust which is attached to the surface is also removed to clean the surface of the single crystal semiconductor layer 108. Then, a silicon oxide layer is formed over the cleaned single crystal semiconductor layer 108 (not shown). Chemical oxide can be used for the silicon oxide layer. For example, chemical oxide can be formed in such a manner that the surface of the single crystal semiconductor layer is processed with ozone-containing water.

Dry etching is performed on the single crystal semiconductor layer 108 on which the silicon oxide layer is formed. By removal of the surface of the single crystal semiconductor layer 108 by performing dry etching, defects formed on the surface of the single crystal semiconductor layer 108 can be removed, and thus surface roughness of the single crystal semiconductor layer 108 can be reduced. For example, when ICP etching is used, etching may be performed under the following conditions: the flow rate of chlorine, which is an etching gas: 40 sccm to 100 sccm; power applied to a coil type electrode: 100 W to 200 W; the power applied to a lower electrode (on the bias side): 40 W to 100 W; and the reaction pressure: 0.5 Pa to 1.0 Pa. For the etching gas, a chlorine-based gas such as chlorine, boron chloride, silicon chloride or carbon tetrachloride; a fluorine-based gas such as carbon tetrafluoride, sulfur fluoride, or nitrogen fluoride; or oxygen is used as appropriate. For example, when etching is performed under the following conditions: a flow rate of chlorine, which is an etching gas, of 100 sccm, reaction pressure of 1.0 Pa, a temperature of the lower electrode of 70° C., RF (13.56 MHz) power applied to the coil electrode of 150 W, power applied to the lower electrode (on the bias side) of 40 W, the thickness of the single crystal semiconductor layer 108 can be reduced to about 50 nm to 60 nm. The size and depth of the defect of the single crystal semiconductor layer results from the amount of energy or the dose of addition of ions. Thus, the thickness of the single crystal semiconductor layer to be removed by dry etching may be set as appropriate depending on the thickness of the single crystal semiconductor layer 108 before dry etching and surface roughness thereof.

The dry etching shown in FIG. 10A can be performed as follows: a flow rate of chlorine, which is an etching gas, of 100 sccm, power applied to the coil type electrode of 150 W, power applied to the lower electrode (on the bias side) of 40 W, reaction pressure of 1.0 Pa to remove the single crystal semiconductor layer 108 to about 95 nm.

Further, in the case of eliminating defects formed at the semiconductor layer surface using wet etching, an aqueous solution of 2.38% of tetramethylammonium hydroxide (TMAH) or the like can be used as an etchant. Using the TMAH solution at 0.0238 wt % to 0.0476 wt %, the single crystal semiconductor layer 108 can be thinned to a thickness of approximately 50 nm to 60 nm. Note that the thickness of the single crystal semiconductor layer 108 to be removed by wet etching may be set as appropriate in accordance with the thickness and the surface roughness of the single crystal semiconductor layer 108 before wet etching.

The surface of the single crystal semiconductor layer bonded to the support substrate by separating the single crystal semiconductor substrate is etched by dry etching or wet etching; thus, the defects generated in the ion addition step or the separation step can be removed and the surface roughness of the single crystal semiconductor layer can be reduced.

Further, the single crystal semiconductor layer 108 can be thinned to a thickness which is most suitable for a semiconductor element to be formed later by the dry etching or wet etching.

Figure 10B:
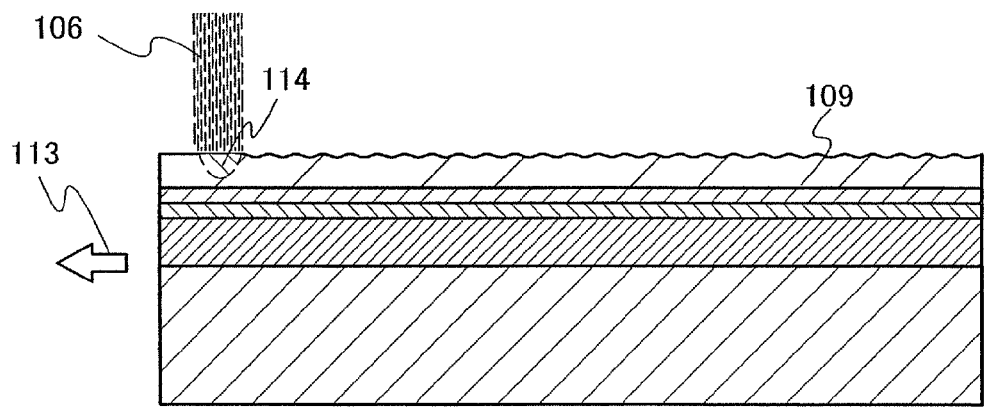

Note that crystal defects are formed due to formation of the damage region 103 and separation at the damage region 103 in a single crystal semiconductor layer 109 bonded to the support substrate 107. In order to reduce the crystal defects and recover crystallinity in the single crystal semiconductor layer 109, as illustrated in FIG. 10B, the single crystal semiconductor layer 109 is irradiated with a laser beam 106.

As indicated by an arrow 113, the surface of the single crystal semiconductor layer 108 is irradiated with a laser beam 106 in such a manner that the single crystal semiconductor layer 108 is scanned with the laser beam 106 while the support substrate 107 is moved. By irradiation with the laser beam 106, part of the single crystal semiconductor layer 108 or the entire layer in the depth direction is melted. When the single crystal semiconductor layer is melted, planarity is increased by an effect of surface tension. FIG. 10B schematically illustrates the state in which part of the single crystal semiconductor layer is melted, and at least part of a part 114, which is surrounded by a dotted line exceeds 1410° C. which is the melting point of silicon to be in a liquid phase.

By irradiation with the laser beam 106, a region of the single crystal semiconductor layer 109 which is irradiated with the laser beam is partially melted or completely melted. Note that a state in which the single crystal semiconductor layer 109 is completely melted refers to a state in which the whole layer, which is from the top surface to bottom surface of the layer, is melted. As for a layered structure of FIG. 10B, a state in which the single crystal semiconductor layer is completely melted refers to a state in which the single crystal semiconductor layer 109, from the top surface thereof to the interface with the insulating layer 102, is melted to be in a liquid state. On the other hand, partial melting of the single crystal semiconductor layer 109 refers to melting in such a manner that the depth to which the single crystal semiconductor layer 109 is melted is shallower than the interface with the insulating layer 102 (the thickness of the single crystal semiconductor layer 109). That is, a state in which the single crystal semiconductor layer 109 is partially melted refers to a state in which an upper layer of the single crystal semiconductor layer 109 is melted to become a liquid phase and a bottom layer thereof is not melted to remain a single crystal semiconductor in a solid phase.

A region is scanned with the laser beam 106 while being completely melted by irradiation with the laser beam 106, so that crystal growth can occur from a single crystal semiconductor which is adjacent to the melted region, and horizontal growth occurs. A part which is not melted is a single crystal and crystal orientations are aligned; thus, crystal boundaries are not formed, and a single crystal semiconductor layer 110 after the laser beam irradiation can be a single crystal semiconductor layer without crystal boundaries. Moreover, the completely melted region is recrystallized by solidification, and a single crystal semiconductor which is adjacent to the completely melted region and which is not melted and a single crystal semiconductor in which crystal orientations are aligned are formed. Thus, in the case of using single crystal silicon whose surface orientation of a main surface is (100) for the single crystal semiconductor substrate 101, the surface orientation of a main surface of the single crystal semiconductor layer 110 is (100), and the surface orientation of a main surface of the single crystal semiconductor layer 110 which is completely melted by laser beam irradiation and recrystallized is (100).

The single crystal semiconductor layer 109 is partially or completely melted by irradiation with the laser beam 106; thus, the single crystal semiconductor layer 110 whose surface is flat can be formed. Since the part of the single crystal semiconductor layer 109 which is melted is liquid, the part is modified by an effect of surface tension so that the surface area thereof becomes smallest. In other words, the liquid part is modified so that concavity and convexity are removed, and this liquid part is solidified to be recrystallized; thus, the single crystal semiconductor layer 110 whose surface is planarized can be formed.

Figure 10C:
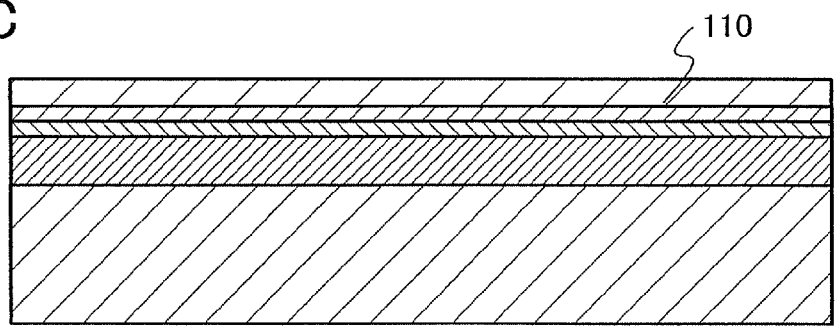

After melting, the single crystal semiconductor layer 109 is cooled and solidified, so that the single crystal semiconductor layer 110 whose upper surface is further planarized and which is recrystallized can be formed as shown in FIG. 10C. Laser beam irradiation makes it possible to reduce distortion of the single crystal semiconductor layer 110. Note that improvement in the crystallinity of the single crystal semiconductor layer 110 by the laser beam 106 can be confirmed from Raman shift obtained from Raman spectroscopy, a full width at half maximum, or the like. In addition, improvement in the planarity of the single crystal semiconductor layer 110 can be confirmed with an atomic force microscope or the like.

Since the laser beam 106 is used in this laser beam irradiation step, increase in the temperature of the support substrate 107 can be suppressed. Thus, a substrate whose allowable temperature limit is low, such as a glass substrate, can be used as the support substrate 107.

A laser of the laser beam 106 having oscillation wavelengths in a range of from ultraviolet light to a visible light region is used. The wavelength of the laser beam 106 is a wavelength that is absorbed by the semiconductor layer 109. The wavelength can be determined in consideration of the skin depth of the laser beam, or the like. For example, the wavelength can be in the range of greater than or equal to 190 nm and less than or equal to 700 nm.

The laser can be a continuous wave laser, a pseudo continuous wave laser, or a pulsed laser. A pulsed laser is preferable in the case of partial melting. For example, the following lasers can be used: a pulsed laser which can emit a laser beam having a repetition rate of less than or equal to 1 MHz and a pulse width of greater than or equal to 10 nanosecond and less than or equal to 500 nanosecond and a XeCl excimer laser which can emit a laser beam having a repetition rate of 10 Hz to 300 Hz, a pulse width of 25 nanosecond, and a wavelength of 308 nm.

The energy of the laser beam 106 can be determined in consideration of a wavelength, the skin depth of the laser beam 106, and the like. The energy of the laser beam 106 can be, for example, in the range of greater than or equal to 300 mJ/cm$^2$ and less than or equal to 800 mJ/cm$^2$. For example, when the thickness of the semiconductor layer 109 is approximately 120 nm, a pulsed laser is used as a laser and the wavelength of the laser beam 106 is 308 nm, energy density of the laser beam 106 can be 600 mJ/cm$^2$ to 700 mJ/cm$^2$.

Irradiation with the laser beam 106 is preferably performed in an inert atmosphere such as a nitrogen atmosphere or a rare gas atmosphere, or in a vacuum state. In order to perform irradiation with the laser beam 106 in an inert atmosphere, irradiation with the laser beam may be performed in an airtight chamber while the atmosphere in the chamber is controlled. When the chamber is not used, by blowing of an inert gas such as a nitrogen gas to the surface irradiated with the laser beam 106, irradiation with the laser beam 106 in the inert atmosphere can be realized.

An inert atmosphere such as nitrogen or a vacuum state has higher effect of improving planarity of the semiconductor layer 109 than an air atmosphere, and an inert atmosphere or a vacuum state is more effective in suppressing generation of cracks and ridges than an air atmosphere, the applicable energy range for the laser beam 106 is widened.

It is preferable to make energy distribution of the laser beam 106 uniform and make a shape of the cross section linear by an optical system. Thus, irradiation with the laser beam 106 can be performed uniformly with high throughput. A beam length of the laser beam 106 is made longer than one side of the support substrate 107; thus, the whole single crystal semiconductor layer 109 which is bonded to the support substrate 107 can be irradiated with the laser beam by scanning at a time. The beam length of the laser beam 106 may be a length such that the whole single crystal semiconductor layer 109 bonded to the support substrate 107 can be irradiated with the laser beam 106 by scanning plural times, when it is shorter than one side of the support substrate 107.

Note that before irradiating the single crystal semiconductor layer 109 with the laser beam 106, treatment for removing an oxide film such as a natural oxide film which is formed on the surface of the single crystal semiconductor layer 109 is performed. The reason why the oxide film is removed is that effect of planarization cannot be sufficiently obtained when irradiation with the laser beam 106 is performed in a state where the oxide film remains on the surface of the single crystal semiconductor layer 109. The oxide film can be removed by treatment of the single crystal semiconductor layer 109 with hydrofluoric acid. The treatment with hydrofluoric acid is preferably performed until the surface of the semiconductor layer 109 exhibits a water-repellent property. It can be confirmed, from the single crystal semiconductor layer 109 exhibiting a water-repellent property, that the oxide film is removed from the single crystal semiconductor layer 109.

A step of irradiation with the laser beam 106 in FIG. 10B can be performed as follows: first, the single crystal semiconductor layer 109 is processed with a hydrofluoric acid solution which is diluted to $\frac{1}{100}$ for 110 seconds to remove the oxide film over the surface of the semiconductor layer 109; as the laser of the laser beam 106, a XeCl excimer laser (with a wavelength of 308 nm, a pulse width of 25 nanoseconds, and repetition rate of 60 Hz) is used; the cross section of the laser beam 106 is shaped into a linear form of 300 mm×0.34 mm by an optical system; the scanning speed of the laser beam 106 is 2.0 mm/sec; scanning pitch is 33 μm; and the number of beam shots is approximately 10. Scanning with the laser beam 106 is performed with a nitrogen gas blown to the surface which is irradiated. When the support substrate 107 is 730 mm×920 mm, since the beam length of the laser beam 106 is 300 mm, a region which is irradiated with the laser beam 106 is divided into three parts; thus, the whole single crystal semiconductor layer 109 bonded to the support substrate 107 can be irradiated with laser beam 106.

The single crystal semiconductor layer 109 is irradiated with the laser beam as described above, part or the whole of the single crystal semiconductor layer 109 is melted and recrystallized, so that a better single crystal semiconductor layer can be obtained. Accordingly, defects caused by addition of ions can be reduced, and a single crystal semiconductor layer whose crystallinity is recovered can be obtained. Moreover, dry etching is performed before laser beam irradiation, so that the single crystal semiconductor layer can be prevented from including defects or damage at the time of being melted.

The single crystal semiconductor layer 109 is recrystallized, so that a transistor with high on current and high field effect mobility can be manufactured using the single crystal semiconductor substrate 101. The single crystal semiconductor layer 109 is recrystallized by irradiation with the laser beam 106, and thus a single crystal can be formed by recrystallization of the single crystal semiconductor layer 109 without application of force which damages the support substrate 107 and without heating the support substrate 107 at a temperature exceeding its allowable temperature limit.

Moreover, the laser beam irradiation makes it possible to heat and cool down a surface of the support substrate in a short time; thus, increase in the temperature of the support substrate can be suppressed, and a substrate whose allowable temperature limit is low, such as a glass substrate, can be used as the support substrate. Thus, damage in the single crystal semiconductor layer due to the ion addition step can be sufficiently recovered.

In the case where the surface of the single crystal semiconductor layer 108 is removed by dry etching before irradiation with the laser beam 106, damage such as crystal defects is generated near the surface of the single crystal semiconductor layer 108 due to dry etching in some cases. However, irradiation with the laser beam 106 makes it possible to repair damage caused by dry etching.

A single crystal semiconductor substrate is separated along a damage region thereof and etching is performed on a single crystal semiconductor layer which is firmly bonded to a support substrate, so that crystal defects of a surface of the single crystal semiconductor layer can be removed and surface roughness of the single crystal semiconductor layer can be reduced. Moreover, since defects of the surface of the single crystal semiconductor layer are removed by dry etching, the single crystal semiconductor layer can be prevented from including the defects at the time of being melted by laser beam irradiation. Thus, a single crystal semiconductor layer whose crystal defects are reduced and which has high planarity can be obtained.

Next, by irradiation with the laser beam 106, an SOI substrate having the single crystal semiconductor layer 110 shown in FIG. 10C is formed. Treatment for reducing the thickness of the single crystal semiconductor layer 110 to the thickness which is optimal for a semiconductor element to be formed later is performed (see FIG. 10D).

In order to reduce the thickness of the single crystal semiconductor layer 110, either dry etching or wet etching, or a combination thereof may be performed. For example, in the case where the single crystal semiconductor substrate 101 is a silicon substrate, the thickness of the single crystal semiconductor layer 110 can be reduced by dry etching using $SF_6$ and $O_2$ as a process gas (see FIG. 10D).

By etching after the laser beam irradiation, an SOI substrate having a single crystal semiconductor layer with a thickness which is optimal for a semiconductor element can be manufactured. By this etching, the single crystal semiconductor layer is preferably thinned to a thickness of greater than or equal to 5 nm and less than or equal to 100 nm, more preferably greater than or equal to 5 nm and less than or equal to 50 nm. For example, when the thickness of the single crystal semiconductor layer bonded to the support substrate is 110 nm, wet etching is performed to thin the single crystal semiconductor layer by 15 nm and etching is performed after the laser beam irradiation; thus, the thickness of a single crystal semiconductor layer 111 can be 60 nm. Note that etching is not necessarily performed on the surface of the single crystal semiconductor layer 110 after irradiation with the laser beam 106. For example, when the thickness of the single crystal semiconductor layer bonded to the support substrate is 110 nm, dry etching before irradiation with the laser beam 106 can also be performed to thin the single crystal semiconductor layer to a thickness of 60 nm.

After irradiation with the laser beam 106, heat treatment is preferably performed on the semiconductor layer 111 at greater than or equal to 500° C. and less than or equal to 700° C. By this heat treatment, the defects of the semiconductor layer 111, which are not recovered by irradiation with the laser beam 106, can be eliminated and distortion of the semiconductor layer 111 can be relieved. A rapid thermal anneal (RTA) apparatus, a resistance heating furnace, or a microwave heating apparatus can be used for this heat treatment. As an RTA apparatus, a gas rapid thermal anneal (GRTA) apparatus or a lamp rapid thermal anneal (LRTA) apparatus can be used. For example, when a resistance heating furnace is used, heat treatment may be performed at 550° C. for four hours.

Figure 10D:
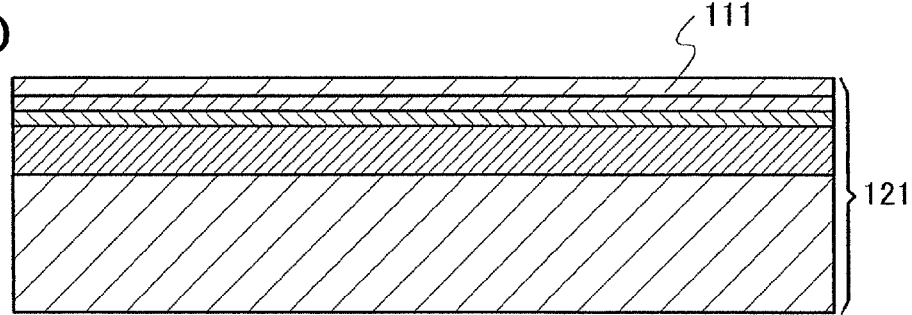

Through the above-described steps, an SOI substrate 121 shown in FIG. 10D can be manufactured.

As described above, in this embodiment mode, etching and laser beam irradiation are performed on the single crystal semiconductor layer bonded to the support substrate, so that an SOI substrate having the single crystal semiconductor layer with reduced crystal defects can be manufactured. Moreover, even when a substrate whose allowable temperature limit is low, such as a glass substrate, is used, an SOI substrate provided with a single crystal semiconductor layer which is sufficient for practical use can be manufactured.

Further, when a semiconductor element such as a transistor is manufactured using a single crystal semiconductor layer in accordance with this embodiment mode, the thickness of a gate insulating layer can be reduced and the localized interface state density with the gate insulating layer can be reduced. In addition, the thickness of the single crystal semiconductor layer is reduced, so that a transistor of complete depletion type with a small subthreshold value can be manufactured over the support substrate, with use of a single crystal semiconductor layer.

Figure 11:
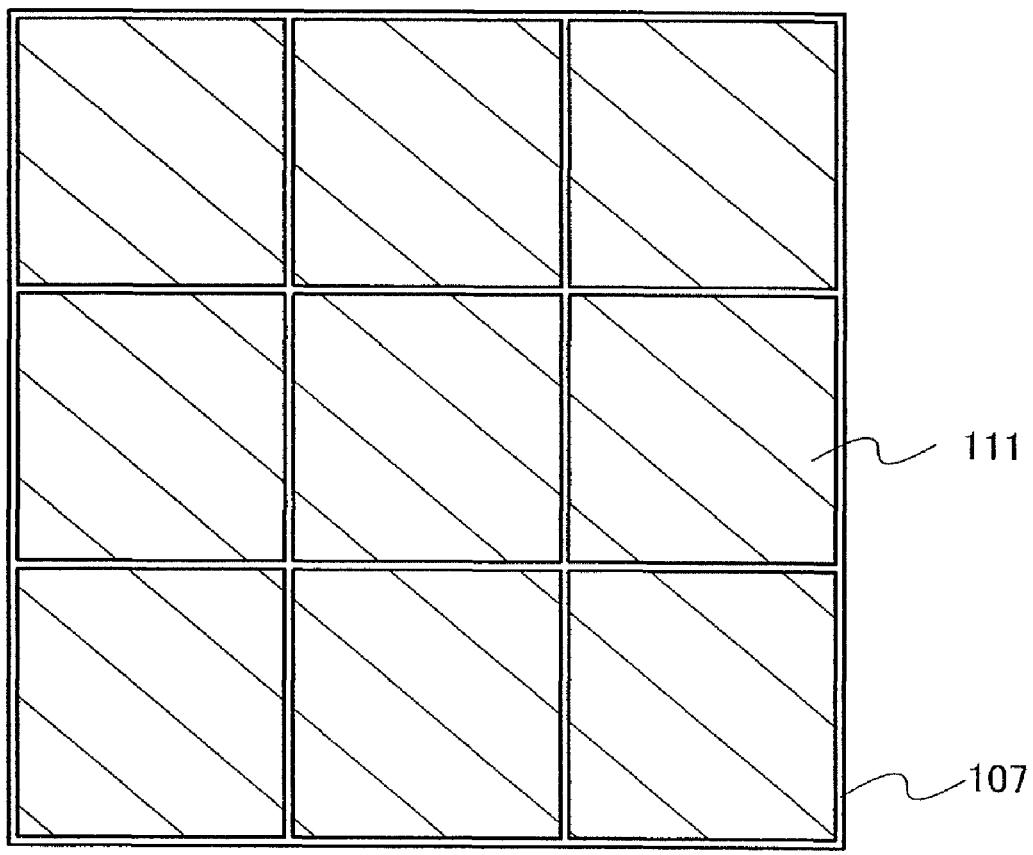
FIG. 11 illustrates an SOI substrate in accordance with the present invention.

Note that in order to achieve increase in size of the SOI substrate, a structure may be employed in which a plurality of single crystal semiconductor layers 111 are bonded to one support substrate 107. For example, through the steps described with reference to FIGS. 1A to 1B, a plurality of single crystal semiconductor substrate 101 in each of which the damage region 103 is formed are prepared. Next, through the bonding step in FIG. 4B, the plurality of single crystal semiconductor substrates 101 are temporarily bonded to one support substrate 107. Then, heat treatment in FIG. 6A is performed to separate each of the single crystal semiconductor substrates 101; thus, the plurality of single crystal semiconductor layers 111 are fixed to the support substrate 107. After that, through the steps shown in FIGS. 6B, 7A, 7B and 10B, the SOI substrate to which the plurality of single crystal semiconductor layers 111 are bonded can be manufactured (see FIG. 11).

In this embodiment mode, when a single crystal silicon substrate is used as the single crystal semiconductor substrate 101, single crystal silicon can be obtained as the single crystal semiconductor layer 111.

In a manufacturing method of an SOI substrate according to this embodiment mode, a process temperature can be less than or equal to 700° C.; thus, a glass substrate can be used as the support substrate 107. That is, the SOI substrate can be formed over a glass substrate similarly to a conventional thin film transistor and a single crystal silicon layer can be used for an active layer of TFT. These make it possible to form a transistor with high performance and high reliability in which high speed operation is possible and which can be driven with a low subthreshold value, high field effect mobility, and low consumption voltage can be manufactured over a support substrate such as a glass substrate. Therefore, a semiconductor device which has high performance and high reliability can be manufactured with high yield.

Since CMP treatment which is unsuitable for increase in area is not needed, increase in area of a semiconductor device having high performance can be realized. Needless to say, without limitation to the case of using a large substrate, even when a small substrate is used, a favorable semiconductor device can be provided.

Embodiment Mode 2

In this embodiment mode, a method for manufacturing an SOI substrate, which is different from that shown in Embodiment Mode 1 will be described with reference to FIGS. 12A to 12C. Hereinafter, the portions similar to those in Embodiment Mode 1 are denoted by the same reference numerals, and description thereof is omitted.

Figure 12A:
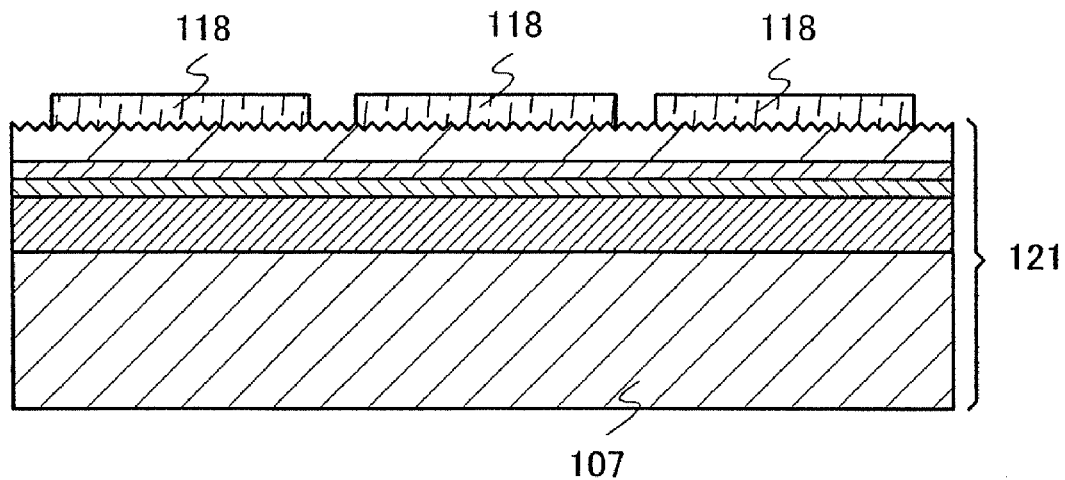
FIGS. 12A to 12C illustrate a method for manufacturing an SOI substrate in accordance with the present invention.

First, a substrate in which the single crystal semiconductor layer 108 is bonded to the support substrate 107 shown in FIG. 6A with an insulating layer therebetween is prepared, and a mask 118 for selectively removing the single crystal semiconductor layer 108 is formed over the single crystal semiconductor layer 108 (see FIG. 12A). Note that the mask 118 can be formed using a photolithography process or ink-jet printing. Here, the mask may have any shape, area, or the like; however, it is formed so that the single crystal semiconductor layer 108 can be processed into a desired shape, area, or the like.

Figure 12B:
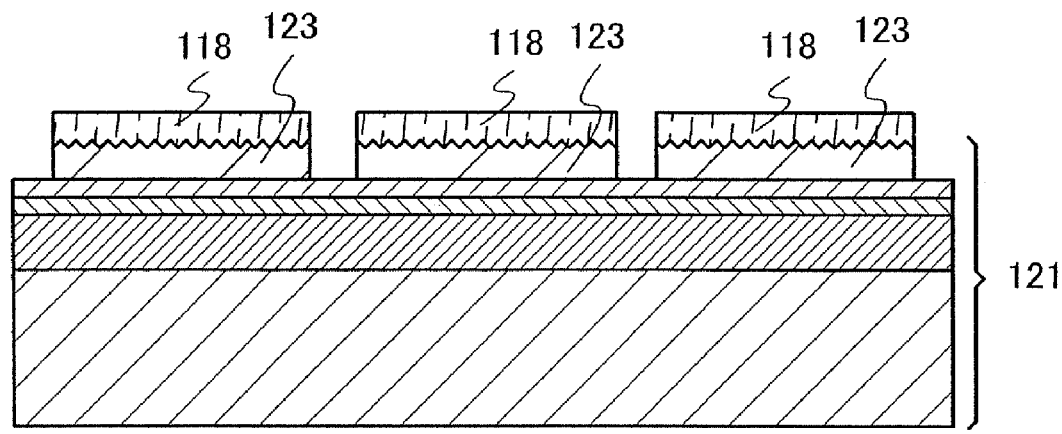

Next, the single crystal semiconductor layer 108 is selectively removed to form a plurality of single crystal semiconductor layers 123 (see FIG. 12B). The single crystal semiconductor layer 108 can be selectively removed by dry etching or wet etching. Dry etching is suitable for highly anisotropic etching and wet etching is suitable for highly isotropic etching. Here, each of the single crystal semiconductor layers 123 preferably has a size such that 1 to approximately $1 \times 10^4$ semiconductor elements (for example, transistors) can be manufactured. Specifically, the area would be approximately 1 $mm^2$ or more to 10000 $mm^2$ or less (preferably 25 $mm^2$ or more to 2500 $mm^2$ or less, more preferably, 100 $mm^2$ or more to 150 mm or less). Note that the interval between the single crystal semiconductor layers 123 can be determined at will.

When the single crystal semiconductor layer 108 is removed, the insulating layer 102 and the insulating layer 104 are preferably left without being removed. This is because when the insulating layer 102 and the insulating layer 104 are not removed, the insulating layer 102 serving as a barrier layer exists under the single crystal semiconductor layers 123; thus, impurity element (for example, alkali metal such as sodium or potassium, alkaline earth metal such as magnesium or calcium, a transition metal such as iron, copper, or nickel) contained in the support substrate 107 can be prevented from entering the single crystal semiconductor layer.

Figure 12C:
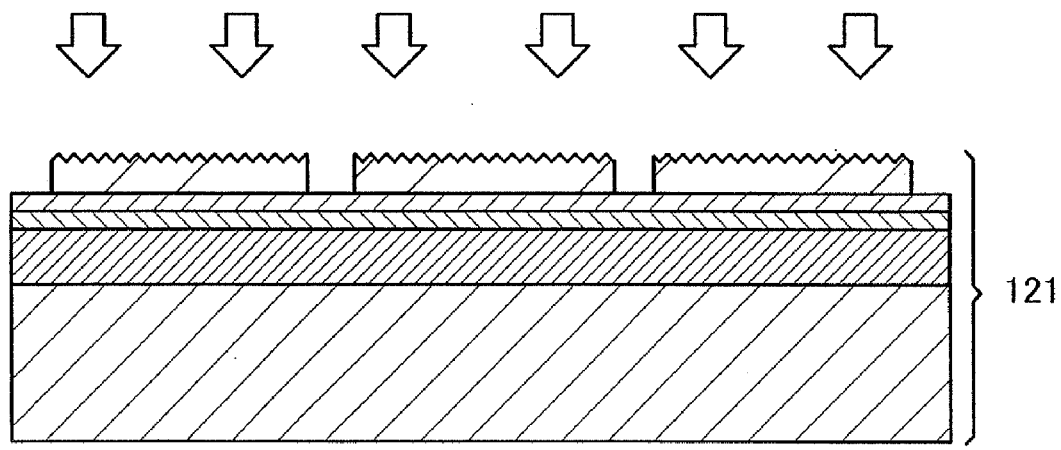

Next, the mask 118 is removed, and pressure is applied to the plurality of single crystal semiconductor layers 123 bonded to the support substrate 107 (see FIG. 12C). The single crystal semiconductor layers 123 can be pressed by a method such as vacuum press, hydraulic press, or pneumatic press which are mentioned in Embodiment Mode 1 (FIGS. 7A and 7B).

Thus, pressure is applied to the plurality of single crystal semiconductor layers 123 bonded to the support substrate 107; thus, even in the case where minute foreign matter is attached to the adhesion interface between the insulating layer 104 formed over the single crystal semiconductor substrate 101 and the support substrate 107, adhesion defects can be reduced, and bonding strength can be increased. Further, even in the case where bubbles are taken into part of the adhesion interface due to warpage or deflection of the support substrate, adhesion defects can be reduced and bonding strength can be increased.

This embodiment mode can be implemented in combination with any of the other embodiment modes as appropriate.

Embodiment Mode 3

In this embodiment mode, a method for manufacturing an SOI substrate, which is different from that shown in the above embodiment mode will be described with reference to FIGS. 13A to 13C and FIGS. 14A to 14C. Hereinafter, the portions similar to those in Embodiment Mode 1 are denoted by the same reference numerals, and description thereof is omitted.

Figure 13A:
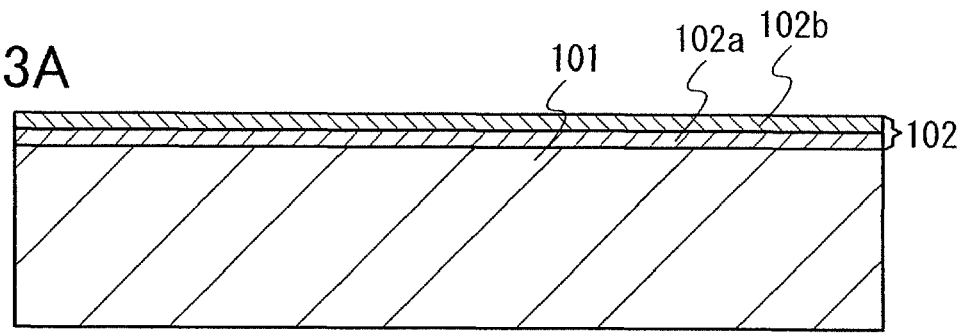
FIGS. 13A to 13D illustrate a method for manufacturing an SOI substrate in accordance with the present invention.
Figure 13B:
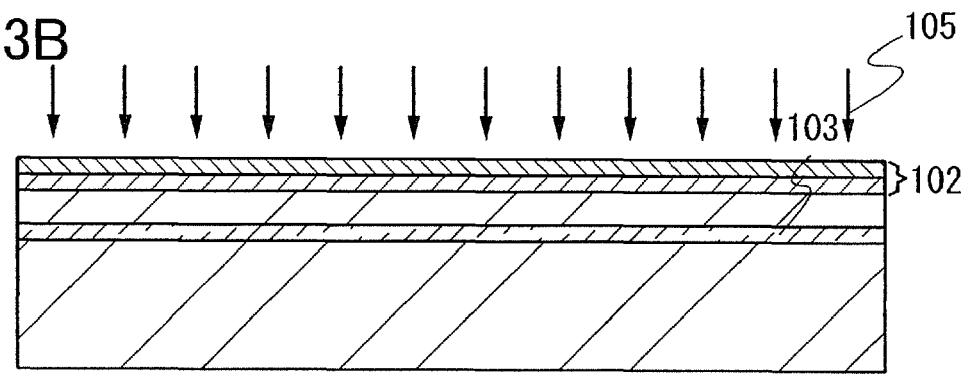
Figure 13C:
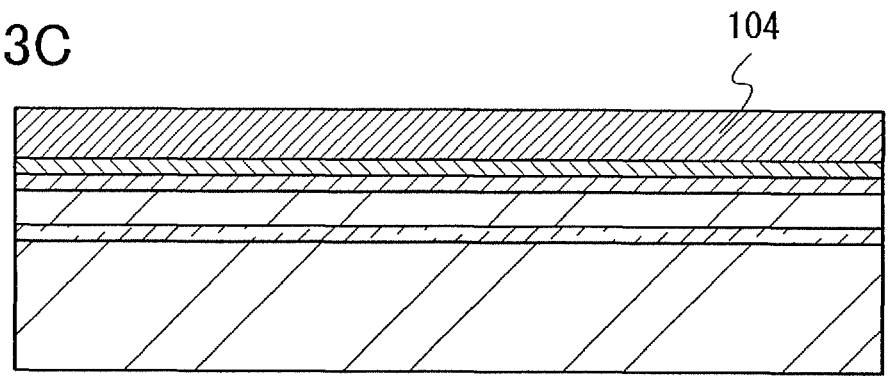

As shown in FIG. 13A, the insulating layer 102 including a silicon oxynitride layer 102a and a silicon nitride oxide layer 102b is formed over the single crystal semiconductor substrate 101. Next, as shown in FIG. 13B, through the insulating layer 102, the single crystal semiconductor substrate 101 is irradiated with an ion beam 105 including ions accelerated by an electric field, so that the ions are introduced into the single crystal semiconductor substrate 101; accordingly, a damage region 103 is formed in a region at a predetermined depth from one of surfaces of the single crystal semiconductor substrate 101. Then, as shown in FIG. 13C, the insulating layer 104 is formed over the single crystal semiconductor substrate 101 over the insulating layer 102. The insulating layer 104 can be formed to 10 nm or more to 1000 nm or less, and is preferably formed to 500 nm or more to 1000 nm or less.

Figure 13D:
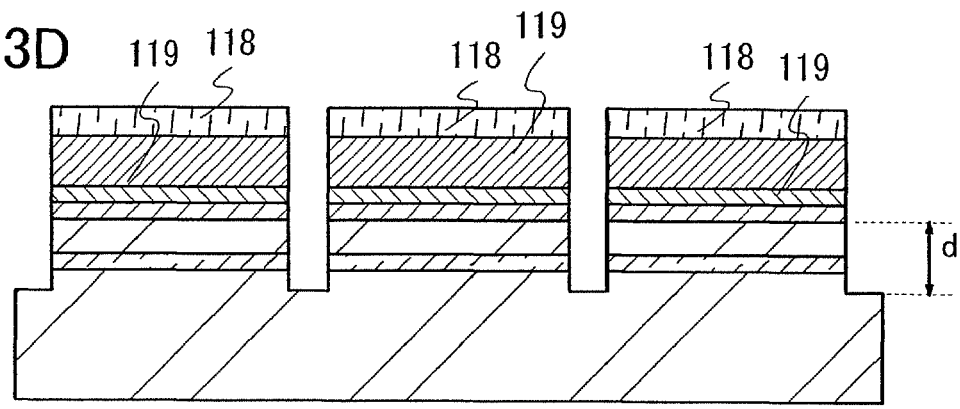

Next, as shown in FIG. 13D, selective etching is performed on the single crystal semiconductor substrate provided with the insulating layers to form openings, which are deeper than the damage region, in the insulating layers and the single crystal semiconductor substrate. In this embodiment mode, the insulating layer 102, the insulating layer 104, and the single crystal semiconductor substrate 101 are selectively removed by etching using the masks 118 to form openings each having a depth equal to or deeper than the damage region 103, in the insulating layer 102, the insulating layer 104, and the single crystal semiconductor substrate 101, so that the single crystal semiconductor substrate 101 having a plurality of projections 119 is formed.

In the single crystal semiconductor substrate 101, the width d of each of the plurality of projection 119 in a direction (a depth direction) perpendicular to the single crystal semiconductor substrate 101 is equal to or larger than the depth of the damage region 103. The width d of each of the plurality of projection 119 in the direction (the depth direction) perpendicular to the single crystal semiconductor substrate 101 is not necessarily constant and may have different values depending on the location. In specific, the width d may be set to be, for example, 10 nm or more, preferably 200 nm or more in consideration of the thickness of the single crystal semiconductor layer.

It is to be noted that the single crystal semiconductor substrate 101 warps, bends, or has a slightly rounded end in some cases. Moreover, when hydrogen or a rare gas, or hydrogen ions or rare gas ions are introduced in order to separate the single crystal semiconductor film from the single crystal semiconductor substrate 101, the introduction of the above gas or ions cannot be performed sufficiently at an end of the single crystal semiconductor substrate 101 in some cases. Accordingly, it is difficult to separate a part of the single crystal semiconductor layer that is located at the end of the single crystal semiconductor substrate 101. Therefore, the part located at the end of the single crystal semiconductor substrate 101 is desirably formed at a predetermined distance from a rim of the single crystal semiconductor substrate 101. When the projections 119 are formed at a predetermined distance from the rim of the single crystal semiconductor substrate 101, the formation of the single crystal semiconductor layers by separation can be performed in a highly reproducible manner. For example, the distance between the projection 119 closest to the end and the rim of the single crystal semiconductor substrate 101 is preferably several tens of micrometers to several tens of millimeters.

Figure 14A:
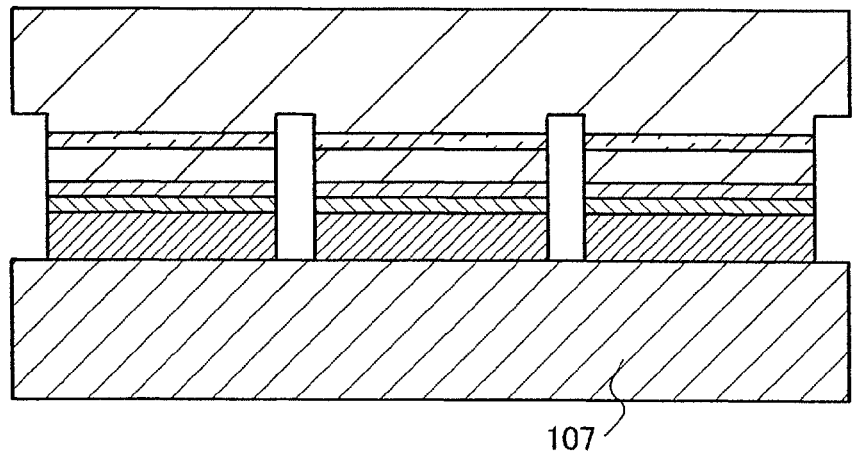
FIGS. 14A to 14C illustrate a method for manufacturing an SOI substrate in accordance with the present invention.

Next, the mask 118 is removed, and the single crystal semiconductor substrate 101 and the support substrate 107 are placed in close contact with each other so that the projections 119 face the support substrate 107 side, specifically in such a manner that the insulating layer 102 and the insulating layer 104 are interoposed therebetweeen as shown in FIG. 14A. The insulating layer 104 and the support substrate 107 are bonded at the projections 119, the single crystal semiconductor substrate 101 and the support substrate 107 can be bonded together.

Figure 14B:
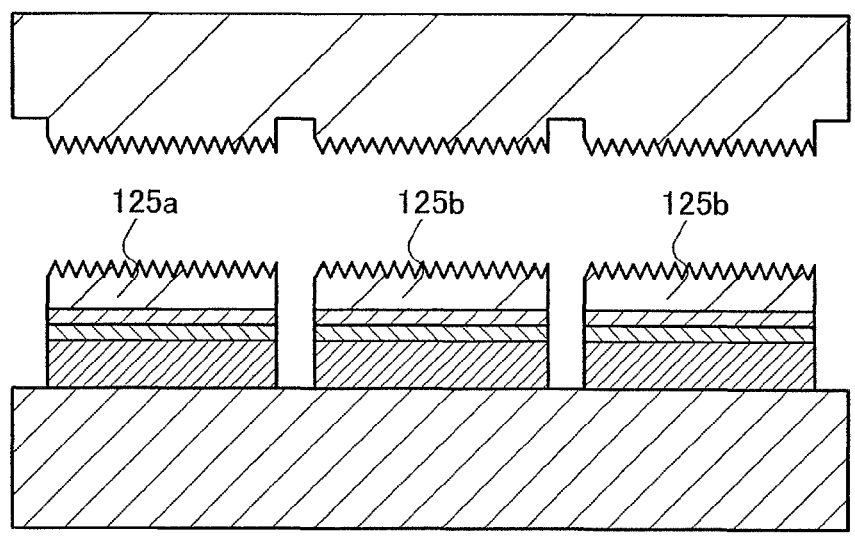
Figure 14C:
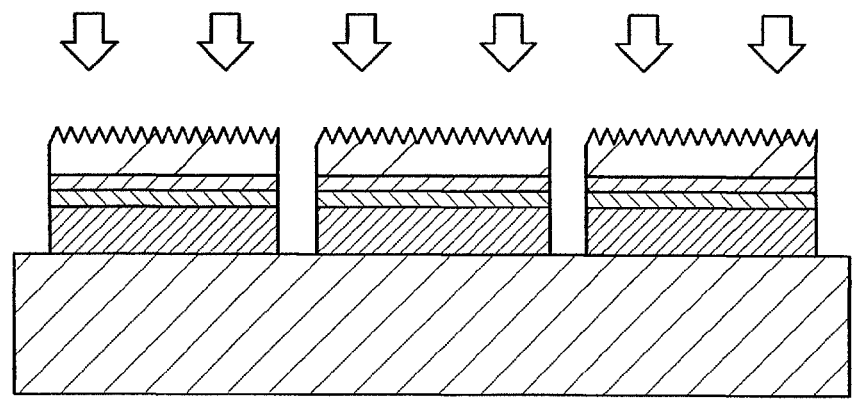

Heat treatment is performed after the single crystal semiconductor substrate 101 and the support substrate 107 are bonded to each other, and thereby adjacent microvoids in the damage region 103 are coupled, and the volume of the microvoids is increased. Consequently, as shown in FIG. 14B, in the damage region 103, the single crystal semiconductor substrate 101 is separated; thus, single crystal semiconductor layers which have been parts of the single crystal semiconductor substrate 101 are separated. The heat treatment is preferably performed at a temperature that is equal to or lower than the allowable temperature limit of the support substrate 107. For example, heat treatment may be performed at a temperature ranging from 400° C. to 600° C. With the separation, a plurality of single crystal semiconductor layers 125a, 125b, and 125c are bonded with the insulating layer 102 and the insulating layer 104 to the support substrate 107.

Then, pressure is applied to the plurality of single crystal semiconductor layers 125a, 125b, and 125 bonded to the support substrate 107. Pressure can be applied to the single crystal semiconductor layers 125a, 125b, and 125c by a method such as vacuum press, hydraulic press, or pneumatic press which are mentioned in Embodiment Mode 1 (FIGS. 7A and 7B).

Pressure is applied to the plurality of single crystal semiconductor layers 125a, 125b, and 125c bonded to the support substrate 107 as mentioned above; thus, even in the case where minute foreign matter is attached to the adhesion interface between the insulating layer 104 formed over the single crystal semiconductor substrate 101 and the support substrate 107, adhesion defects can be reduced, and bonding strength can be increased. Further, even in the case where bubbles are taken into part of the adhesion interface due to warpage or deflection of the support substrate, adhesion defects can be reduced and bonding strength can be increased.

Before bonding the single crystal semiconductor substrate 101 and the support substrate 107 together, the single single crystal semiconductor layer is processed to have a desired shape in a desired arrangement over the crystal semiconductor substrate 101; therefore, a single crystal semiconductor layer does not require a process treatment such as etching of the support substrate 107. Thus, the necessity for heat or etching damages that accompany a process treatment after bonding of the single crystal semiconductor layer to the support substrate 107 are reduced.

This embodiment mode can be implemented in combination with any of the other embodiment modes as appropriate.

Embodiment Mode 4

In this embodiment mode, a manufacturing method of a CMOS (complementary metal oxide semiconductor) will be described as an example of a manufacturing method of a semiconductor device including a semiconductor element having high performance and high reliability with high yield with reference to FIGS. 15A to 15E and FIGS. 16A to 16D. Note that repetitive descriptions for the same components as or components having similar functions to the components in Embodiment Mode 1 are omitted.

Figure 15A:
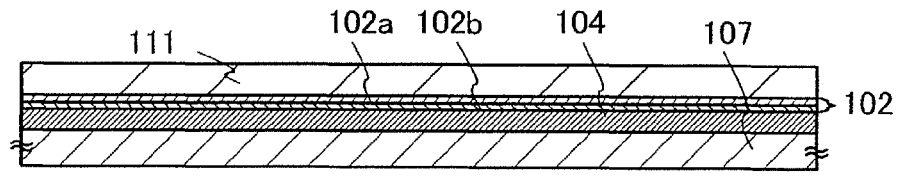
FIGS. 15A to 15E illustrate a method for manufacturing a semiconductor device to which the present invention is applied.

In FIG. 15A, the insulating layer 104, the insulating layer 102, and the single crystal semiconductor layer 111 are formed over the support substrate 107. Note that, although an example in which an SOI substrate having a structure shown in FIG. 15A is used will be described in this embodiment mode, an SOI substrate having another structure described in this specification can also be used.

Since the single crystal semiconductor layer 111 is separated from the single crystal semiconductor substrate 101 and subjected to heat treatment by supply of high energy with use of at least one kind of particles having the high energy and first etching, the single crystal semiconductor layer 111 with reduced crystal defects and high planarity is obtained.

In the single crystal semiconductor layer 111, a p-type impurity such as boron, or aluminum, gallium or an n-type impurity such as phosphorus or arsenic is preferably added in accordance with a formation region of an n-channel field effect transistor or a p-channel field effect transistor. In other words, a p-type impurity is added to a formation region of an n-channel field effect transistor or an n-type impurity is added to a formation region of a p-channel field effect transistor, and thereby forming so-called well regions. The dose of impurity ions may range from about $1 \times 10^{12}$ atoms/cm$^2$ to $1 \times 10^{14}$ atoms/cm$^2$. Furthermore, in the case of controlling the threshold voltage of the field effect transistor, a p-type or n-type impurity may be added to the well regions.

Figure 15B:
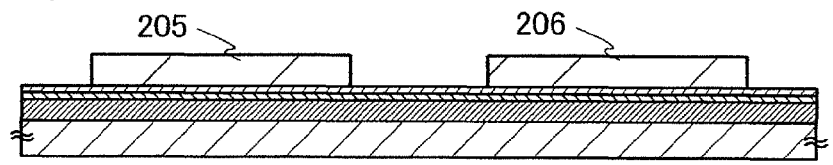

The single crystal semiconductor layer 111 is etched into island shapes in accordance with the position of the semiconductor element to form separated single crystal semiconductor layers 205 and 206 (see FIG. 15B).

An oxide film over the single crystal semiconductor layer is removed, and a gate insulating layer 207 which covers the single crystal semiconductor layers 205 and 206 is formed. Since the single crystal semiconductor layers 205 and 206 in this embodiment mode have high planarity, even if a gate insulating layer formed over the single crystal semiconductor layers 205 and 206 is a thin gate insulating layer, the gate insulating layer can cover the single crystal semiconductor layers 205 and 206 with favorable coverage. Therefore, a property defect due to a coverage defect of the gate insulating layer can be prevented, and a semiconductor device having high reliability can be manufactured with high yield. Reduction in the thickness of the gate insulating layer 207 has an effect of operating a thin film transistor with low voltage at high speed.

The gate insulating layer 207 may be formed of silicon oxide or a stack of silicon oxide and silicon nitride. The gate insulating layer 207 may be formed by deposition of an insulating film by plasma CVD or low pressure CVD or is preferably formed by solid phase oxidation or solid phase nitridation by plasma treatment. This is because a gate insulating layer formed by oxidation or nitridation of a single crystal semiconductor layer by plasma treatment is dense, has high withstand voltage, and is excellent in reliability.

As the gate insulating layer 207, a high dielectric constant material such as zirconium dioxide, hafnium oxide, titanium dioxide, or tantalum pentoxide may be used. Using a high dielectric constant material for the gate insulating layer 207 makes it possible to reduce gate leakage current.

Figure 15C:
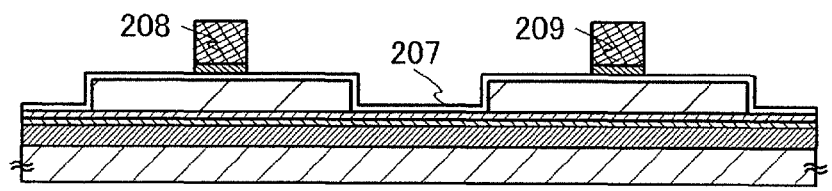
Figure 15D:
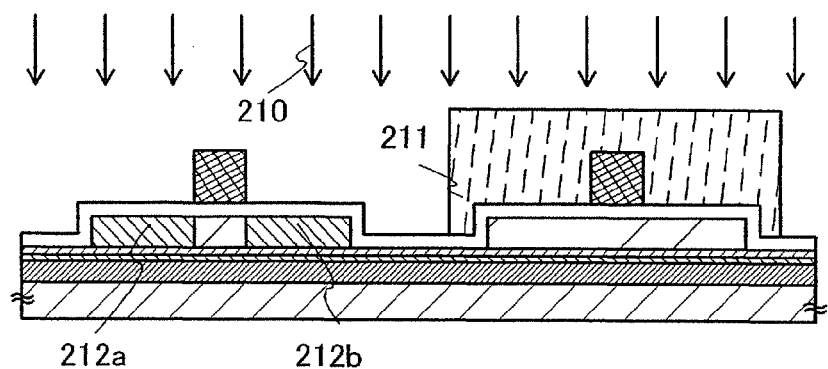
Figure 15E:
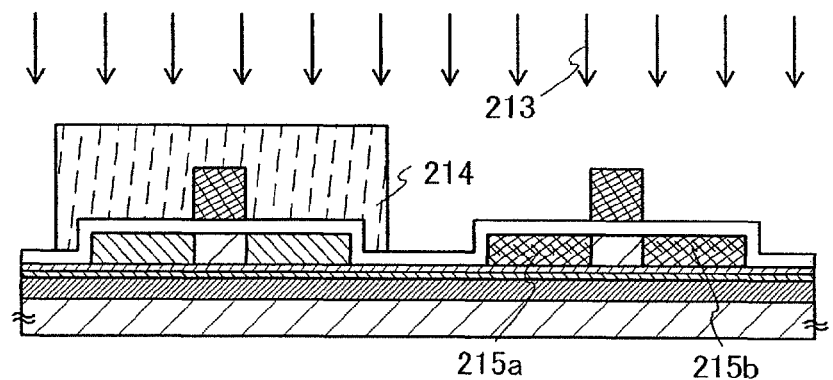

A gate electrode layer 208 and a gate electrode layer 209 are formed over the gate insulating layer 207 (see FIG. 15C). The gate electrode layers 208 and 209 can be formed by sputtering, an evaporation method, CVD, or the like. The gate electrode layers 208 and 209 may be formed of an element selected from tantalum (Ta), tungsten (W), titanium (Ti), molybdenum (Mo), aluminum (Al), copper (Cu), chromium (Cr), or neodymium (Nd); or an alloy material or a compound material containing any of the above elements as its main component. Alternatively, as the gate electrode layers 208 and 209, a semiconductor film typified by a polycrystalline silicon layer doped with an impurity element such as phosphorus, or an AgPdCu alloy may be used.

A mask 211 which covers the semiconductor layer 206 is formed. With use of the mask 211 and the gate electrode layer 208 as masks, an impurity element 210 imparting n-type conductivity is added to form first n-type impurity regions 212a and 212b (see FIG. 15D). In this embodiment mode, phosphine (PH$_3$) is used as a doping gas containing an impurity element. Here, doping is performed so that the first n-type impurity regions 212a and 212b contain an impurity element imparting n-type conductivity at a concentration of about $1 \times 10^{17}$ atoms/cm$^3$ to $5 \times 10^{18}$ atoms/cm$^3$. In this embodiment mode, phosphorus (P) is used as an impurity element imparting n-type conductivity.

Next, a mask 214 which covers the single crystal semiconductor layer 205 is formed. With use of the mask 214 and the gate electrode layer 209 as masks, an impurity element 213 imparting p-type conductivity is added to form first p-type impurity regions 215a and 215b (see FIG. 15E). In this embodiment mode, diborane (B$_2$H$_6$) or the like is used as a doping gas containing an impurity element because boron (B) is used as an impurity element.

Figure 16A:
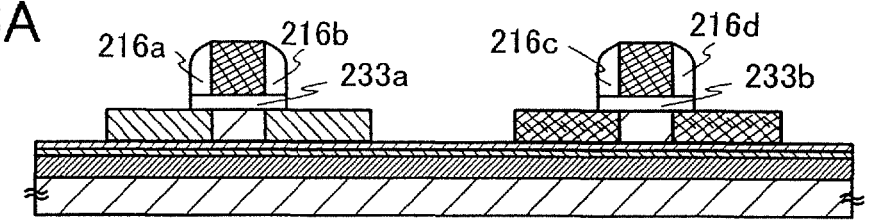
FIGS. 16A to 16D illustrate a method for manufacturing the semiconductor device to which the present invention is applied.
Figure 16B:
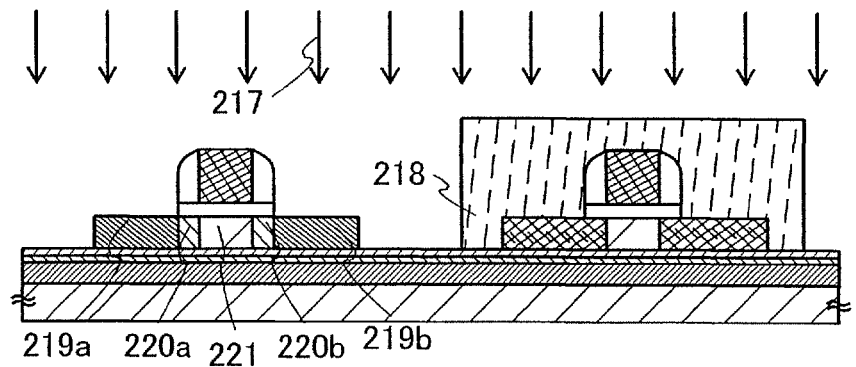
Figure 16C:
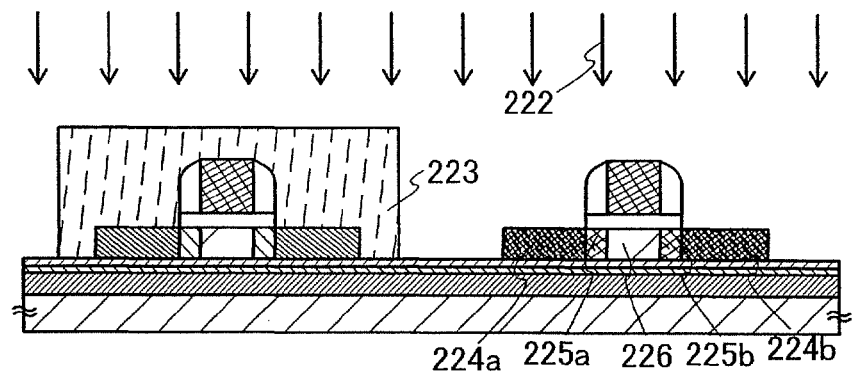

The mask 214 is removed, sidewall insulating layers 216a to 216d with a sidewall structure are formed on side surfaces of the gate electrode layers 208 and 209, and gate insulating layers 233a and 233b are formed (see FIG. 16A). The sidewall insulating layers 216a to 216d with a sidewall structure may be formed on the side surfaces of the gate electrode layers 208 and 209 in a self-alignment manner, in the following manner: an insulating layer covering the gate electrode layers 208 and 209 is formed and is processed by anisotropic etching using an RIE (reactive ion etching) method. Here, there is no particular limitation on the insulating layers and the insulating layers are preferably layers of silicon oxide with favorable step coverage, which are formed by reaction of TEOS (tetraethyl orthosilicate), silane, or the like with oxygen, nitrous oxide, or the like. The insulating layers can be formed by thermal CVD, plasma CVD, atmospheric pressure CVD, bias ECRCVD, sputtering, or the like. The gate insulating layers 233a and 233b can be formed by etching of the gate insulating layer 207 with use of the gate electrode layers 208 and 209 and the sidewall insulating layers 216a to 216d as masks.

In this embodiment mode, in etching the insulating layer, the insulating layer over the gate electrode layers are removed to expose the gate electrode layers. However, the sidewall insulating layers 216a to 216d may be formed to have a shape in which the insulating layer over the gate electrode layers remains. In addition, a protective film may be formed over the gate electrode layers in a later step. By protection of the gate electrode layers in this manner, film reduction of the gate electrode layers can be prevented when the gate electrode layers are processed by etching. In the case of forming silicide in a source region and a drain region, since a metal film formed for formation of the silicide is not in contact with the gate electrode layers, even when a material of the metal film can easily react with a material of the gate electrode layer, defects such as chemical reaction or diffusion can be prevented. Various etching methods such as a dry etching method or a wet etching method may be used for etching. In this embodiment mode, a dry etching method is used. As an etching gas, a chlorine-based gas typified by Cl$_2$, BCl$_3$, SiCl$_4$, CCl$_4$, or the like, a fluorine-based gas typified by CF$_4$, SF$_6$, NF$_3$, or the like, or O$_2$ can be used as appropriate.

Next, a mask 218 which covers the single crystal semiconductor layer 206 is formed. The mask 218, the gate electrode layer 208, and the sidewall insulating layers 216a and 216b are used as masks, and an impurity element 217 imparting n-type conductivity is added to form second n-type impurity regions 219a and 219b and third n-type impurity regions 220a and 220b. In this embodiment mode, PH$_3$ is used as a doping gas containing an impurity element. Here, the doping is performed so that the second n-type impurity regions 219a and 219b contain an impurity element imparting n-type conductivity at a concentration of about $5\times10^{19}$ atoms/cm$^3$ to $5\times10^{20}$ atoms/cm$^3$. In addition, a channel formation region 221 is formed in the single crystal semiconductor layer 205 (see FIG. 16B).

The second n-type impurity regions 219a and 219b are high-concentration n-type impurity regions and serve as a source and a drain. On the other hand, the third n-type impurity regions 220a and 220b are low-concentration impurity regions and serve as LDD (lightly doped drain) regions. Since the third n-type impurity regions 220a and 220b are formed in Loff regions, which are not covered with the gate electrode layer 208, off current can be reduced. Accordingly, a semiconductor device with lower off current and lower power consumption can be manufactured.

The mask 218 is removed, and a mask 223 which covers the semiconductor layer 205 is formed. With use of the mask 223, the gate electrode layer 209, and the sidewall insulating layers 216c and 216d as masks, an impurity element 222 that imparting p-type conductivity is added to form second p-type impurity regions 224a and 224b, and third p-type impurity regions 225a and 225b.

Doping is performed so that the second p-type impurity regions 224a and 224b contain an impurity element imparting p-type conductivity at a concentration of about $1\times10^{20}$ atoms/cm$^3$ to $5\times10^{21}$ atoms/cm$^3$. In this embodiment mode, the third p-type impurity regions 225a and 225b are formed in a self-alignment manner by the sidewall insulating layers 216c and 216d so as to have a lower concentration than the second p-type impurity regions 224a and 224b. In addition, a channel formation region 226 is formed in the single crystal semiconductor layer 206 (see FIG. 16C).

The second p-type impurity regions 224a and 224b are high-concentration p-type impurity regions and serve as a source and a drain. On the other hand, the third p-type impurity regions 225a and 225b are low-concentration impurity regions and serve as LDD (lightly doped drain) regions. Since the third p-type impurity regions 225a and 225b are formed in Loff regions, which are not covered with the gate electrode layer 209, off current can be reduced. Accordingly, a semiconductor device with lower off current and lower power consumption can be manufactured.

The mask 223 is removed, and heat treatment, irradiation with strong light, or irradiation with a laser beam may be performed in order to activate the impurity element. At the same time as the activation, plasma damage to the gate insulating layer and plasma damage to an interface between the gate insulating layer and the single crystal semiconductor layer can be repaired.

Next, an interlayer insulating layer which covers the gate electrode layers and the gate insulating layers is formed. In this embodiment mode, a stack of an insulating film 227 containing hydrogen to serve as a protective film and an insulating layer 228 is employed. The insulating film 227 and the insulating layer 228 may be formed using a silicon nitride film, a silicon nitride oxide film, a silicon oxynitride film, or a silicon oxide film by sputtering or plasma CVD. Alternatively, a single layer structure or a stack of three or more layers using another insulating film containing silicon may also be employed.

Furthermore, a step in which heat treatment is performed at 300° C. to 550° C. for 1 hour to 12 hours in a nitrogen atmosphere to hydrogenate the single crystal semiconductor layer is performed. Preferably, the temperature is 400° C. to 500° C. This step is a step for terminating a dangling bond of the semiconductor layer by hydrogen contained in the insulating film 227, which is an interlayer insulating layer. In this embodiment mode, heat treatment is performed at 410° C. for one hour.

The insulating film 227 and the insulating layer 228 can be formed of a material selected from aluminum nitride (AlN), aluminum oxynitride (AlON), aluminum nitride oxide in which the amount of nitrogen is higher than that of oxygen (AlNO), aluminum oxide, diamond-like carbon (DLC), nitrogen-containing carbon (CN), or other substances containing an inorganic insulating material. A siloxane resin may also be used. A siloxane resin is a resin including a Si—O—Si bond. Siloxane has a skeletal structure formed of a bond of silicon (Si) and oxygen (O). As a substituent, an organic group containing at least hydrogen (e.g., an alkyl group or an aryl group) is used. A fluoro group may be used as a substituent instead. Alternatively, an organic group at least containing hydrogen and a fluoro group may be used as a substituent.

Further, an organic insulating material such as polyimide, acrylic, polyamide, polyimide amide, resist, benzocyclobutene, or polysilazane may also be used. A coating film with favorable planarity, which is formed by a coating method, may also be used.

The insulating film 227 and the insulating layer 228 can be formed with use of dipping, spray coating, a doctor knife, a roll coater, a curtain coater, a knife coater, a CVD method, an evaporation method, or the like. The insulating film 227 and the insulating layer 228 may also be formed by a droplet discharge method. A droplet discharge method requires less material solution. In addition, a method capable of transferring or drawing a pattern such as a droplet discharge method, for example, a printing method (a method of forming a pattern, such as screen printing, offset printing, or the like) can also be used.

Next, contact holes (openings) reaching the single crystal semiconductor layers are formed in the insulating film 227 and the insulating layer 228 using a resist mask. Etching may be performed once or plural times depending on choice of a material to be used. The insulating film 227 and the insulating layer 228 are partly removed by the etching to form the openings reaching the second n-type impurity regions 219a and 219b and the second p-type impurity regions 224a and 224, which are source regions and drain regions. The etching may be performed by wet etching, dry etching, or both wet etching and dry etching. A hydrofluoric-acid-based solution such as a mixed solution of ammonium hydrogen fluoride and ammonium fluoride may be used as an etchant of wet etching. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate. Further, an inert gas may be added to an etching gas to be used. As an inert element to be added, one or a plurality of elements selected from He, Ne, Ar, Kr, or Xe can be used.

A conductive film is formed so as to cover the openings, and the conductive film is etched to form wiring layers 229a, 229b, 230a, and 230b which serve as source and drain electrode layers which are electrically connected to parts of source regions and drain regions. The wiring layers can be formed by formation of a conductive film by a PVD method, a CVD method, an evaporation method, or the like, and then, etching the conductive film into a desired shape. Further, a conductive film can be selectively formed in a predetermined position by a droplet discharge method, a printing method, an electroplating method, or the like. Moreover, a reflow process or a damascene process may also be used. As a material for the wiring layers, metal such as Ag, Au, Cu, Ni, Pt, Pd, Ir, Rh, W, Al, Ta, Mo, Cd, Zn, Fe, Ti, Zr, or Ba; Si or Ge; or an alloy or nitride thereof can be used. A stack of these materials may also be employed.

Figure 16D:
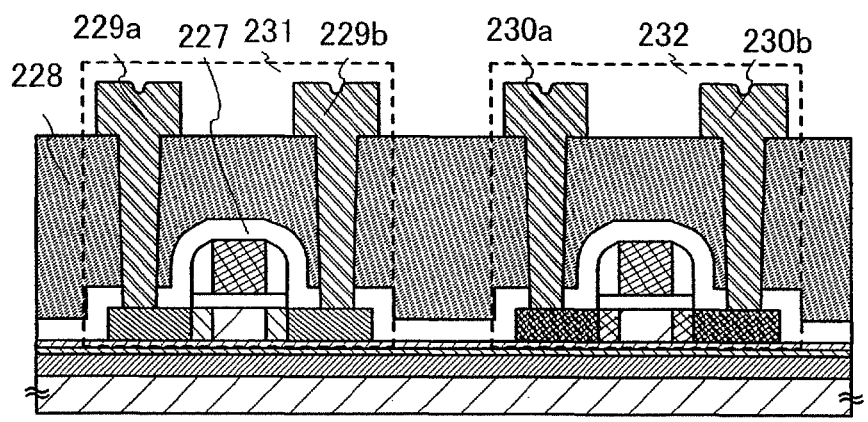

Through the above-described steps, a semiconductor device having a CMOS structure which includes a thin film transistor 231, which is an n-channel thin film transistor, and a thin film transistor 232, which is a p-channel thin film transistor, can be formed (see FIG. 16D). Although not shown in the drawings, a CMOS structure is described in this embodiment mode; thus, the thin film transistor 231 and the thin film transistor 232 are electrically connected to each other.

A structure of the thin film transistor is not limited to that described in this embodiment mode, and a single gate structure in which one channel formation region is formed, a double gate structure in which two channel formation regions are formed, or a triple gate structure in which three channel formation regions are formed may be employed.

As described above, a semiconductor device which has high performance and high reliability can be formed with high yield with use of an SOI substrate which has a single crystal semiconductor layer with reduced crystal defects and high planarity.

Thin film transistors can be manufactured using such an SOI substrate. The single crystal semiconductor layer of the SOI substrate has almost no crystal defects and is a single crystal semiconductor layer with reduced interface state density with the gate insulating layer 207. The semiconductor layer has a planarized surface and is thinned to a thickness of less than or equal to 50 nm. Accordingly, thin film transistors with excellent characteristics such as low driving voltage, high electron field effect mobility, and a low subthreshold value can be formed over the support substrate 107. Furthermore, plural transistors with high performance and less variation in characteristics between the transistors can be formed over the same substrate. In other words, with use of the SOI substrate of the present invention, nonuniformity of the important characteristic value as transistor characteristics, such as threshold voltage or mobility, can be reduced and high performance such as high field effect mobility can be obtained.

Thus, a semiconductor device with high added value can be manufactured by formation of various semiconductor elements such as TFTs using the SOI substrate of the present invention.

Embodiment Mode 5

This embodiment mode describes an example of a method for manufacturing a semiconductor device of the present invention, with reference to FIGS. 17A to 17D, FIGS. 18A to 18C, and FIGS. 19A to 19C. Note that a liquid crystal display device is given as an example of a semiconductor device in this embodiment mode; however, a semiconductor device of the present invention is not limited to a liquid crystal display device.

Figure 17A:
FIGS. 17A to 17D illustrate a method for manufacturing a semiconductor device to which the present invention is applied.

First, an SOI substrate having a single crystal semiconductor layer, which is manufactured by a method shown in Embodiment Mode 1, or the like is prepared (see FIG. 17A). Here, description is made using a structure in which an insulating layer 1102, an insulating layer 1104 (also referred to as a bond layer), and a single crystal semiconductor layer 1111 are sequentially provided over a substrate 1107 (base substrate) having an insulating surface is described; however, the present invention is not limited thereto. Here, the insulating layer 1104 can be formed using a material such as silicon oxide, silicon nitride, silicon oxynitride, or silicon nitride oxide. Further, the insulating layer 1104 may have a layered structure. For details, Embodiment Mode 1 can be referred to. Note that the SOI substrate corresponds to the SOI substrate 121 in Embodiment Mode 1, and the insulating layer 1102 corresponds to the insulating layer 102 therein.

Next, the single crystal semiconductor layer 1111 is patterned to have a desired shape, thereby forming island-shaped single crystal semiconductor layers. Also in this embodiment mode, as in Embodiment Mode 1, the single crystal semiconductor layer 1111 is patterned so that a region where semiconductor characteristics are deteriorated is removed. Since Embodiment Mode 1 can be referred to for details, the description is omitted here. As etching processing in patterning, either dry etching (plasma etching or the like) or wet etching can be used. For treating a large substrate, plasma etching is more suitable. As an etching gas, a fluorine-based gas or a chlorine-based gas such as $CF_4$, $NF_3$, $Cl_2$, or $BCl_3$ may be used, and an inert gas such as He or Ar may be added thereto as appropriate. Further, in the case of applying etching processing by atmospheric pressure discharge, local discharge processing can be realized; thus, etching can be performed without forming a mask layer over an entire surface of the substrate.

Further, the single crystal semiconductor layer 1111 may be formed into an island shape to have a tapered shape, or alternatively, end portions of the island-shaped single crystal semiconductor layers may be processed into a rounded shape. The island-shaped single crystal semiconductor layers are formed to have a tapered shape, so that good coverage of an insulating layer and a conductive layer to be formed later is obtained; thus, disconnection of the insulating layer or the conductive layer can be prevented. Further, when the end portions of the island-shaped single crystal semiconductor layers have a rounded shape, concentration of electric field can be reduced, so that generation of malfunction of semiconductor elements can be prevented.

Note that the insulating layer 1104 is preferably left without being etched. The insulating layer 1104 is left because an impurity element (for example, alkali metal such as sodium or potassium, alkaline earth metal such as magnesium or calcium, a transition metal such as iron, copper, or nickel) contained in the substrate 1107 having an insulating surface can be prevented from entering the single crystal semiconductor layer.

After the single crystal semiconductor layer is patterned, a p-type impurity such as boron, aluminum, or gallium may be added in order to control a threshold voltage. For example, as a p-type impurity, boron can be added at a concentration greater than or equal to $5 \times 10^{16}$ atoms/cm$^3$ and less than or equal to $1 \times 10^{18}$ atoms/cm$^3$.

The insulating layer 1104 preferably has a barrier layer against an impurity element. The barrier layer can be formed using a material such as silicon nitride or silicon nitride oxide. In the case of providing a barrier layer, a layered structure of silicon nitride oxide and silicon oxynitride can be used, for example. Instead of silicon nitride oxide, silicon nitride may be used. Further, instead of silicon oxynitride, silicon oxide may be used.

Figure 17B:
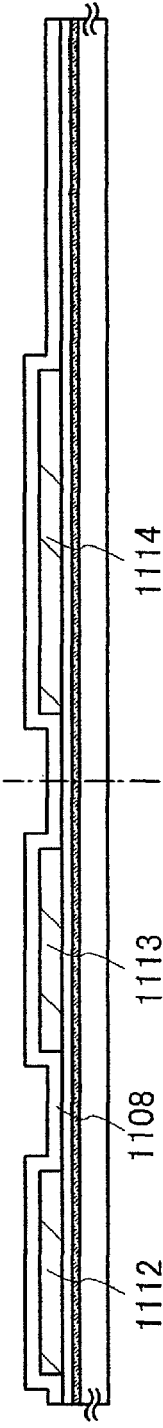
Figure 17C:
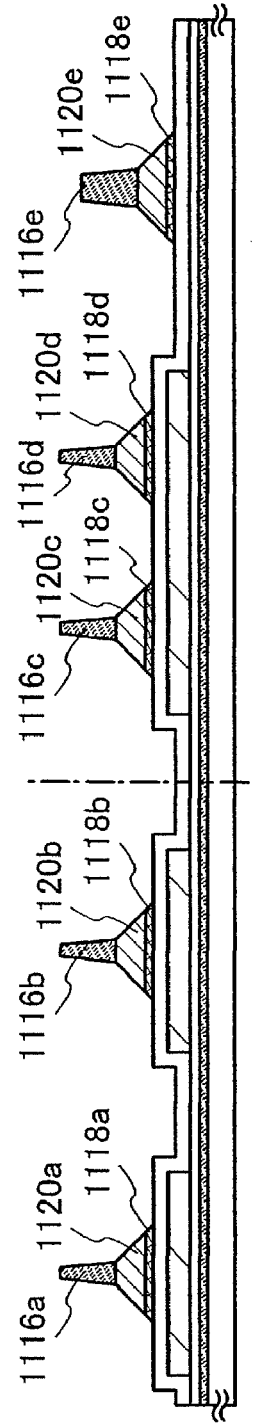

Next, a gate insulating layer 1108 which covers the island-shaped single crystal semiconductor layers is formed (see FIG. 17B). Note that for convenience, the island-shaped single crystal semiconductor layers which are formed by patterning are referred to as single crystal semiconductor layers 1112, 1113, and 1114 here. The gate insulating layer 1108 is formed of a silicon-containing insulating film by plasma CVD, sputtering, or the like, at a thickness of approximately greater than or equal to 10 nm and less than or equal to 150 nm. In specific, the gate insulating layer 1108 may be formed from a material such as an oxide material or a nitride material of silicon, which is typified by silicon nitride, silicon oxide, silicon oxynitride, and silicon nitride oxide. Note that the gate insulating layer 1108 may have a single-layer structure or a layered structure. Further, a thin silicon oxide film with a thickness of greater than or equal to 1 nm and less than or equal to 100 nm, preferably greater than or equal to 1 nm and less than or equal to 10 nm, more preferably greater than or equal to 2 nm and less than or equal to 5 nm may be formed between the single crystal semiconductor layer and the gate insulating layer. In order to form a gate insulating film having less leakage current at a low temperature, a rare gas element such as argon may be contained in a reaction gas.

Next, a first conductive film and a second conductive film, which serve as gate electrode layers, are stacked over the gate insulating layer 1108. The first conductive film may be formed at a thickness of about greater than or equal to 20 nm and less than or equal to 100 nm, and the second conductive film may be formed at a thickness of about greater than or equal to 100 nm and less than or equal to 400 nm. The first and second conductive films can be formed by sputtering, an evaporation method, CVD, or the like. The first and second conductive films may be formed of an element selected from tantalum, tungsten, titanium, molybdenum, aluminum, copper, chromium, neodymium, or the like; an alloy material or a compound material including any of those elements as its main component; or the like. Further, for the first and second conductive films, a semiconductor film typified by a polycrystalline silicon film doped with an impurity element such as phosphorus; an AgPdCu alloy; or the like may be used. Note that although a conductive layer with a two-layer structure is described in this embodiment mode, the present invention is not limited thereto. Alternatively, a three-layer structure or a single-layer structure may be employed.

Then, a photolithography method is used to form masks 1116a, 1116b, 1116c, 1116d, and 1116e from a resist material. Then, the first conductive film and the second conductive film are processed into a desired shape with the use of the masks to form first gate electrode layers 1118a, 1118b, 1118c, and 1118d, a first conductive layer 1118e, and conductive layers 1120a, 1120b, 1120c, 1120d, and 1120e (see FIG. 17C).

Here, an inductively coupled plasma (ICP) etching method is used, and etching conditions (e.g., the amount of electric power applied to a coiled electrode layer, the amount of electric power applied to an electrode layer on the substrate side, and the electrode temperature on the substrate side) are regulated as appropriate; thus, etching can be performed so as to obtain a desired tapered shape. An angle and the like of the tapered shape may also be controlled by the shape of the masks. Note that a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be used for the etching gas, as appropriate. In this embodiment mode, the second conductive film is etched using an etching gas containing $CF_4$, $Cl_2$, and $O_2$, and then, the first conductive film is continuously etched using an etching gas containing $CF_4$ and $Cl_2$.

Next, the conductive layers 1120a, 1120b, 1120c, 1120d, and 1120e are processed into a desired shape using the masks 1116a, 1116b, 1116c, 1116d, and 1116e. At this time, etching is performed under an etching condition in which the selectivity of the second conductive film, which forms the conductive layers, to the first conductive film, which forms the first gate electrode layers and the first conductive layer, is high. By the etching, second gate electrode layers 1122a, 1122b, 1122c, and 1122d, and a second conductive layer 1122e are formed. In this embodiment mode, each of the second gate electrode layers and the second conductive layer has a tapered shape, and a taper angle of each of the second gate electrode layers and the second conductive layer is larger than a taper angle of each of the first gate electrode layers and the first conductive layer. Here, a "taper angle" refers to an angle formed by the meeting of a bottom surface with a side surface of an object. Thus, when the taper angle is 90°, the conductive layer has a perpendicular side surface to the bottom surface. With each taper angle set to a degree of less than 90°, a film to be stacked thereover adequately covers the conductive layer; thus, defects can be reduced. Note that in this embodiment mode, $Cl_2$, $SF_6$, and $O_2$ are used as etching gas for forming the second gate electrode layers and the second conductive layer.

Figure 17D:
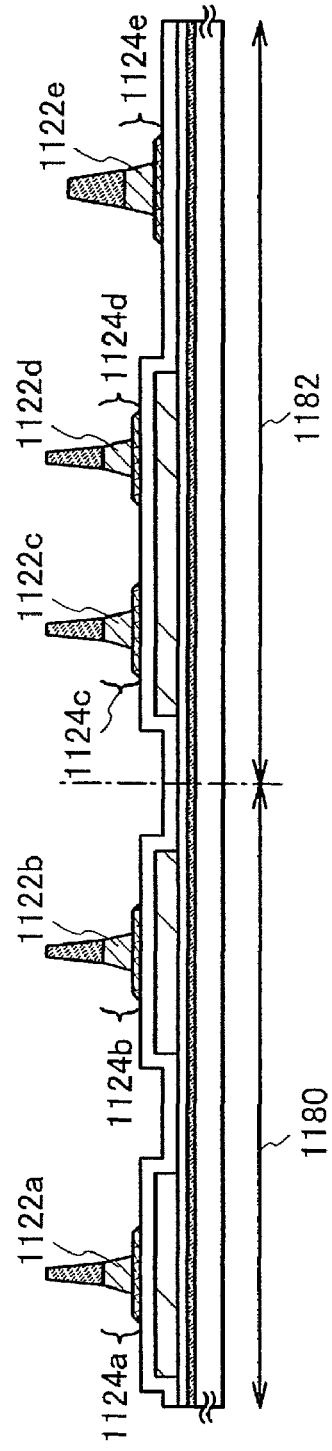

Through the aforementioned processes, gate electrode layers 1124a and 1124b can be formed in a peripheral driver circuit region 1180, and gate electrode layers 1124c and 1124d and a conductive layer 1124e can be formed in a pixel region 1182 (see FIG. 17D). Note that the masks 1116a, 1116b, 1116c, 1116d, and 1116e are removed after the aforementioned processes.

Next, an impurity element imparting n-type conductivity is added using the gate electrode layers 1124a, 1124b, 1124c, and 1124d as masks, thereby forming first n-type impurity regions 1126a, 1126b, 1128a, 1128b, 1130a, 1130b, and 1130c (see FIG. 18A). In this embodiment mode, doping is performed by using phosphine ($PH_3$) as a doping gas containing an impurity element. Here, doping is performed so that phosphorus (P) that is an impurity element imparting n-type conductivity is contained in the first n-type impurity regions at a concentration of approximately greater than or equal to $1\times10^{16}$ atoms/cm$^3$ and less than or equal to $5\times10^{19}$ atoms/cm$^3$.

Next, masks 1132a, 1132b, and 1132c which cover the single crystal semiconductor layer 1112 and part of the single crystal semiconductor layer 1114 are formed. An impurity element imparting n-type conductivity is added using the masks 1132a, 1132b, and 1132c, and the second gate electrode layer 1122b as masks. Accordingly, second n-type impurity regions 1134a and 1134b; third n-type impurity regions 1136a and 1136b; second n-type impurity regions 1140a, 1140b, and 1140c; and third n-type impurity regions 1142a, 1142b, 1142c, and 1142d are formed. In this embodiment mode, doping is performed by using phosphine ($PH_3$) as a doping gas containing an impurity element. Here, doping is performed so that phosphorus (P) that is an impurity element imparting n-type conductivity is contained in the second n-type impurity regions at a concentration of approximately greater than or equal to $1\times10^{17}$ atoms/cm$^3$ and less than or equal to $1\times10^{21}$ atoms/cm$^3$. An impurity element which imparts n-type conductivity is added to the third n-type impurity regions 1136a and 1136b so as to contain the impurity element imparting n-type conductivity at a concentration which is the same as or substantially the same as or at a slightly higher concentration than that of the third n-type impurity regions 1142a, 1142b, 1142c, and 1142d. In addition, channel formation regions 1138, 1144a, and 1144b are formed (see FIG. 18B).

Each of the second n-type impurity regions is a high-concentration impurity region and functions as a source or a drain. On the other hand, each of the third n-type impurity regions is a low-concentration impurity region and functions as a so-called LDD (lightly doped drain) region. Each of the third n-type impurity regions 1136a and 1136b is formed in a region overlapping with the first gate electrode layer 1118b. Accordingly, an electric field in the vicinity of a source or a drain can be relieved, and deterioration of on-state current due to hot carriers can be prevented. On the other hand, each of the third n-type impurity regions 1142*a*, 1142*b*, 1142*c*, and 1142*d* does not overlap with the gate electrode layer 1124*c* or 1124*d*; thus, an effect of reducing off-state current can be obtained.

Next, the masks 1132*a*, 1132*b*, and 1132*c* are removed, and masks 1146*a* and 1146*b* which cover the single crystal semiconductor layers 1113 and 1114 are formed. An impurity element imparting p-type conductivity is added using the masks 1146*a* and 1146*b* and the gate electrode layer 1124*a* as masks. Accordingly, first p-type impurity regions 1148*a* and 1148*b*, and second p-type impurity regions 1150*a* and 1150*b* are formed. In this embodiment mode, doping is performed using diborane ($B_2H_6$) as a doping gas containing an impurity element. Here, boron (B) which is an impurity element imparting p-type conductivity is added to the first p-type impurity regions and the second p-type impurity regions at a concentration of approximately greater than or equal to $1 \times 10^{18}$ atoms/cm$^3$ and less than or equal to $5 \times 10^{21}$ atoms/cm$^3$. Further, a channel formation region 1152 is formed (see FIG. 18C).

Each of the first p-type impurity regions is a high-concentration impurity region and functions as a source or a drain. On the other hand, each of the second p-type impurity regions is a low-concentration impurity region and functions as a so-called LDD (lightly doped drain) region.

Subsequently, the masks 1146*a* and 1146*b* are removed. After the masks are removed, an insulating film may be formed so as to cover the side surfaces of the gate electrode layers. The insulating film can be formed by plasma CVD or low pressure CVD (LPCVD). Heat treatment, intense light irradiation, laser light irradiation, or the like may be performed to activate the impurity elements.

Subsequently, an interlayer insulating layer which covers the gate electrode layers and the gate insulating layer is formed. In this embodiment mode, a layered structure of insulating films 1154 and 1156 is employed (see FIG. 19A). A silicon nitride oxide film is formed as the insulating film 1154 with a thickness of 100 nm and a silicon oxynitride film is formed as the insulating film 1156 with a thickness of 900 nm. Although the two-layer structure is employed in this embodiment mode, a single-layer structure or a layered structure including three or more layers may be employed. In this embodiment mode, the insulating films 1154 and 1156 are successively formed by plasma CVD without exposure to the air. Note that materials for the insulating films 1154 and 1156 are not limited to the above-described material.

The insulating films 1154 and 1156 can also be formed using a material selected from substances including silicon oxide, silicon nitride, aluminum oxide, aluminum nitride, aluminum oxynitride, aluminum nitride oxide containing more nitrogen than oxygen, aluminum oxide, diamond-like carbon (DLC), a carbon film containing nitrogen, and other substances containing an inorganic insulating material. Further, A siloxane resin may also be used. Note that siloxane resin is a resin including a Si—O—Si bond. Siloxane has a skeletal structure formed of a bond of silicon (Si) and oxygen (O). As a substituent, an organic group containing at least hydrogen (e.g., an alkyl group or an aryl group) is used. A fluoro group may be used as a substituent instead. Alternatively, an organic group at least containing hydrogen and a fluoro group may be used as a substituent. Further, an organic insulating material such as polyimide, acrylic, polyamide, polyimide amide, benzocyclobutene, or polysilazane may also be used.

Next, contact holes (openings) that reach the single crystal semiconductor layers and the gate electrode layer are formed in the insulating films 1154 and 1156 and the gate insulating layer 1108, using a mask made of a resist material. Etching may be performed once or a plurality of times depending on the choice of materials to be used. In this embodiment mode, first etching is performed under a condition that selectivity of the insulating film 1156 that is a silicon oxynitride film to the insulating film 1154 that is a silicon nitride oxide film can be obtained; thus, the insulating film 1156 is removed. Next, the insulating film 1154 and the gate insulating layer 1108 are removed by second etching, and openings each of which reaches a source or a drain are formed.

Then, a conductive film is formed so as to cover the openings, and the conductive film is etched. Accordingly, source or drain electrode layers 1158*a*, 1158*b*, 1160*a*, 1160*b*, 1162*a*, and 1162*b* which are each electrically connected to part of a source or drain region are formed. For each source or drain electrode layer, one or a plurality of elements selected from aluminum, tantalum, titanium, molybdenum, tungsten, neodymium, chromium, nickel, platinum, gold, silver, copper, magnesium, scandium, cobalt, nickel, zinc, niobium, silicon, phosphorus, boron, arsenic, gallium, indium, and tin; a compound or an alloy material that contains any of the given elements as its main component (for example, indium tin oxide (ITO), indium zinc oxide (IZO), indium tin oxide to which silicon oxide has been added (ITSO), zinc oxide, aluminum-neodymium (Al—Nd), magnesium-silver (Mg—Ag), or the like); a material that is a combination of any of these compounds; or the like can be used. Alternatively, a silicide (for example, aluminum-silicon, molybdenum-silicon, or nickel silicide), a nitrogen-containing compound (for example, titanium nitride, tantalum nitride, or molybdenum nitride), silicon (Si) that is doped with an impurity element such as phosphorus (P), or the like can be used.

Through the above processes, a p-channel thin film transistor 1164 and an n-channel thin film transistor 1166 are formed in the peripheral driver circuit region 1180, and an n-channel thin film transistor 1168 and a capacitor wiring 1170 are formed in the pixel region 1182 (see FIG. 19B).

Next, an insulating film 1172 is formed as a second interlayer insulating layer. The insulating film 1172 can be formed from a material selected from silicon oxide, silicon nitride, silicon oxynitride, silicon nitride oxide, aluminum oxide, aluminum nitride, aluminum oxynitride, aluminum nitride oxide containing more nitrogen than oxygen, aluminum oxide, diamond-like carbon (DLC), carbon containing nitrogen, phosphosilicate glass (PSG), borophosphosilicate glass (BPSG), polysilazane, or other substances containing an inorganic insulating material. Further, a siloxane resin may be used as well. Alternatively, an organic insulating material such as polyimide, acrylic, polyamide, polyimide amide, or benzocyclobutene can be used.

Next, a contact hole is formed in the insulating film 1172 of the pixel region 1182 to form a pixel electrode layer 1174 (see FIG. 19C). The pixel electrode layer 1174 can be formed using indium tin oxide (ITO), indium zinc oxide (IZO) in which indium oxide is mixed with zinc oxide, a conductive material in which indium oxide is mixed with silicon oxide, organic indium, organic tin, indium oxide containing tungsten oxide, indium zinc oxide containing tungsten oxide, indium oxide containing titanium oxide, indium tin oxide containing titanium oxide, or metal such as tungsten, molybdenum, zirconium, hafnium, vanadium, niobium, tantalum, chromium, cobalt, nickel, titanium, platinum, aluminum, copper, or silver, or an alloy or a metal nitride thereof.

A conductive composition including a conductive high molecule (also referred to as a conductive polymer) can be used for the pixel electrode layer 1174. A thin film of a conductive composition preferably has a sheet resistance of less than or equal to 10000 Ω/sq. When a thin film of a conductive composition is formed as a pixel electrode layer having a light-transmitting property, light transmittance is preferably greater than or equal to 70% at a wavelength of 550 nm. In addition, the resistance of the conductive high molecule which is contained in the conductive composition is desirably less than or equal to 0.1 Ω·cm.

As the conductive high molecule, a so-called π electron conjugated conductive high molecule can be used. For example, polyaniline and a derivative thereof, polypyrrole and a derivative thereof, polythiophene and a derivative thereof, a copolymer of those materials, and the like can be given.

Specific examples of the conjugated conductive high molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), poly-N-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

The above conductive high molecule may be used alone, or an organic resin may be added thereto in order to adjust the characteristics of the films.

Furthermore, by doping a conductive composition with an acceptor type dopant or a donor type dopant, an oxidation-reduction potential of a conjugated electron of a conjugated conductive high molecule may be changed to control electrical conductivity.

The conductive composition as described above is dissolved in water or an organic solvent (e.g., an alcohol-based solvent, a ketone-based solvent, an ester-based solvent, a hydrocarbon-based solvent, or an aromatic-based solvent), so that a thin film which serves as the pixel electrode layer 1174 can be formed by an application method, a coating method, a droplet discharge method (also referred to as an ink-jet method), a printing method, or the like.

Figure 20A:
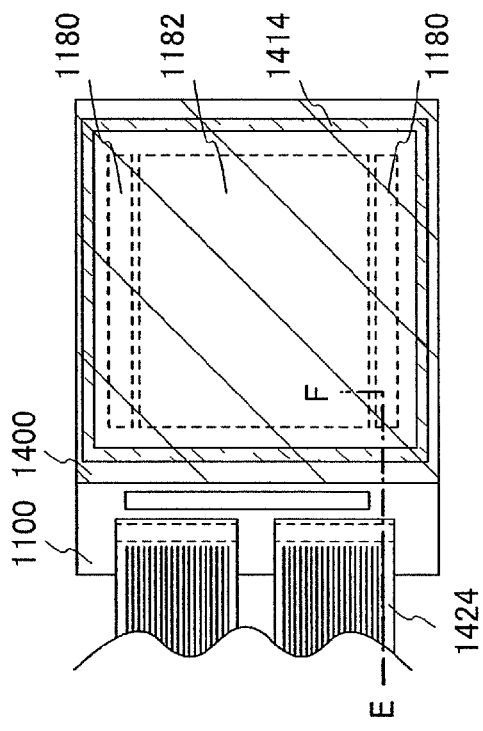
FIGS. 20A and 20B illustrate a method for manufacturing the semiconductor device to which the present invention is applied.
Figure 20B:
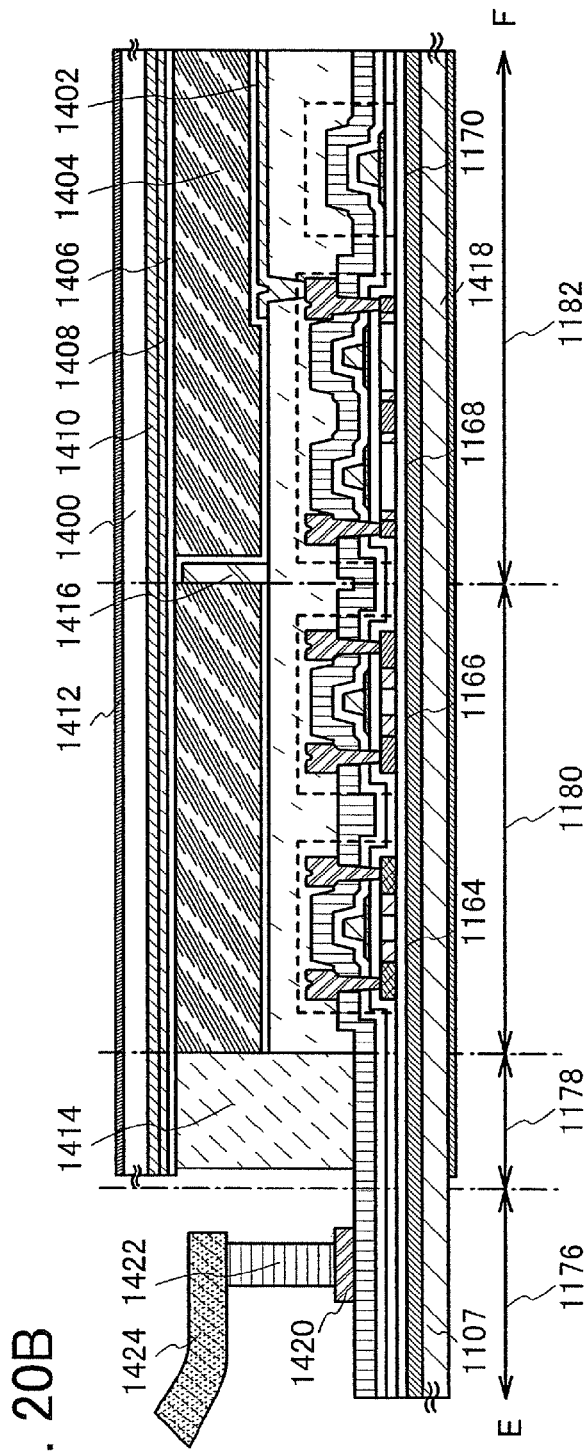

Subsequently, an insulating layer 1402 referred to as an alignment film is formed to cover the pixel electrode layer 1174 and the insulating film 1172 (see FIG. 20B). The insulating layer 1402 can be formed by a screen printing method or an offset printing method. Note that FIGS. 20A and 20B illustrate a plan view and a cross-sectional view of a semiconductor device, respectively. FIG. 20A is a plan view of a semiconductor device, and FIG. 20B is a cross-sectional view taken along line E-F of FIG. 20A. The semiconductor device includes an external terminal connection region 1176, a sealing region 1178, the peripheral driver circuit region 1180, and the pixel region 1182.

After forming the insulating layer 1402, rubbing treatment is performed. An insulating layer 1406 which serves as an alignment film can be formed in a manner similar to the insulating layer 1402.

Then, a counter substrate 1400 is attached to the substrate 1107 having the insulating surface with a sealing material 1414 and a spacer 1416 interposed therebetween, and a liquid crystal layer 1404 is provided in a gap therebetween. Note that the counter substrate 1400 is provided with the insulating layer 1406 which serves as an alignment film, a conductive layer 1408 which serves as a counter electrode, a coloring layer 1410 which serves as a color filter, a polarizer 1412 (also referred to as a polarizing plate), or the like. Note that although the substrate 1107 having the insulating surface is provided with a polarizer 1418 (a polarizing plate), the present invention is not limited thereto. For example, a polarizer may be provided on one side in a reflective type liquid crystal display device.

Subsequently, an FPC 1424 is connected to a terminal electrode layer 1420 that is electrically connected to the pixel region, with an anisotropic conductive layer 1422 interposed therebetween. The FPC 1424 has a function of transmitting a signal from the external. The liquid crystal display device can be manufactured by the above-described process.

In this embodiment mode, a liquid crystal display device is manufactured using an SOI substrate manufactured by the method described in Embodiment Mode 1. Accordingly, the characteristics of a semiconductor element (for example, a transistor in a pixel region) which serves as switching of the liquid crystal can be improved. In addition, operation speed of a semiconductor element in a driver circuit region can be improved. Therefore, the display characteristics of the liquid crystal display device can be greatly improved. Further, since the reliability of the semiconductor element is greatly improved, reliability of the liquid crystal display device is also improved accordingly.

Note that although a method for manufacturing a liquid crystal display device is described in this embodiment mode, the present invention is not limited thereto. This embodiment mode can be implemented in combination with any of the other embodiment modes as appropriate.

Embodiment Mode 6

In this embodiment mode, a semiconductor device having a light-emitting element according to the present invention (an electroluminescent display device) will be described. Note that since it is possible to refer to Embodiment Mode 5 for a method for manufacturing transistors which are used for a peripheral driver circuit, a pixel region, and the like, the details are omitted.

As to a semiconductor device having a light-emitting element, any one of bottom emission, top emission, and dual emission can be employed. Although a semiconductor device employing bottom emission is described in this embodiment mode with reference to FIGS. 21A and 21B, the present invention is not limited thereto.

Figures 21A, 21B:
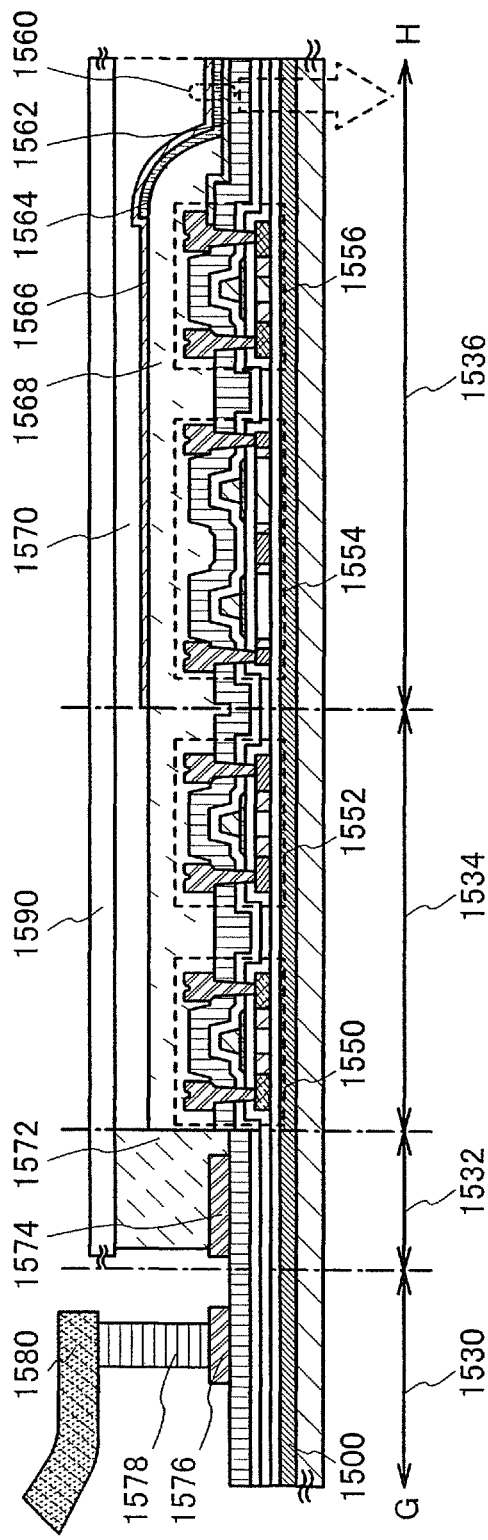
FIGS. 21A and 21B illustrate a semiconductor device to which the present invention is applied.

In a semiconductor device shown in FIGS. 21A and 21B, light is emitted downwardly (in a direction indicated by an arrow). Here, FIG. 21A is a plan view of the semiconductor device, and FIG. 21B is a cross-sectional view taken along line G-H of FIG. 21A. In FIGS. 21A and 21B, the semiconductor device includes an external terminal connection region 1530, a sealing region 1532, a driver circuit region 1534, and a pixel region 1536.

The semiconductor device shown in FIGS. 21A and 21B includes an element substrate 1500, a thin film transistor 1550, a thin film transistor 1552, a thin film transistor 1554, and a thin film transistor 1556, a light-emitting element 1560, an insulating layer 1568, a filler 1570, a sealant 1572, a wiring layer 1574, a terminal electrode layer 1576, an anisotropic conductive layer 1578, an FPC 1580, a sealing substrate 1590, and the like. Note that the light-emitting element 1560 includes a first electrode layer 1562, a light-emitting layer 1564, and a second electrode layer 1566.

As the first electrode layer 1562, a light-transmitting conductive material is used so that light emitted from the light-emitting layer 1564 can be transmitted. On the other hand, as the second electrode layer 1566, a conductive material which can reflect light emitted from the light-emitting layer 1564 is used.

As the first electrode layer 1562, indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide to which silicon oxide is added (ITSO), or the like may also be used.

A conductive composition containing a conductive macromolecule (also referred to as a conductive polymer) can also be used as the first electrode layer 1562. Note that since it is possible to refer to Embodiment Mode 5 for the details, the descriptions are omitted here.

As the second electrode layer 1566, a conductive film formed of titanium, tungsten, nickel, gold, platinum, silver, copper, tantalum, molybdenum, aluminum, magnesium, calcium, lithium, or an alloy thereof can be used. A substance having high reflectivity in a visible region is preferably used, and an aluminum film is used in this embodiment mode.

Note that in the case of employing each of top emission and dual emission, the design of the electrode layers may be changed as appropriate. Specifically, in the case of top emission, the first electrode layer 1562 is formed using a reflective material, and the second electrode layer 1566 is formed using a light-transmitting material. In the case of dual emission, the first electrode layer 1562 and the second electrode layer 1566 may be formed using a light-transmitting material. Note that in the case of bottom emission and top emission, a structure may be employed in which one electrode layer is formed using a light-transmitting material and the other electrode layer is formed in a layered structure of a light-transmitting material and a light-reflecting material. The material that can be used for the electrode layers is similar to the material in the case of bottom emission; thus, the descriptions are omitted here.

Note that even a material like metal which is generally considered to have no light-transmitting property can transmit light when it has a small thickness (a thickness approximately greater than or equal to 5 nm and less than or equal to 30 nm). Accordingly, an electrode layer which transmits light can also be formed using the light-reflecting material described above.

The element substrate 1500 may be provided with a color filter (a coloring layer). The color filter (a coloring layer) can be formed by an evaporation method or a droplet discharge method. Alternatively, a color conversion layer may be used.

An electroluminescent display device is manufactured using the method described in Embodiment Mode 1 or the like in this embodiment mode. Accordingly, the characteristics of a semiconductor element (for example, a transistor in a pixel region) which serves as switching of the light emission of the electroluminescent display device can be improved. In addition, operation speed of a semiconductor element in a driver circuit region can be improved. Therefore, the display characteristics of the electroluminescent display device can be greatly improved according to the present invention. Further, since the reliability of the semiconductor element is greatly improved, reliability of an electroluminescent display device is also improved accordingly.

Note that although the description is made in this embodiment mode using an electroluminescent display device, the present invention is not limited thereto. This embodiment mode can be implemented in combination with any of the other embodiment modes as appropriate.

Embodiment Mode 7

In this embodiment mode, another example of a semiconductor device of the present invention will be described with reference to FIG. 22 and FIG. 23. Note that although a microprocessor and an electronic tag are given as examples in this embodiment mode, the semiconductor device of the present invention is not limited thereto.

Figure 22:
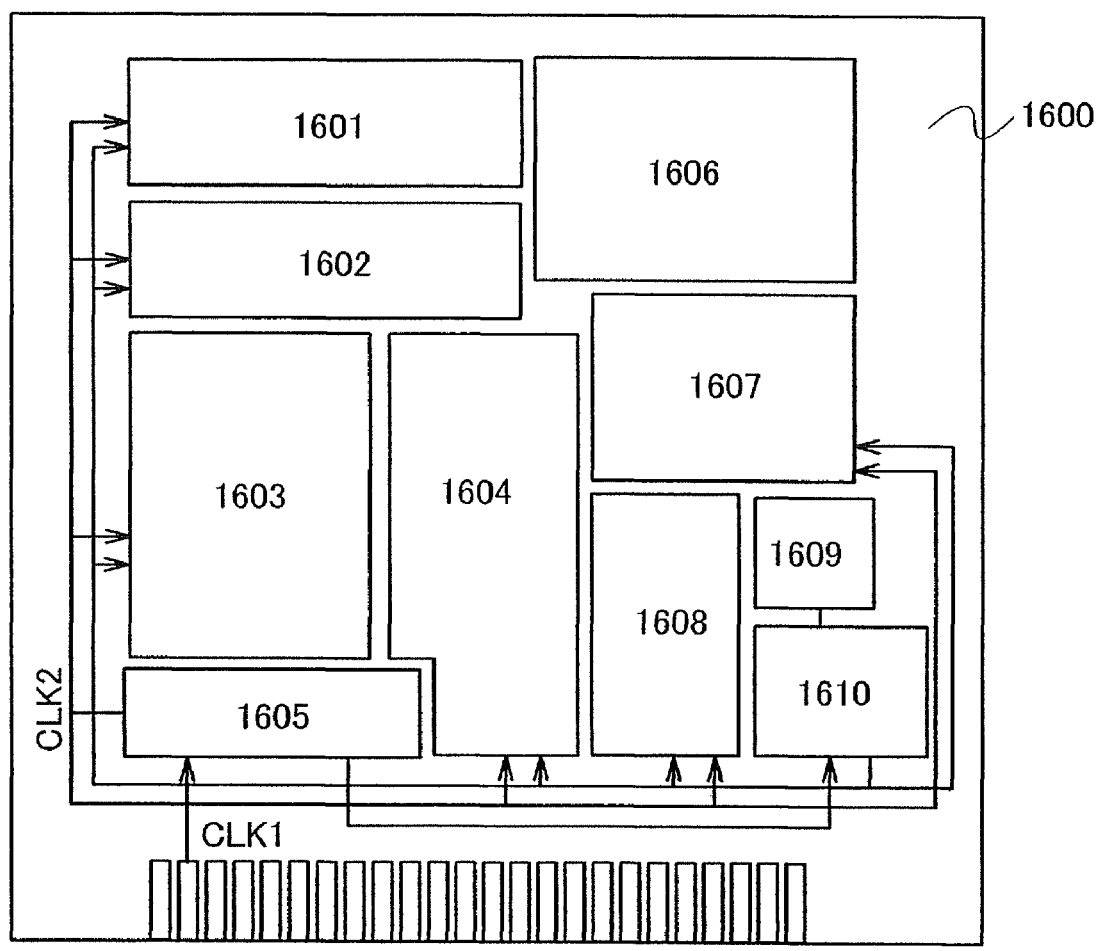
FIG. 22 illustrates a semiconductor device to which the present invention is applied.
Figure 23:
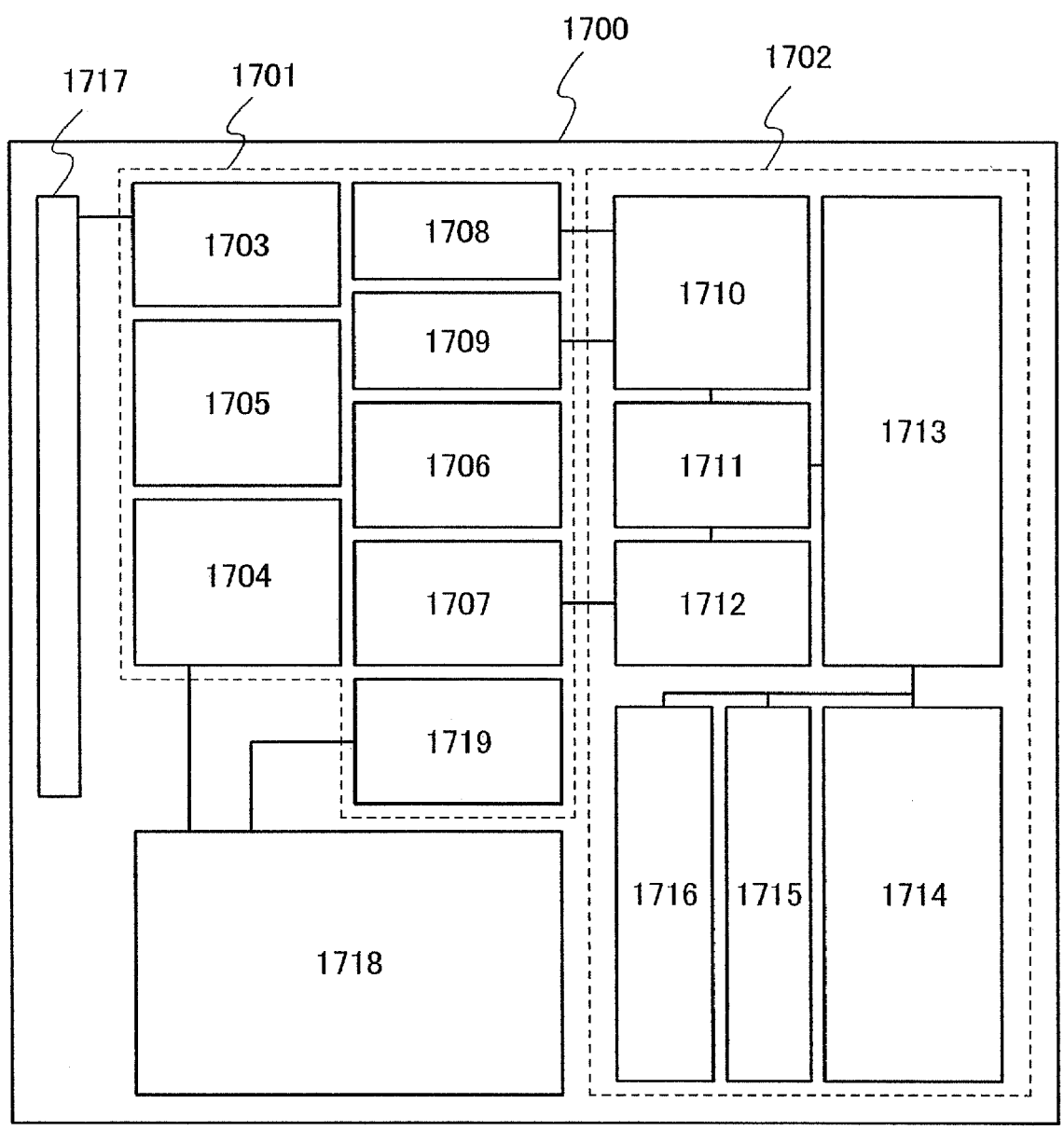
FIG. 23 illustrates a semiconductor device to which the present invention is applied.

FIG. 22 shows an example of a microprocessor of the present invention. A microprocessor 1600 in FIG. 22 is manufactured using the semiconductor substrate of the present invention. This microprocessor 1600 has an arithmetic logic unit (ALU) 1601, an ALU controller 1602, an instruction decoder 1603, an interrupt controller 1604, a timing controller 1605, a register 1606, a register controller 1607, a bus interface (Bus I/F) 1608, a read-only memory (ROM) 1609, and a ROM interface (ROM I/F) 1610.

An instruction input to the microprocessor 1600 through the bus interface 1608 is input to the instruction decoder 1603, decoded therein, and then input to the ALU controller 1602, the interrupt controller 1604, the register controller 1607, and the timing controller 1605. The ALU controller 1602, the interrupt controller 1604, the register controller 1607, and the timing controller 1605 conduct various controls based on the decoded instruction. Specifically, the ALU controller 1602 generates signals for controlling the operation of the ALU 1601. While the microprocessor 1600 is executing a program, the interrupt controller 1604 processes an interrupt request from an external input/output device or a peripheral circuit based on its priority or the like. The register controller 1607 generates an address of the register 1606, and reads and writes data from and to the register 1606 depending on the state of the microprocessor 1600. The timing controller 1605 generates signals for controlling timing of operation of the ALU 1601, the ALU controller 1602, the instruction decoder 1603, the interrupt controller 1604, and the register controller 1607. For example, the timing controller 1605 is provided with an internal clock generator for generating an internal clock signal CLK2 based on a reference clock signal CLK1, and supplies the internal clock signal CLK2 to the various circuits described above. Note that the structure of the microprocessor 1600 shown in FIG. 22 is merely an example, and can be changed as appropriate depending on the uses.

A microprocessor is manufactured in this embodiment mode using an SOI substrate described in Embodiment Mode 1 or the like. Accordingly, operation speed of a semiconductor element is improved, which contributes to improvement in performance of the microprocessor. Further, since reliability of a semiconductor element is improved, reliability of the microprocessor is improved accordingly.

Next, an example of a semiconductor device having an arithmetic function, which is capable of transmitting and receiving data without contact, is described with reference to FIG. 23. FIG. 23 shows an example of a wireless tag which transmits and receives signals to/from an external device by wireless communication. Note that the wireless tag of the present invention includes a central processing unit (CPU), so to speak, a miniaturized computer. A wireless tag 1700 has an analog circuit portion 1701 and a digital circuit portion 1702. The analog circuit portion 1701 has a resonance circuit 1703 with a resonance capacitor, a rectifier circuit 1704, a constant voltage circuit 1705, a reset circuit 1706, an oscillator circuit 1707, a demodulation circuit 1708, and a modulation circuit 1709. The digital circuit portion 1702 has an RF interface 1710, a control register 1711, a clock controller 1712, a CPU interface 1713, a CPU 1714, a RAM 1715, and a ROM 1716.

The operation of the wireless tag 1700 having such a structure is described below. When an antenna 1717 receives a signal from outside, an induced electromotive force is generated in the resonance circuit 1703 based on the signal. A capacitor portion 1718 is charged with the induced electromotive force which has passed through the rectifier circuit 1704. This capacitor portion 1718 is preferably formed using a capacitor such as a ceramic capacitor or an electric double layer capacitor. The capacitor portion 1718 may be formed over the same substrate as the wireless tag 1700 or may be attached as another component to a substrate having an insulating surface that partially constitutes the wireless tag 1700.

The reset circuit 1706 generates a signal for resetting and initializing the digital circuit portion 1702. For example, a signal that rises after rise in power supply voltage with delay is generated as the reset signal. The oscillator circuit 1707 changes the frequency and duty ratio of a clock signal in response to a control signal generated by the constant voltage circuit 1705. The demodulator circuit 1708 having a low pass filter binarizes fluctuation in amplitude of an amplitude-modulated (ASK) reception signals, for example. The modulator circuit 1709 makes the amplitude of an amplitude-modulated (ASK) transmission signal fluctuate and transmits the signal. The modulator circuit 1709 varies the resonance point of the resonance circuit 1703, thereby varying the amplitude of communication signals. The clock controller 1712 generates a control signal for changing the frequency and duty ratio of a clock signal depending on the power supply voltage or a consumption current of the CPU 1714. The power supply voltage is monitored by the power management circuit 1719.

A signal that is input to the wireless tag 1700 from the antenna 1717 is demodulated by the demodulator circuit 1708, and then divided into a control command, data, and the like by the RF interface 1710. The control command is stored in the control register 1711. The control command includes a reading instruction of data stored in the ROM 1716, a writing instruction of data to the RAM 1715, an arithmetic instruction to CPU 1714, and the like. The CPU 1714 accesses the ROM 1716, the RAM 1715, and the control register 1711 via the CPU interface 1713. The CPU interface 1713 has a function to generate an access signal for any one of the ROM 1716, the RAM 1715, and the control register 1711 based on an address requested by the CPU 1714.

As an arithmetic method of the CPU 1714, a method may be employed in which the ROM 1716 stores an operating system (OS) and a program is read and executed at the time of starting operation. Alternatively, a method may be employed in which an arithmetic circuit is formed and an arithmetic process is conducted using hardware. In a method in which both hardware and software are used, a method can be employed in which the circuit dedicated to arithmetic conducts part of the process and the CPU 1714 conducts the other part of the arithmetic process by using a program.

A wireless tag is manufactured in this embodiment mode using an SOI substrate described in Embodiment Mode 1 or Embodiment Mode 2. Accordingly, operation speed of a semiconductor element is greatly improved, which contributes to improvement in performance of the wireless tag. Further, since reliability of a semiconductor element is improved, reliability of the wireless tag is improved accordingly.

This embodiment mode can be implemented in combination with any of the other embodiment modes as appropriate.

Embodiment Mode 8

In this embodiment mode, electronic devices using the semiconductor devices, in particular, the display device of the present invention will be described with reference to FIGS. 24A to 24H and FIGS. 25A to 25C.

As electronic devices manufactured using the semiconductor device of the present invention (particularly, the display device), the following can be given: a camera such as a video camera or a digital camera, a goggle type display (a head mounted display), a navigation system, an audio reproducing device (car audio set or the like), a computer, a game machine, a portable information terminal (mobile computer, a cellular phone, a portable game machine, an e-book, or the like), and an image reproducing device provided with a recording medium (specifically, a device provided with a display that can reproduce a recording medium such as a digital versatile disc (DVD) and display the image), and the like.

Figure 24A:
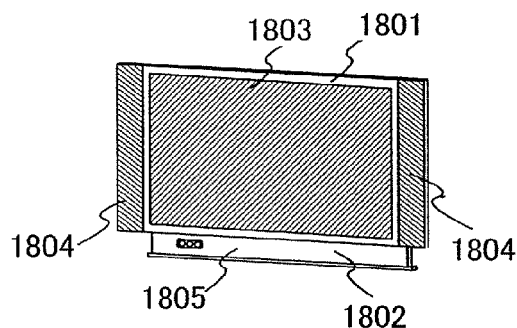
FIGS. 24A to 24H illustrate electronic devices to which the present invention is applied.

FIG. 24A shows a television receiver or a monitor of a personal computer. The television receiver or monitor of a personal computer includes a housing 1801, a support stand 1802, a display portion 1803, speaker portions 1804, a video input terminal 1805, and the like. The semiconductor device of the present invention is used for the display portion 1803. According to the present invention, a television receiver or a monitor of a highly reliable personal computer with high performance can be provided.

Figure 24B:
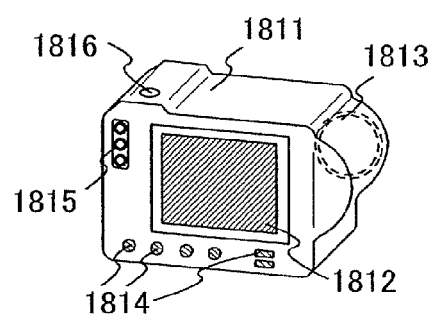

FIG. 24B shows a digital camera. An image receiving portion 1813 is provided on the front side part of a main body 1811, and a shutter button 1816 is provided on the top side part of the main body 1811. Furthermore, on the back side part of the main body 1811, a display portion 1812, operation keys 1814, and an external connection port 1815 are provided. The semiconductor device of the present invention is used for the display portion 1812. According to the present invention, a highly reliable digital camera with high performance can be provided.

Figure 24C:
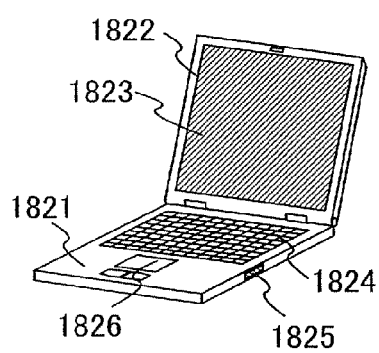

FIG. 24C shows a laptop personal computer. In a main body 1821, a keyboard 1824, an external connection port 1825, and a pointing device 1826 are provided. Furthermore, a housing 1822 having a display portion 1823 is attached to the main body 1821. The semiconductor device of the present invention is used for the display portion 1823. According to the present invention, a highly reliable laptop personal computer with high performance can be provided.

Figure 24D:
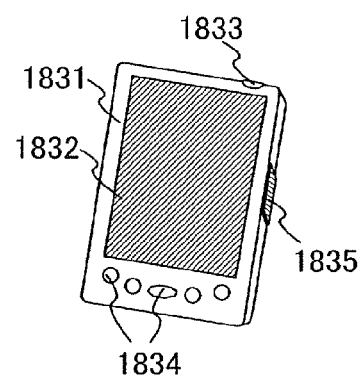

FIG. 24D shows a mobile computer which includes a main body 1831, a display portion 1832, a switch 1833, operation keys 1834, an infrared port 1835, and the like. Furthermore, an active matrix display device is provided in the display portion 1832. The semiconductor device of the present invention is used for the display portion 1832. According to the present invention, a highly reliable mobile computer with high performance can be provided.

Figure 24E:
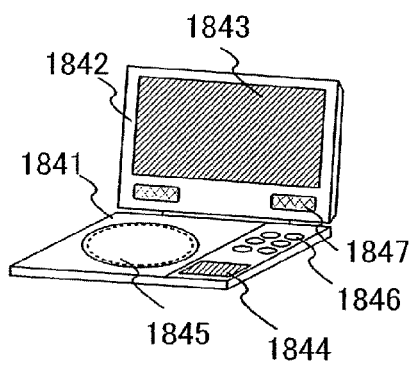

FIG. 24E shows an image reproducing device. In a main body 1841, a display portion B 1844, a storage media reader 1845, and operation keys 1846 are provided. Furthermore, a housing 1842 having speaker portions 1847 and a display portion A 1843 is attached to the main body 1841. The semiconductor device of the present invention is used for each of the display portion A 1843 and the display portion B 1844. According to the present invention, a highly reliable image reproducing device with high performance can be provided.

Figure 24F:
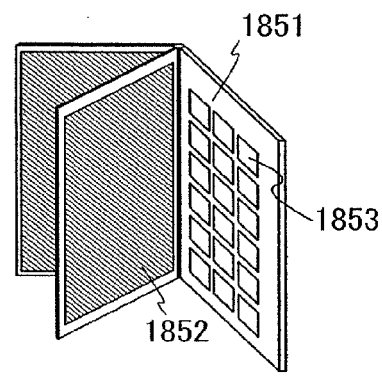

FIG. 24F shows an electronic book. In a main body 1851, operation keys 1853 are provided. Furthermore, a plurality of display portions 1852 is attached to the main body 1851. The semiconductor device of the present invention is used for the display portion 1852. According to the present invention, a highly reliable electronic book with high performance can be provided.

Figure 24G:
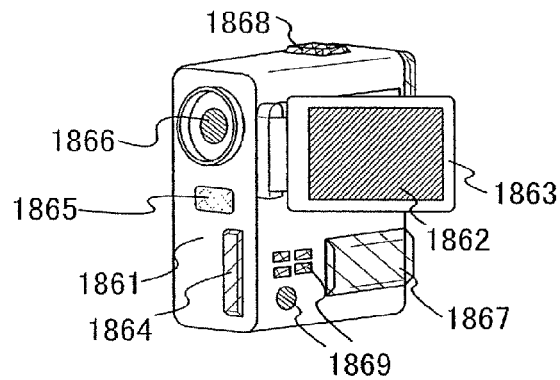

FIG. 24G shows a video camera. In a main body 1861, an external connection port 1864, a remote control receiver

1865, an image receiving portion 1866, a battery 1867, an audio input portion 1868, and operation keys 1869 are provided. Furthermore, a housing 1863 having a display portion 1862 is attached to the main body 1861. The semiconductor device of the present invention is used for the display portion 1862. According to the present invention, a highly reliable video camera with high performance can be provided.

Figure 24H:
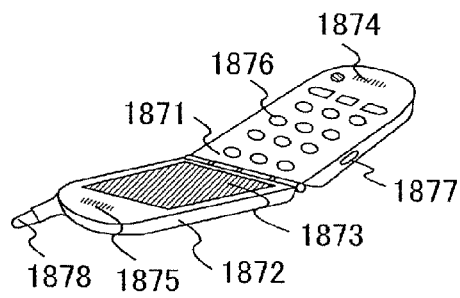
Figure 26A:
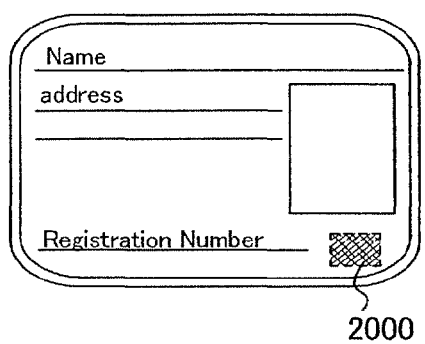
FIGS. 26A to 26F illustrate applications of electronic devices to which the present invention is applied.
Figure 26B:
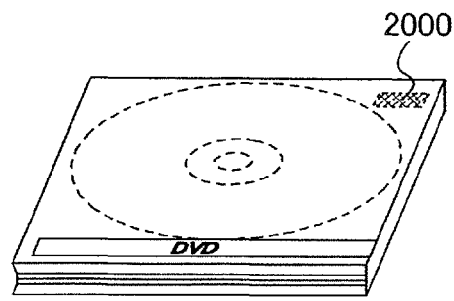
Figure 26C:
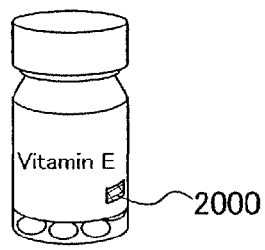
Figure 26D:
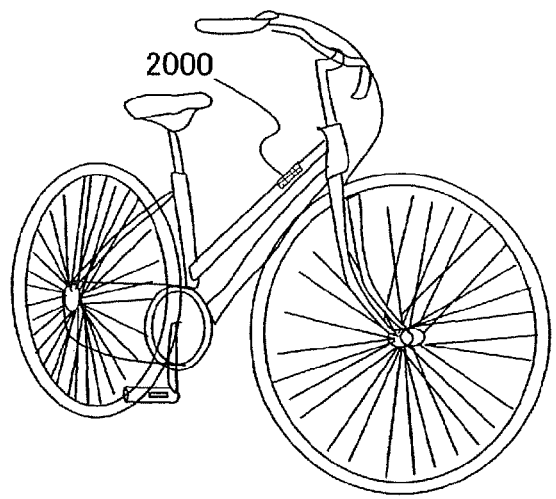
Figure 26E:
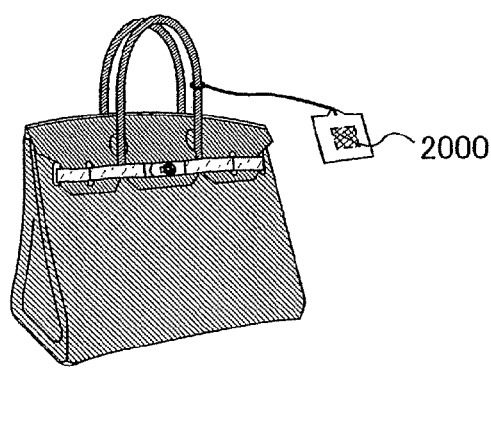
Figure 26F:
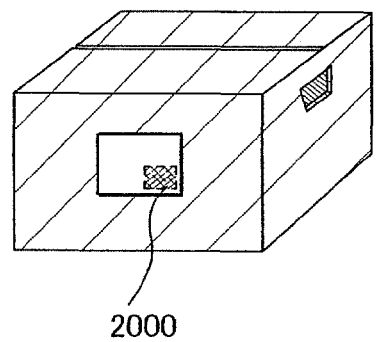

FIG. 24H shows a cellular phone which includes a main body 1871, a housing 1872, a display portion 1873, an audio input portion 1874, an audio output portion 1875, operation keys 1876, an external connection port 1877, an antenna 1878, and the like. The semiconductor device of the present invention is used for the display portion 1873. According to the present invention, a highly reliable cellular phone with high performance can be provided.

FIGS. 25A to 25C shows a structural example of a portable electronic device 1900 having functions as a telephone and an information terminal. FIG. 25A is a front view, FIG. 25B is a back view, and FIG. 25C is a development view. The portable electronic device 1900 has functions as both a telephone and an information terminal and is an electronic device so-called a smartphone which is capable of various data processing besides voice call.

The portable electronic device 1900 includes a housing 1901 and a housing 1902. The housing 1901 is provided with a display portion 1911, a speaker 1912, a microphone 1913, operation keys 1914, a pointing device 1915, a lens 1916 for camera, an external connection terminal 1917, and the like. The housing 1902 is provided with a keyboard 1921, an external memory slot 1922, a lens 1923 for camera, a light 1924, an earphone terminal 1925, and the like. Moreover, an antenna is built into the housing 1901. In addition to the structure described above, a non-contact IC chip, a small size memory device, or the like can be built therein.

The semiconductor device of the present invention is incorporated in the display portion 1911. Note that an image displayed (and direction in which the image is displayed) in the display portion 1911 variously changes with respect to the usage pattern of the portable electronic device 1900. Moreover, since the display portion 1911 and the lens 1916 for camera are provided on the same surface, voice call with images (so-called videophone) is possible. Note that the speaker 1912 and the microphone 1913 can be used not only for voice call but also for recording, reproducing, or the like. In the case where a still image and a moving image are shot by using the lens 1923 for camera (and the light 1924), the display portion 1911 is used as a finder. The operation keys 1914 are used for incoming/outgoing of phone call, inputting simple information such as e-mail, screen scrolling, moving cursor, and the like.

The housings 1901 and 1902 overlapping with each other (FIG. 25A) slide and can be developed as shown in FIG. 25C, so that the portable electronic device 1900 can be used as an information terminal. In this case, smooth operation with the keyboard 1921 and the pointing device 1915 can be performed. The external connection terminal 1917 can be connected to various cables such as an AC adopter or a USB cable; thus, the portable electronic device 1900 can be charged or can perform data communication with a computer or the like. Moreover, by inserting a recording medium into the external memory slot 1922, the portable electronic device 1900 can deal with storing and moving data with larger capacitance. In addition to the functions described above, a function of wireless communication using electromagnetic waves such as infrared rays, a function of receiving television, and the like may be included. According to the present invention, a highly reliable portable electronic device with high performance can be provided.

As described above, the present invention can be widely applied to and used in electronic devices in a variety of fields. Note that this embodiment mode can be implemented in combination with any of the other embodiment modes as appropriate.

Embodiment Mode 9

In this embodiment mode, uses of a semiconductor device, in particular, a wireless tag of the present invention will be described with reference to FIGS. 26A to 26F.

According to the present invention, a semiconductor device which functions as a wireless tag can be formed. A wireless tag can be used in a wide variety of uses, and may be used by being mounted on objects such as bills, coins, securities, bearer bonds, certificates (driver's licenses, resident cards, and the like, see FIG. 26A), containers for wrapping objects (wrapping paper, bottles, and the like, see FIG. 26C), recording media (DVD software, video tapes, and the like, see FIG. 26B), vehicles (bicycles and the like, see FIG. 26D), personal belongings (bags, glasses, and the like), foods, plants, clothes, lifestyle goods, and products such as electronic devices, or shipping tags of baggage (see FIGS. 26E and 26F). Note that the wireless tag is indicated by reference numeral 2000 in each of FIGS. 26A to 26F.

Note that the electronic device refers to a liquid crystal display device, an EL display device, a television unit (also simply referred to as a TV, a TV receiver, or a television receiver), a cellular phone, and the objects shown in Embodiment Mode 8, for example. The semiconductor device can be mounted on animals, human body, and the like.

The wireless tag is attached to a surface of an object or embedded to be fixed on an object. For example, the RFID tag may be embedded in paper of a book, or an organic resin of a container for wrapping an object to be fixed on each object. Counterfeits can be prevented by providing an RFID tag on the bills, coins, securities, bearer bonds, certificates, and the like. Further, by providing an RFID tag in containers for wrapping objects, recording media, personal belongings, foods, clothes, lifestyle goods, electronic devices, and the like, inspection systems, rental systems, and the like can be performed more efficiently. The wireless tag that can be formed according to the present invention has high reliability though it is inexpensive, and can be applied to various objects.

When a wireless tag that can be formed according to the present invention is applied to a management system or a distribution system of articles, the system can have high functionality. For example, when information which is recorded in an RFID tag provided in a tag is read by a reader/writer provided near a conveyor belt, information about a distribution process, a delivery destination, or the like is read out, and inspection of merchandise or distribution of goods can be easily carried out.

As described, the present invention can be widely applied to and used in a variety of objects. Note that this embodiment mode can be implemented in combination with any of the other embodiment modes as appropriate.

As described above, according to the present invention, substrates are bonded to each other without bubbles and the like at the adhesion portion, and well bonded substrates with high bonding strength can be obtained.

This application is based on Japanese Patent Application serial No. 2007-312898 filed with Japan Patent Office on Dec. 3, 2007, the entire contents of which are hereby incorporated by reference.

What is claimed is:

1. A method for manufacturing an SOI substrate, comprising the steps of:
   adding ion species contained in plasma formed by exciting a source gas into a single crystal semiconductor substrate, thereby, forming a damage region in the single crystal semiconductor substrate;
   forming an insulating layer over the single crystal semiconductor substrate after forming the damage region;
   bonding a support substrate so as to face the single crystal semiconductor substrate with the insulating layer therebetween;
   heating the single crystal semiconductor substrate and the support substrate to separate a part of the single crystal semiconductor substrate at the damage region so that a single crystal semiconductor layer separated from the single crystal semiconductor substrate is formed over the support substrate;
   pressing the single crystal semiconductor layer bonded to the support substrate by a method selected from the group consisting of vacuum press, hydraulic press and pneumatic press; and
   etching a surface of the single crystal semiconductor layer after the step of pressing the single crystal semiconductor layer.

2. The method for manufacturing an SOI substrate according to claim 1, wherein the insulating layer is a silicon oxide film formed by chemical vapor deposition using an organosilane gas as a silicon source gas.

3. The method for manufacturing an SOI substrate according to claim 2, wherein the organosilane gas is a gas selected from the group consisting of ethyl silicate, tetramethylcyclotetrasiloxane, octamethylcyclotetrasiloxane, hexamethyldisilazane, triethoxysilane, and trisdimethylaminosilane.

4. The method for manufacturing an SOI substrate according to claim 1, wherein a thickness of the insulating layer is 500 nm or more to 1000 nm or less.

5. The method for manufacturing an SOI substrate according to claim 1, wherein the addition of the ion species is performed using an ion doping apparatus.

6. The method for manufacturing an SOI substrate according to claim 1, wherein the ion species comprise $H_3^+$.

7. A method for manufacturing an SOI substrate, comprising the steps of:
   adding ion species contained in plasma formed by exciting a source gas into a single crystal semiconductor substrate, thereby, forming a damage region in the single crystal semiconductor substrate;
   forming an insulating layer over the single crystal semiconductor substrate after forming the damage region;
   bonding a support substrate so as to face the single crystal semiconductor substrate with the insulating layer therebetween;
   heating the single crystal semiconductor substrate and the support substrate to separate a part of the single crystal semiconductor substrate at the damage region so that a single crystal semiconductor layer separated from the single crystal semiconductor substrate is formed over the support substrate;
   forming a plurality of island-shaped single crystal semiconductor layers by etching the single crystal semiconductor layer; and
   pressing the plurality of island-shaped single crystal semiconductor layers.

8. The method for manufacturing an SOI substrate according to claim 7, wherein the insulating layer is a silicon oxide film formed by chemical vapor deposition using an organosilane gas as a silicon source gas.

9. The method for manufacturing an SOI substrate according to claim 8, wherein the organosilane gas is a gas selected from the group consisting of ethyl silicate, tetramethylcyclotetrasiloxane, octamethylcyclotetrasiloxane, hexamethyldisilazane, triethoxysilane, and trisdimethylaminosilane.

10. The method for manufacturing an SOI substrate according to claim 7, wherein a thickness of the insulating layer is 500 nm or more to 1000 nm or less.

11. The method for manufacturing an SOI substrate according to claim 7, wherein the addition of the ion species is performed using an ion doping apparatus.

12. The method for manufacturing an SOI substrate according to claim 7, wherein the ion species comprise $H_3^+$.

13. A method for manufacturing an SOI substrate, comprising the steps of:
   adding ion species contained in plasma formed by exciting a source gas into a single crystal semiconductor substrate, thereby, forming a damage region in the single crystal semiconductor substrate;
   forming an insulating layer over the single crystal semiconductor substrate after forming the damage region;
   forming an opening which is deeper than the damage region in the insulating layer and the single crystal semiconductor substrate by etching the single crystal semiconductor substrate and the insulating layer;
   bonding a support substrate so as to face the single crystal semiconductor substrate with the insulating layer therebetween;
   heating the single crystal semiconductor substrate and the support substrate to separate a part of the single crystal semiconductor substrate at the damage region so that a plurality of single crystal semiconductor layers separated from the single crystal semiconductor substrate are formed over the support substrate; and
   pressing the plurality of single crystal semiconductor layers bonded to the support substrate.

14. The method for manufacturing an SOI substrate according to claim 13, wherein the insulating layer is a silicon oxide film formed by chemical vapor deposition using an organosilane gas as a silicon source gas.

15. The method for manufacturing an SOI substrate according to claim 14, wherein the organosilane gas is a gas selected from the group consisting of ethyl silicate, tetramethylcyclotetrasiloxane, octamethylcyclotetrasiloxane, hexamethyldisilazane, triethoxysilane, and trisdimethylaminosilane.

16. The method for manufacturing an SOI substrate according to claim 13, wherein a thickness of the insulating layer is 500 nm or more to 1000 nm or less.

17. The method for manufacturing an SOI substrate according to claim 13, wherein the addition of the ion species is performed using an ion doping apparatus.

18. The method for manufacturing an SOI substrate according to claim 13, wherein the ion species comprise $H_3^+$.

19. A method for manufacturing an SOI substrate, comprising the steps of:
   adding ion species contained in plasma formed by exciting a source gas into a single crystal semiconductor substrate, thereby, forming a damage region in the single crystal semiconductor substrate;

forming an insulating layer over the single crystal semiconductor substrate after forming the damage region;

bonding a support substrate so as to face the single crystal semiconductor substrate with the insulating layer therebetween;

heating the single crystal semiconductor substrate and the support substrate to separate a part of the single crystal semiconductor substrate at the damage region so that a single crystal semiconductor layer separated from the single crystal semiconductor substrate is formed over the support substrate;

pressing the single crystal semiconductor layer bonded to the support substrate by a method selected from the group consisting of vacuum press, hydraulic press and pneumatic press; and irradiating the single crystal semiconductor layer with a laser beam after the step of pressing the single crystal semiconductor layer.

20. The method for manufacturing an SOI substrate according to claim 19, wherein the insulating layer is a silicon oxide film formed by chemical vapor deposition using an organosilane gas as a silicon source gas.

21. The method for manufacturing an SOI substrate according to claim 20, wherein the organosilane gas is a gas selected from the group consisting of ethyl silicate, tetramethylcyclotetrasiloxane, octamethylcyclotetrasiloxane, hexamethyldisilazane, triethoxysilane, and trisdimethylaminosilane.

22. The method for manufacturing an SOI substrate according to claim 19, wherein a thickness of the insulating layer is 500 nm or more to 1000 nm or less.

23. The method for manufacturing an SOI substrate according to claim 19, wherein the addition of the ion species is performed using an ion doping apparatus.

24. The method for manufacturing an SOI substrate according to claim 19, wherein the ion species comprise $H_3^+$.

* * * * *